United States Patent
Nakamura et al.

(10) Patent No.: US 10,653,008 B2
(45) Date of Patent: May 12, 2020

(54) CONDUCTIVE SHEET AND TOUCH PANEL

(71) Applicant: FUJIFILM Corporation, Minato-ku, Tokyo (JP)

(72) Inventors: Hiroshige Nakamura, Ashigarakami-gun (JP); Tadashi Kuriki, Ashigarakami-gun (JP)

(73) Assignee: FUJIFILM Corporation, Minato-Ku, Tokyo (JP)

( * ) Notice: Subject to any disclaimer, the term of this patent is extended or adjusted under 35 U.S.C. 154(b) by 0 days.

(21) Appl. No.: 16/538,369

(22) Filed: Aug. 12, 2019

(65) Prior Publication Data

US 2019/0373722 A1     Dec. 5, 2019

Related U.S. Application Data

(63) Continuation of application No. 16/371,673, filed on Apr. 1, 2019, now Pat. No. 10,433,419, which is a
(Continued)

(30) Foreign Application Priority Data

| Dec. 22, 2011 | (JP) | 2011-281928 |
| May 17, 2012 | (JP) | 2012-113741 |
| Aug. 21, 2012 | (JP) | 2012-182678 |

(51) Int. Cl.
*H05K 1/02* (2006.01)
*G06F 3/044* (2006.01)

(52) U.S. Cl.
CPC ........... *H05K 1/0296* (2013.01); *G06F 3/044* (2013.01); *G06F 2203/04103* (2013.01); *G06F 2203/04112* (2013.01); *H05K 2201/09681* (2013.01)

(58) Field of Classification Search
CPC ........ H05K 1/0296; H05K 2201/09681; G06F 3/044; G06F 2203/04103; G06F 2203/04112
(Continued)

(56) References Cited

U.S. PATENT DOCUMENTS

| 7,202,859 B1 | 4/2007 | Speck et al. |
| 2003/0052867 A1 | 3/2003 | Shigetaka et al. |

(Continued)

FOREIGN PATENT DOCUMENTS

| CN | 101311889 A | 11/2008 |
| CN | 101937278 A | 1/2011 |

(Continued)

OTHER PUBLICATIONS

Communication dated Aug. 24, 2017, from the Intellectual Property Office of Taiwan in counterpart application No. 106102808.
(Continued)

*Primary Examiner* — Tremesha S Willis
(74) *Attorney, Agent, or Firm* — Sughrue Mion, PLLC

(57) ABSTRACT

A conductive component includes a first electrode pattern made of metal thin wires, and includes a plurality of first conductive patterns that extend in a first direction alternating with first non-conductive patterns. Each first conductive pattern includes break parts in portions other than intersection parts of the thin metal wires. The conductive component further includes a second electrode pattern made of thin metal wires, and includes a plurality of second conductive patterns that extend in a second direction orthogonal to the first direction and alternating with second non-conductive patterns. Each second conductive pattern includes break parts in portions other than intersection parts of thin metal wires.

10 Claims, 29 Drawing Sheets

Related U.S. Application Data continuation of application No. 16/124,495, filed on Sep. 7, 2018, now Pat. No. 10,299,377, which is a continuation of application No. 15/845,288, filed on Dec. 18, 2017, now Pat. No. 10,111,326, which is a continuation of application No. 14/310,770, filed on Jun. 20, 2014, now Pat. No. 9,877,385, which is a continuation of application No. PCT/JP2012/083222, filed on Dec. 21, 2012.

(58) Field of Classification Search
USPC .......................................................... 174/253
See application file for complete search history.

(56) References Cited

U.S. PATENT DOCUMENTS

| | | |
|---|---|---|
| 2004/0229028 A1 | 11/2004 | Sasaki et al. |
| 2004/0239650 A1 | 12/2004 | Mackey |
| 2008/0042132 A1 | 2/2008 | Shih et al. |
| 2008/0211371 A1 | 9/2008 | Sasaki et al. |
| 2008/0292826 A1 | 11/2008 | Tanabe et al. |
| 2009/0219257 A1 | 9/2009 | Frey et al. |
| 2009/0219258 A1 | 9/2009 | Geaghan et al. |
| 2010/0060602 A1 | 3/2010 | Agari et al. |
| 2010/0265210 A1 | 10/2010 | Nakanishi et al. |
| 2010/0302204 A1 | 12/2010 | Miyayama et al. |
| 2011/0007011 A1 | 1/2011 | Mozdzyn |
| 2011/0062146 A1 | 3/2011 | Kuriki |
| 2011/0102370 A1 | 5/2011 | Kono et al. |
| 2011/0308846 A1 | 12/2011 | Ichiki |
| 2012/0169665 A1 | 7/2012 | Misaki |
| 2012/0313880 A1 | 12/2012 | Geaghan et al. |
| 2014/0071358 A1 | 3/2014 | Kuriki |
| 2014/0299361 A1 | 10/2014 | Nakamura et al. |

FOREIGN PATENT DOCUMENTS

| | | |
|---|---|---|
| CN | 102016766 A | 4/2011 |
| CN | 102027801 A | 4/2011 |
| CN | 102112949 A | 6/2011 |
| CN | 102290129 A | 12/2011 |
| EP | 2 708 992 A1 | 3/2014 |
| JP | 05224818 A | 9/1993 |
| JP | 2003099185 A | 4/2003 |
| JP | 2010039537 A | 2/2010 |
| JP | 2010061502 A | 3/2010 |
| JP | 2010250770 A | 11/2010 |
| JP | 2010277392 A | 12/2010 |
| JP | 2010277397 A | 12/2010 |
| JP | 2013149236 A | 8/2013 |
| TW | I306668 B | 2/2009 |
| TW | 200945146 A | 11/2009 |
| WO | 9527334 A1 | 10/1995 |
| WO | 9718508 A1 | 5/1997 |
| WO | 2006001461 A1 | 1/2006 |
| WO | 2011033907 A1 | 3/2011 |
| WO | 2011062301 A1 | 5/2011 |
| WO | 2011065032 A1 | 6/2011 |
| WO | 2012157557 A1 | 11/2012 |

OTHER PUBLICATIONS

Communication dated Jul. 3, 2019 from the State Intellectual Property Office of the P.R.C. in application No. 201710256282.5.
Communication dated Apr. 30, 2019, in State Intellectual Property Office of the P.R.C in counterpart application No. 201710256307.1.
Machine Translation of Miyayama et al. (Japanese Patent Publication No. 2010-277392), Dec. 9, 2010.
Communication dated Aug. 9, 2016, from the Intellectual Property Office of Taiwan in counterpart application No. 101149142.
Notification of Reasons for Rejection, dispatched May 29, 2015, issued in corresponding JP Application No. 2012-113741, 12 pages in English and Japanese.
Japanese Office Action of Japanese Patent Application No. 2012-182678 dated Mar. 27, 2013, 4 pages in Japanese and English.
International Search Report of PCT/JP2012/083222 dated Apr. 2, 2013, 4 pages in Japanese and English.
Written Opinion of PCT/JP2012/083222 dated Apr. 2, 2013.
Communication, dated Jul. 14, 2015, issued in corresponding EP Application No. 12859755.6, 11 pages.
International Preliminary Report on Patentability and Written Opinion, dated Jul. 3, 2014, issued in corresponding International Application No. PCT/JP2012/083222, 14 pages in English and Japanese.
Summons to attend oral proceedings pursuant to Rule 115(1) EPC, dated Aug. 30, 2018, issued in corresponding EP Application No. 12859755.6, 9 pages.
Search Report dated Dec. 3, 2019, issued by the Brazilian Patent Office in application No. BR112014015319-1.
Communication dated Jan. 22, 2020 from the State Intellectual Property Office of the P.R.C. in Application No. 201710256307.1.

RELATED ART

CONDUCTIVE SHEET AND TOUCH PANEL

CROSS-REFERENCE TO RELATED APPLICATIONS

This application is a Continuation of U.S. application Ser. No. 16/371,673, filed Apr. 1, 2019, which is a Continuation of U.S. application Ser. No. 16/124,495 filed Sep. 7, 2018, now U.S. Pat. No. 10,299,377, which is a Continuation of U.S. application Ser. No. 15/845,288 filed Dec. 18, 2017, now U.S. Pat. No. 10,111,326, which is a Continuation of U.S. application Ser. No. 14/310,770 filed Jun. 20, 2014, now U.S. Pat. No. 9,877,385, which is a Continuation of PCT International Application No. PCT/JP2012/083222 filed on Dec. 21, 2012, which claims priorities under 35 U.S.C. § 119(a) to Japanese Patent Application No. 2011-281928 filed Dec. 22, 2011, Japanese Patent Application No. 2012-113741 filed May 17, 2012, and Japanese Patent Application No. 2012-182678 filed Aug. 21, 2012. Each of the above applications is hereby expressly incorporated by reference, in its entirety, into the present application.

BACKGROUND OF THE INVENTION

Field of the Invention

The present invention relates to a conductive sheet and a touch panel.

Description of the Related Art

In recent years, touch panels are frequently used as input devices for portable terminals and computers. Such a touch panel is placed on a surface of a display, and performs an input operation by detecting a position touched with a finger or the like. For example, a resistance film type and a capacitive type are known as a position detecting method for a touch panel.

For example, in a capacitive touch panel, indium tin oxide (ITO) is used as a material of a transparent electrode pattern, from the perspective of visibility. ITO, however, has a high wiring resistance and does not have a sufficient transparency, and hence it is discussed that a transparent electrode pattern formed using metal thin wires is used for a touch panel.

Studies on transparent conductive films formed using metal thin wires are continued as disclosed in, for example, U.S. Patent Application Publication No. 2004/0229028 and Pamphlet of International Publication No. WO 2006/001461. If an electrode is formed by arranging a large number of grids made of metallic thin wires (metal thin wires), the surface resistance is considered to be reduced. For example, Japanese Patent Application Laid-Open No. 5-224818, Pamphlet of International Publication No. WO 1995/27334, U.S. Patent Application Publication No. 2004/0239650. U.S. Pat. No. 7,202,859, Pamphlet of International Publication No. WO 1997/18508 and Japanese Patent Application Laid-Open No. 2003-099185 are known as touch panels in which metal thin wires are used to form electrodes.

Japanese Patent Application Laid-Open No. 2010-277392 discloses a touch panel including: a plurality of first detection electrodes that are made of net-like conductive wires and are placed in parallel in one direction; and a plurality of second detection electrodes that are made of net-like conductive wires and are placed in parallel in a direction orthogonal to that of the first detection electrodes.

SUMMARY OF THE INVENTION

In the touch panel of Japanese Patent Application Laid-Open No. 2010-277392, if the touch panel is touched with a finger, a change in electrostatic capacitance that occurs in the electrodes is determined, whereby a position touched with the finger is detected. However, in a touch panel of U.S. Patent Application Publication No. 2004/0229028, in the case where an upper electrode is made of a uniform conductive region and does not have a nonconductive region, even if a finger or the like comes into contact with the touch panel, lines of discharged electric force are closed between the electrodes, and the detection performance of the contact of finger may become lower in some cases.

The present inventors have examined various configurations of net-like electrodes. The present inventors find out that, in the case where break parts are formed in a net-like electrode, the break parts stand out depending on the positions of the break parts. For example, in the case where the break parts are respectively formed in intersection parts of a plurality of conductive wires that form the net-like electrode, an opening portion of each break part is observable as it is opened. If such opening portions (break parts) are arranged on a straight line, the break parts are recognized as a pattern, and hence the visibility may be unfavorably impaired.

The present invention, which has been made in view of such a problem, has an object to provide a conductive sheet and a touch panel that include electrode patterns made of metal thin wires and have a high detection accuracy of a contact position (touch position) on the touch panel.

The present invention has another object to provide a conductive sheet and a capacitive touch panel that do not impair the visibility.

A conductive sheet according to one aspect of the present invention includes: a substrate having a first main surface and a second main surface; and a first electrode pattern placed on the first main surface of the substrate. The first electrode pattern is made of metal thin wires, and alternately includes: a plurality of first conductive patterns that extend in a first direction; and a plurality of first nonconductive patterns that are electrically separated from the plurality of first conductive patterns. Each of the first conductive patterns includes, at least, inside thereof, a sub-nonconduction pattern that is electrically separated from the first conductive pattern. An area A of each first conductive patterns and an area B of each sub-nonconduction pattern satisfy a relation of $5\% < B/(A+B) < 97\%$.

Preferably, the area A of each first conductive pattern and the area B of each sub-nonconduction pattern satisfy a relation of $10\% \leq B/(A+B) \leq 80\%$.

Preferably, the area A of each first conductive pattern and the area B of each sub-nonconduction pattern satisfy a relation of $10\% \leq B/(A+B) \leq 60\%$.

Preferably, in the conductive sheet, each sub-nonconduction pattern has a slit-like shape extending in the first direction, each first conductive pattern includes a plurality of first conductive pattern lines divided by each sub-nonconduction pattern, and an area A1 of each first conductive pattern and an area B1 of each sub-nonconduction pattern satisfy a relation of $40\% \leq B1/(A1+B1) \leq 60\%$.

Preferably, a total width Wa of widths of the first conductive pattern lines and a total width Wb of: a total width of widths of the sub-nonconduction patterns; and a width of the first nonconductive pattern satisfy relations of the following expressions (1) and (2).

$$1.0 \text{ mm} \leq Wa \leq 5.0 \text{ mm} \quad (1)$$

$$1.5 \text{ mm} \leq Wb \leq 5.0 \text{ mm} \quad (2)$$

Preferably, in the conductive sheet, the first conductive pattern has X-shaped structures with cyclical intersections, and an area A2 of the first conductive pattern and an area B2 of the sub-nonconduction pattern satisfy a relation of 20%≤B2/(A2+B2)≤50%, and more preferably satisfy a relation of 30%≤B2/(A2+B2)≤50%.

Preferably, the conductive sheet further includes a second electrode pattern placed on the second main surface of the substrate. The second electrode pattern is made of metal thin wires, and includes a plurality of second conductive patterns that extend in a second direction orthogonal to the first direction.

Preferably, in the conductive sheet, the plurality of first conductive patterns are formed by grids having uniform shapes, and each of the grids has one side having a length that is equal to or more than 250 μm and equal to or less than 900 μm.

Preferably, each of the metal thin wires that form the first electrode pattern and/or the metal thin wires that form the second electrode pattern has a wire width equal to or less than 30 μm.

Preferably, in the conductive sheet, a width of the first conductive pattern line and a width of the sub-nonconduction pattern are substantially equal to each other.

Preferably, in the conductive sheet, a width of the first conductive pattern line is smaller than a width of the sub-nonconduction pattern.

Preferably, in the conductive sheet, a width of the first conductive pattern line is larger than a width of the sub-nonconduction pattern.

Preferably, in the conductive sheet, the first electrode pattern includes a joining part that electrically connects the plurality of first conductive pattern lines to each other.

Preferably, in the conductive sheet, a number of the first conductive pattern lines is equal to or less than ten.

Preferably, in the conductive sheet, the sub-nonconduction pattern is surrounded by a plurality of sides, and the sides are formed by linearly arranging a plurality of grids that form the first conductive pattern, with sides of the grids being connected to each other.

Preferably, in the conductive sheet, each of the sub-nonconduction pattern is surrounded by a plurality of sides, and the sides are formed by linearly arranging, in multiple stages, a plurality of grids that form the first conductive pattern, with sides of the grids being connected to each other.

Preferably, in the conductive sheet, the sub-nonconduction pattern is surrounded by a plurality of sides, some of the sides are formed by linearly arranging a plurality of grids that form the first conductive pattern, with sides of the grids being connected to each other, and the other sides are formed by linearly arranging the plurality of grids with apex angles of the grids being connected to each other.

Preferably, in the conductive sheet, the plurality of sub-nonconduction patterns defined by the sides formed by the plurality of grids are arranged along the first direction with apex angles of the grids being connected to each other.

Preferably, in the conductive sheet, adjacent ones of the sub-nonconduction patterns along the first direction have shapes different from each other.

Preferably, in the conductive sheet, each of the plurality of grids that form the sides for defining the sub-nonconduction patterns further includes a protruding wire made of a metal thin wire.

Preferably, in the conductive sheet, the first conductive pattern includes the sub-nonconduction patterns at predetermined intervals, to thereby have X-shaped structures in which the grids are not present at cyclical intersection parts.

Preferably, in the conductive sheet, adjacent ones of the sub-nonconduction patterns along the first direction have the same shape each other in the first conductive pattern, and the sub-nonconduction patterns have shapes different between adjacent ones of the first conductive patterns.

A touch panel, preferably a capacitive touch panel, and more preferably a projected capacitive touch panel according to another aspect of the present invention includes the conductive sheet of the present invention.

A conductive sheet according to another aspect of the present invention includes: a substrate having a first main surface and a second main surface; and a first electrode pattern placed on the first main surface. The first electrode pattern is formed by a plurality of grids made of a plurality of metal thin wires that intersect with each other, and alternately includes: a plurality of first conductive patterns that extend in a first direction; and a plurality of first nonconductive patterns that electrically separate the plurality of first conductive patterns from each other. Each of the first nonconductive patterns includes first break parts in portions other than intersection parts of the metal thin wires. The conductive sheet includes a second electrode pattern placed on the second main surface. The second electrode pattern is formed by a plurality of grids made of a plurality of metal thin wires that intersect with each other, and alternately includes: a plurality of second conductive patterns that extend in a second direction orthogonal to the first direction; and a plurality of second nonconductive patterns that electrically separate the plurality of second conductive patterns from each other. Each of the second nonconductive patterns includes second break parts in portions other than intersection parts of the metal thin wires. The first electrode pattern and the second electrode pattern are placed on the substrate such that the plurality of first conductive patterns and the plurality of second conductive patterns are orthogonal to each other in top view and that the grids of the first electrode pattern and the grids of the second electrode pattern form small grids in top view.

Another conductive sheet according to the present invention includes: a first substrate having a first main surface and a second main surface; and a first electrode pattern placed on the first main surface of the first substrate. The first electrode pattern is formed by a plurality of grids made of a plurality of metal thin wires that intersect with each other, and alternately includes: a plurality of first conductive patterns that extend in a first direction; and a plurality of first nonconductive patterns that electrically separate the plurality of first conductive patterns from each other. Each of the first nonconductive patterns includes first break parts in portions other than intersection parts of the metal thin wires. The conductive sheet includes: a second substrate having a first main surface and a second main surface; and a second electrode pattern placed on the first main surface of the second substrate. The second electrode pattern is formed by a plurality of grids made of a plurality of metal thin wires that intersect with each other, and alternately includes: a plurality of second conductive patterns that extend in a second direction orthogonal to the first direction; and a plurality of second nonconductive patterns that electrically separate the plurality of second conductive patterns from each other. Each of the second nonconductive patterns includes second break parts in portions other than intersection parts of the metal thin wires. The first substrate and the second substrate are placed such that the plurality of first conductive patterns and the plurality of second conductive patterns are orthogonal to each other in top view and that the grids of the first electrode pattern and the grids of the second electrode pattern form small grids in top view.

Preferably, in the conductive sheet according to the another aspect of the present invention, the first break parts are respectively located near centers between the intersection parts and the intersection parts of the metal thin wires of the first nonconductive patterns, and the second break parts are respectively located near centers between the intersection parts and the intersection parts of the metal thin wires of the second nonconductive patterns.

Preferably, in the conductive sheet according to the another aspect of the present invention, each of the first break parts and the second break parts has a width that exceeds a wire width of each of the metal thin wires and is equal to or less than 50 μm.

Preferably, in the conductive sheet according to the another aspect of the present invention, the metal thin wires of the second conductive patterns are located in the first break parts of the first nonconductive patterns in top view, and the metal thin wires of the first conductive patterns are located in the second break parts of the second nonconductive patterns in top view.

Preferably, in the conductive sheet according to the another aspect of the present invention, assuming that a width of each of the metal thin wires of the first conductive patterns and the metal thin wires of the second conductive patterns is a and that a width of each of the first break parts of the first nonconductive patterns and the second break parts of the second nonconductive patterns is b, a relational expression of b−a≤30 μm is satisfied.

Preferably, in the conductive sheet according to the another aspect of the present invention, assuming that a width of each of the metal thin wires of the first conductive patterns and the metal thin wires of the second conductive patterns is a and that a width of each of the first break parts of the first nonconductive patterns and the second break parts of the second nonconductive patterns is b, a relational expression of (b−a)/a≤6 μm is satisfied.

Preferably, in the conductive sheet according to the another aspect of the present invention, a positional misalignment between: a central position of each of the metal thin wires of the first conductive patterns; and a central position of each of the second break parts of the second nonconductive patterns has a standard deviation equal to or less than 10 μm, and a positional misalignment between: a central position of each of the metal thin wires of the second conductive patterns; and a central position of each of the first break parts of the first nonconductive patterns has a standard deviation equal to or less than 10 μm.

In the conductive sheet according to the another aspect of the present invention, the grids of the first electrode pattern and the grids of the second electrode pattern have a grid pitch of 250 μm to 900 μm, and preferably have a grid pitch of 300 μm to 700 μm and the small grids have a grid pitch of 125 μm to 450 μm, and preferably have a grid pitch of 150 μm to 350 μm.

Preferably, in the conductive sheet according to the another aspect of the present invention, each of the metal thin wires that form the first electrode pattern and the metal thin wires that form the second electrode pattern has a wire width equal to or less than 30 μm.

Preferably, in the conductive sheet according to the another aspect of the present invention, each of the grids of the first electrode pattern and the grids of the second electrode pattern has a rhomboid shape.

A capacitive touch panel according to the present invention includes any one of the above-mentioned conductive sheets.

The conductive sheets according to the above-mentioned aspects and the capacitive touch panel can suppress a decrease in visibility.

According to the present invention, it is possible to provide a conductive sheet and a touch panel that include electrode patterns made of metal thin wires and have a high detection accuracy.

DETAILED DESCRIPTION OF THE EXEMPLARY EMBODIMENTS

Hereinafter, preferred embodiments of the present invention are described with reference to the attached drawings. The present invention is described by way of the following preferred embodiments, but can be changed according to many methods, without departing from the scope of the present invention. Other embodiments than the present embodiments can be adopted for the present invention. Accordingly, all changes within the scope of the present invention are included in the scope of the patent claims. Note that, herein, "to" indicating a numerical value range is used to mean that the numerical value range includes numerical values given before and after "to" as its lower limit value and its upper limit value.

Figure 1:
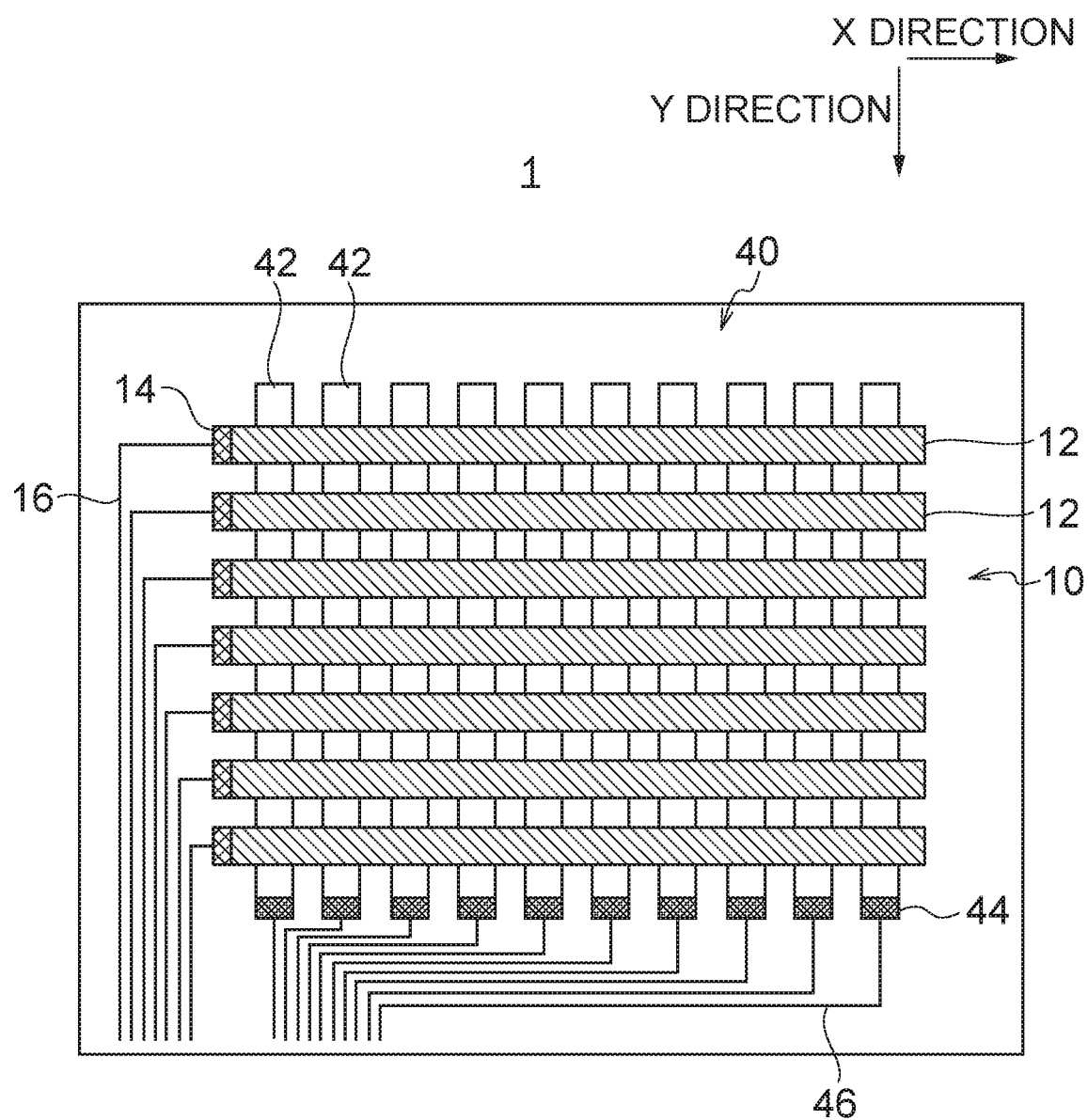
FIG. 1 is a schematic plan view of a conductive sheet for a touch panel.

FIG. 1 is a schematic plan view of a conductive sheets 1 for a touch panel. The conductive sheet 1 includes a first electrode pattern 10 made of metal thin wires and a second electrode pattern 40 made of metal thin wires. The first electrode pattern 10 includes a plurality of first conductive patterns 12 that extend in a first direction (X direction) and are arranged in parallel to each other. The second electrode pattern 40 includes a plurality of second conductive patterns 42 that extend in a second direction (Y direction) orthogonal to the first direction (X direction) and are arranged in parallel to each other.

Each first conductive pattern 12 has one end electrically connected to a first electrode terminal 14. Further, each first electrode terminal 14 is electrically connected to a first wire 16 having conductive properties. Each second conductive pattern 42 has one end electrically connected to a second electrode terminal 44. Each second electrode terminal 44 is electrically connected to a second wire 46 having conductive properties.

Figure 2:
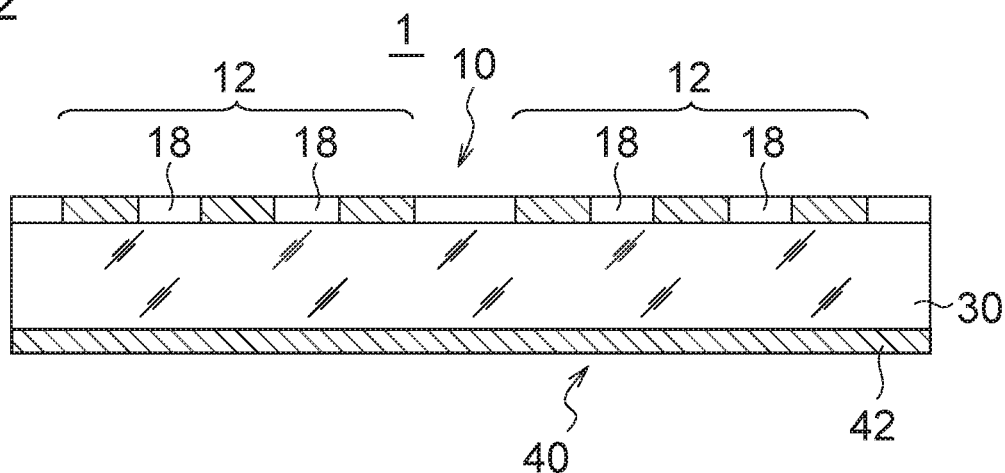
FIG. 2 is a schematic cross-sectional view of the conductive sheet.

FIG. 2 is a schematic cross-sectional view of the conductive sheet 1 according to the present embodiment. The conductive sheet 1 includes: a substrate 30 having a first main surface and a second main surface; the first electrode pattern 10 placed on the first main surface of the substrate 30; and the second electrode pattern 40 placed on the second main surface of the substrate 30. The first electrode pattern 10 includes the first conductive patterns 12, and each first conductive pattern 12 includes sub-nonconduction patterns 18 electrically separated from the first conductive pattern 12. In the embodiment of FIG. 2, adjacent two of the first conductive patterns 12 are illustrated, and each first conductive pattern 12 includes two sub-nonconduction patterns 18. The present invention, however, is not limited thereto.

Figure 3:
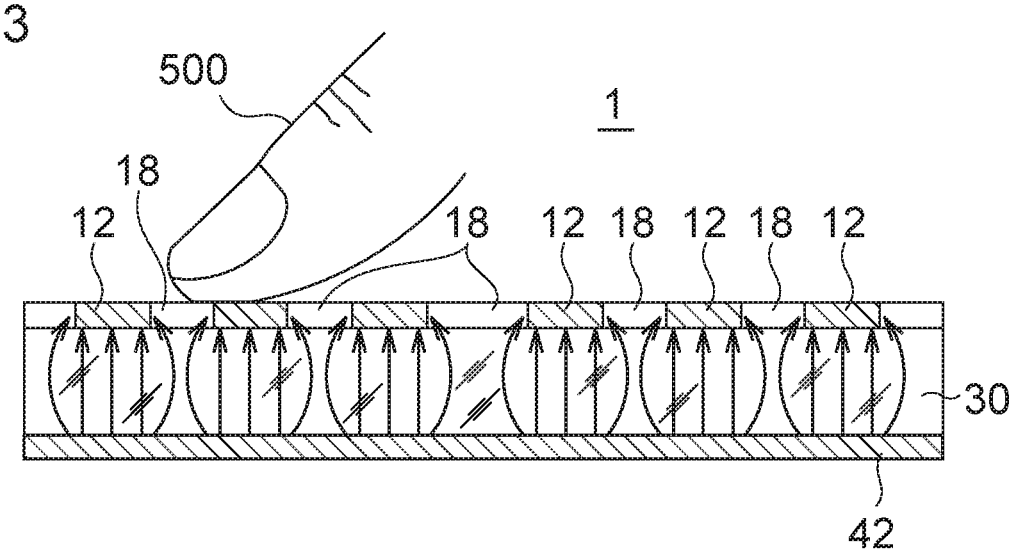
FIG. 3 is an explanatory diagram for describing a behavior of the touch panel including the conductive sheet of the present embodiment.

FIG. 3 is a view of a state where a finger 500 is brought into contact with a touch panel including the conductive sheet 1 of FIG. 2. If the finger 500 is brought into contact with the first conductive patterns 12 including the sub-nonconduction patterns 18, lines of electric force discharged from the second conductive patterns 42 pass through the sub-nonconduction patterns 18. That is, the lines of electric force are not closed between the first conductive patterns 12 and the second conductive patterns 42. As a result, a change in electrostatic capacitance caused by the touch with finger 500 can be reliably recognized.

Figure 4:
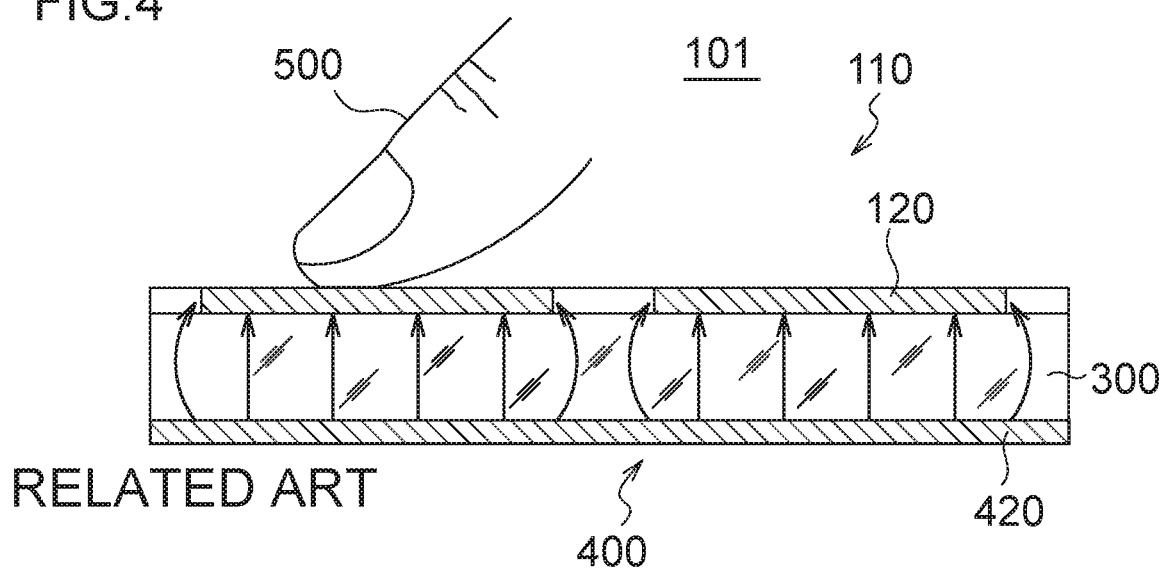
FIG. 4 is an explanatory diagram for describing a behavior of a touch panel including a conventional conductive sheet.

FIG. 4 is a view of a state where the finger 500 is brought into contact with a touch panel including a conventional conductive sheet 101. The conductive sheet 101 includes: a substrate 300 having a first main surface and a second main surface; a first electrode pattern 110 placed on the first main surface of the substrate 300; and a second electrode pattern 400 placed on the second main surface of the substrate 300. Each first conductive pattern 120 of the first electrode pattern 110 does not include a sub-nonconduction pattern electrically separated from the first conductive pattern 120. That is, each first conductive pattern 120 is made of a uniform conductive region. As a result, lines of electric force discharged from second conductive patterns 420 are closed between the first conductive patterns 120 and the second conductive patterns 420, and the touch with finger 500 cannot be detected in some cases.

In the conductive sheet 1 according to one aspect, each first conductive pattern 12 includes, inside thereof, the sub-nonconduction patterns 18 electrically separated from the first conductive pattern 12. Further, assuming that the area of each first conductive pattern 12 is A and that the area of the sub-nonconduction patterns 18 is B, a relation of 5%<B/(A+B)<97% is satisfied. The area A is the entire area from one end to another end of one first conductive pattern 12, and the area B is the area of the sub-nonconduction patterns 18 included from one end to another end of one first conductive pattern 12. In another embodiment, a relation of 10%≤B/(A+B)≤80% is satisfied. In still another embodiment, a relation of 10%≤B/(A+B)≤60% is satisfied.

First Electrode Pattern

First Embodiment

Figure 5:
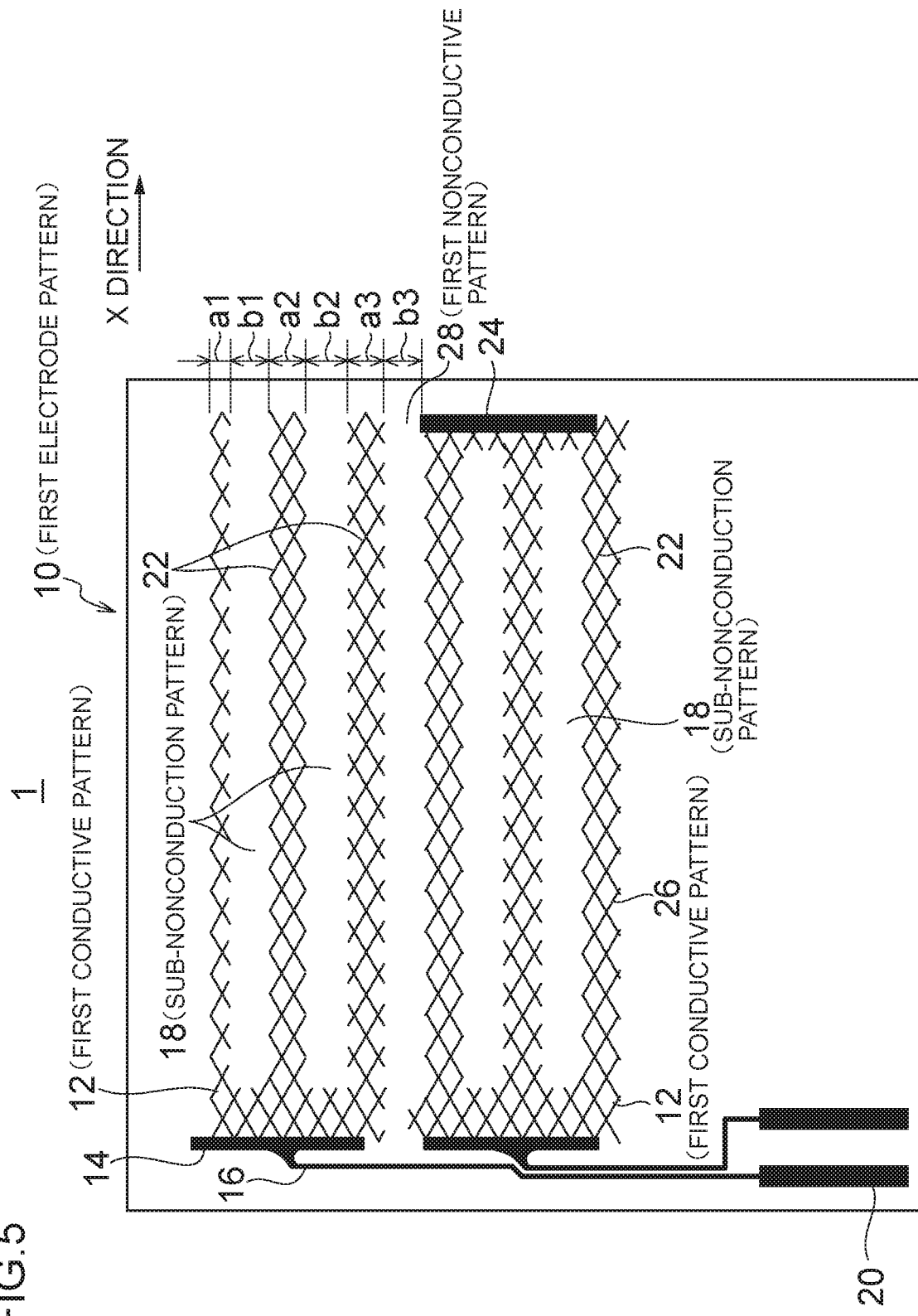
FIG. 5 is a plan view illustrating an example of a first electrode pattern of a first embodiment.

FIG. 5 illustrates a conductive sheet 1 including a first electrode pattern 10 according to a first embodiment. In FIG. 5, the first electrode pattern 10 includes two types of first conductive patterns 12 formed by a plurality of grids 26 made of metal thin wires. The plurality of grids 26 have substantially uniform shapes. Here, the substantially uniform means not only that the shapes are completely coincident with each other but also that the shapes and sizes of the grids 26 are seemingly the same as each other.

Each first conductive pattern 12 has one end electrically connected to a first electrode terminal 14. Each first electrode terminal 14 is electrically connected to one end of each first wire 16. Each first wire 16 has another end electrically connected to a terminal 20. Each first conductive pattern 12 is electrically separated by a first nonconductive pattern 28.

Note that, in the case of the use of the conductive sheet 1 as a transparent conductive film placed on the front side of a display that is required to have visibility, a dummy pattern that includes break parts to be described later and is made of metal wires is formed as the first nonconductive pattern 28. On the other hand, in the case of the use of the conductive sheet 1 as a transparent conductive film placed on the front side of a notebook computer, a touch pad, or the like that is not particularly required to have visibility, a dummy pattern made of metal thin wires is not formed as the first nonconductive pattern 28, and the first nonconductive pattern 28 exists as a space (blank).

The first conductive patterns 12 extend in a first direction (X direction), and are arranged in parallel. Each first conductive pattern 12 includes slit-like sub-nonconduction patterns 18 electrically separated from the first conductive pattern 12. Each first conductive pattern 12 includes a plurality of first conductive pattern lines 22 divided by the sub-nonconduction patterns 18.

Note that, in the case of the use of the conductive sheet 1 as a transparent conductive film placed on the front side of a display that is required to have visibility, a dummy pattern that includes break parts to be described later and is made of metal wires is formed as each sub-nonconduction pattern 18. On the other hand, in the case of the use of the conductive sheet 1 as a transparent conductive film placed on the front side of a notebook computer, a touch pad, or the like that is not particularly required to have visibility, a dummy pattern made of metal thin wires is not formed as each sub-nonconduction pattern 18, and each sub-nonconduction pattern 18 exists as a space (blank).

As illustrated in the upper side of FIG. 5, a first first conductive pattern 12 includes slit-like sub-nonconduction patterns 18 each having another end that is opened. Because the another ends are opened, the first first conductive pattern 12 has a comb-shaped structure. In the present embodiment, the first first conductive pattern 12 includes two sub-nonconduction patterns 18, whereby three first conductive pattern lines 22 are formed. The first conductive pattern lines 22 are connected to the first electrode terminal 14, and thus have the same electric potential.

As illustrated in the lower side of FIG. 5, still another first conductive pattern 12, that is, a second first conductive pattern 12 has another end at which an additional first electrode terminal 24 is provided. Slit-like sub-nonconduction patterns 18 are closed inside of the first conductive pattern 12. If the additional first electrode terminal 24 is provided, each first conductive pattern 12 can be easily checked. In the present embodiment, the second first conductive pattern 12 includes two closed sub-nonconduction patterns 18, whereby three first conductive pattern lines 22 are formed in the first conductive pattern 12. Each first conductive pattern lines 22 is connected to the first electrode terminal 14 and the additional first electrode terminal 24, and thus they have the same electric potential. Such first conductive pattern lines are one of modified examples of the comb-shaped structure.

The number of the first conductive pattern lines 22 may be two or more, and is determined within a range of ten or less and preferably a range of seven or less, in consideration of a relation with a pattern design of metal thin wires.

Moreover, the pattern shapes of the metal thin wires of the three first conductive pattern lines 22 may be the same as each other, and may be different from each other. In FIG. 5, the shapes of the first conductive pattern lines 22 are different from each other. In the first first conductive pattern 12, the uppermost first conductive pattern line 22 of the three first conductive pattern lines 22 is designed to extend along the first direction (X direction) such that adjacent mountain-shaped metal wires intersect with each other. The grids 26 of the uppermost first conductive pattern line 22 are not complete, that is, each grid 26 does not have a lower apex angle. The central first conductive pattern line 22 is designed to extend in two lines along the first direction (X direction) such that sides of adjacent ones of the grids 26 are in contact with each other. The lowermost first conductive pattern line 22 is designed to extend along the first direction (X direction) such that apex angles of adjacent ones of the grids 26 are in contact with each other and that sides of the grids 26 are extended.

In the second first conductive pattern 12, the uppermost first conductive pattern line 22 and the lowermost first conductive pattern line 22 have substantially the same grid shape, and are thus designed to extend in two lines along the first direction (X direction) such that sides of adjacent ones of the grids 26 are in contact with each other. In the second first conductive pattern 12, the central first conductive pattern line 22 is designed to extend along the first direction (X direction) such that apex angles of adjacent ones of the grids 26 are in contact with each other and that sides of the grids 26 are extended.

In the first embodiment, assuming that the area of each first conductive pattern 12 is A1 and that the area of the sub-nonconduction patterns 18 is B1, it is preferable that $10\% \leq B1/(A1+B1) \leq 80\%$ be satisfied, and it is further preferable that $40\% \leq B1/(A1+B1) \leq 60\%$ be satisfied. If this range is satisfied, a difference in electrostatic capacitance between when a finger is in contact with the conductive sheet 1 and when a finger is not in contact with the conductive sheet 1 can be made larger. That is, the detection accuracy of the touch with finger can be improved.

Note that each area can be obtained in the following manner. A virtual line in contact with a plurality of the first conductive pattern lines 22 is drawn, and the first conductive pattern 12 and the sub-nonconduction patterns 18 surrounded by this virtual line are calculated, whereby each area can be obtained.

Assuming that the total width of the widths of the first conductive pattern lines 22 is Wa and that the sum of: the sum of the widths of the sub-nonconduction patterns 18; and the width of the first nonconductive pattern 28 is Wb, it is preferable that a condition of the following expression (W1-1) be satisfied, it is more preferable that a condition of the following expression (W1-2) be satisfied, and it is more preferable that a condition of the following expression (W1-3) be satisfied. Moreover, it is preferable that a condition of the following expression (W2-1) be satisfied, it is more preferable that a condition of the following expression (W2-2) be satisfied, and it is more preferable that a condition of the following expression (W2-3) be satisfied.

$$10\% \leq (Wa/(Wa+Wb)) \times 100 \leq 80\% \quad (W1\text{-}1)$$

$$10\% \leq (Wa/(Wa+Wb)) \times 100 \leq 60\% \quad (W1\text{-}2)$$

$$30\% \leq (Wa/(Wa+Wb)) \times 100 \leq 55\% \quad (W1\text{-}3)$$

$$Wa \leq (Wa+Wb)/2 \quad (W2\text{-}1)$$

$$(Wa+Wb)/5 \leq Wa \leq (Wa+Wb)/2 \quad (W2\text{-}2)$$

$$(Wa+Wb)/3 \leq Wa \leq (Wa+Wb)/2 \quad (W2\text{-}3)$$

If the sum of the widths of the first conductive pattern lines 22 is small, the touch panel response tends to be slower due to an increase in electrode resistance, whereas the recognition performance for a contacting finger tends to be higher due to a decrease in electrostatic capacitance. On the other hand, if the sum of the widths of the first conductive pattern lines 22 is large, the touch panel response tends to be faster due to a decrease in electrode resistance, whereas the recognition performance for a contacting finger tends to be lower due to an increase in electrostatic capacitance. These are in a trade-off relation, but, if the range of any of the above expressions is satisfied, the touch panel response and the recognition performance for a finger can be optimized.

Here, as illustrated in FIG. 5, the sum of widths a1, a2, and a3 of the first conductive pattern lines 22 corresponds to Wa, and the sum of widths b1 and b2 of the sub-nonconduction patterns 18 and a width b3 of the first nonconductive pattern 28 corresponds to Wb.

FIG. 5 illustrates one conductive sheet 1 in which the first first conductive pattern 12 not including the additional first electrode terminal 24 and the second first conductive pattern 12 including the additional first electrode terminal 24 are formed on the same plane. However, the first first conductive pattern 12 and the second first conductive pattern 12 do not necessarily need to be mixedly formed, and only any one of the first first conductive pattern 12 and the second first conductive pattern 12 may be formed.

In another embodiment, further preferably, assuming that the total width of the widths of the first conductive pattern lines 22 is Wa and that the total width of: the sum of the widths of the sub-nonconduction patterns 18; and the width of the first nonconductive pattern 28 is Wb, relations of 1.0 mm≤Wa≤5.0 mm and 1.5 mm≤Wb≤5.0 mm are satisfied. In consideration of the average size of a human finger, if Wa and Wb are respectively set within these ranges, the contact position can be more accurately detected. Further, for the value of Wa, 1.5 mm≤Wa≤4.0 mm is preferable, and 2.0 mm≤Wa≤2.5 mm is further preferable. Furthermore, for the value of Wb, 1.5 mm≤Wb≤4.0 mm is preferable, and 2.0 mm≤Wb≤3.0 mm is further preferable.

The metal thin wires that form the first electrode pattern 10 each have a wire width of, for example, 30 μm or less. The metal thin wires that form the first electrode pattern 10 are made of, for example, metal materials such as gold, silver, and copper and conductive materials such as metal oxides.

It is desirable that the wire width of each metal thin wire be 30 μm or less, preferably 15 μm or less, more preferably 10 μm or less, more preferably 9 μm or less, and more preferably 7 μm or less, and be 0.5 μm or more and preferably 1 μm or more.

The first electrode pattern 10 includes the plurality of grids 26 made of metal thin wires that intersect with each other. Each grid 26 includes an opening region surrounded by the metal thin wires. Each grid 26 has one side having a length of 900 μm or less and 250 μm or more. It is desirable that the length of one side thereof be 700 μm or less and 300 μm or more.

In the first conductive patterns 12 of the present embodiment, the opening ratio is preferably 85% or more, further preferably 90% or more, and most preferably 95% or more, in terms of the visible light transmittance. The opening ratio corresponds to the percentage of a translucent portion of the first electrode pattern 10 excluding the metal thin wires, in a predetermined region.

In the above-mentioned conductive sheet 1, each grid 26 has a substantially rhomboid shape. Alternatively, each grid 26 may have other polygonal shapes. Moreover, the shape of one side of each grid 26 may be a curved shape or a circular arc shape instead of a straight shape. In the case of the circular arc shape, for example, opposing two of the sides of each grid 26 may each have a circular arc shape convex outward, and another opposing two of the sides thereof may each have a circular arc shape convex inward. Moreover, the shape of each side of each grid 26 may be a wavy shape in which a circular arc convex outward and a circular arc convex inward are alternately continuous. As a matter of course, the shape of each side thereof may be a sine curve.

Next, examples of other first electrode patterns of the first embodiment are described with reference to FIGS. 6 to 11.

Figure 6:
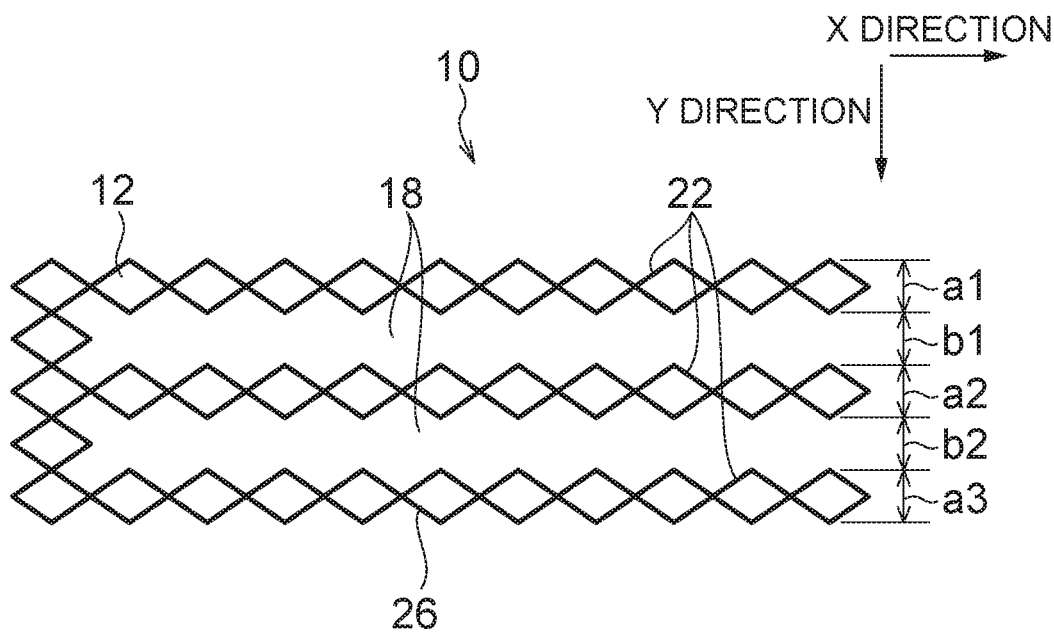
FIG. 6 is a plan view illustrating an example of another first electrode pattern of the first embodiment.

FIG. 6 illustrates the first electrode pattern 10 according to embodiment. The first electrode pattern 10 includes the first conductive patterns 12 formed by the large number of grids 26 made of metal thin wires. The first conductive patterns 12 extend in the first direction (X direction). Each first conductive pattern 12 includes the slit-like sub-nonconduction patterns 18 for electrically separating the first conductive pattern 12. Each first conductive pattern 12 includes the plurality of first conductive pattern lines 22 divided by the sub-nonconduction patterns 18. As illustrated in FIG. 6, each first conductive pattern line 22 is formed by the plurality of grids 26 that are arranged in one line in the first direction (X direction). The first conductive pattern lines 22 are electrically connected to each other by the large number of grids 26 that are made of metal thin wires and are placed at an end.

As illustrated in FIG. 6, the first conductive pattern lines 22 respectively extend in the first direction (X direction) from the first grid, the third grid, and the fifth grid of the five grids 26 that are arranged in the second direction (Y direction) at the end. As a result, each of the widths a1, a2, and a3 of the first conductive pattern 12 and each of the widths b1 and b2 of the sub-nonconduction patterns 18 are substantially the same length (as long as the diagonal of each grid 26).

Figure 7:
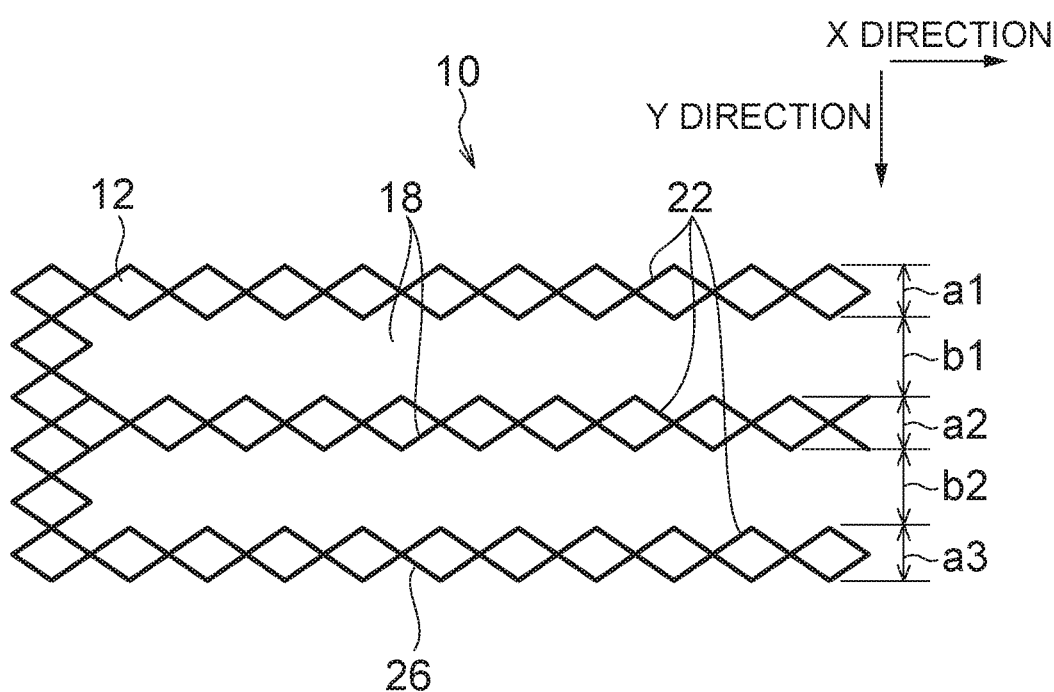
FIG. 7 is a plan view illustrating an example of another first electrode pattern of the first embodiment.

FIG. 7 illustrates the first electrode pattern 10 according to embodiment. The same configurations as those described above are designated by the same reference numerals or reference characters, and description thereof may be omitted. The first electrode pattern 10 includes the first conductive patterns 12 formed by the large number of grids 26 made of metal thin wires. The first conductive patterns 12 extend in the first direction (X direction). Each first conductive pattern 12 includes the slit-like sub-nonconduction patterns 18 for electrically separating the first conductive pattern 12. As illustrated in FIG. 7, each first conductive pattern line 22 is formed by the plurality of grids 26 that are arranged in one line in the first direction (X direction).

Unlike FIG. 6, in FIG. 7, the first conductive pattern lines 22 respectively extend in the first direction (X direction) from the first grid, between the third grid and the fourth grid, and the sixth grid of the six grids 26 that are arranged in the second direction (Y direction). That is, compared with FIG. 6, the plurality of first conductive pattern lines 22 in FIG. 7 are arranged at a pitch longer by half the size of each grid 26. As a result, the widths b1 and b2 of the sub-nonconduction patterns 18 are larger than the widths a1, a2, and a3 of the first conductive pattern 12. The widths b1 and b2 of the sub-nonconduction patterns 18 are 1.5 times longer than the diagonal of each grid 26, and the widths a1, a2, and a3 of the first conductive pattern 12 are as long as the diagonal of each grid 26. In the first electrode pattern 10 of FIG. 7, the width of each sub-nonconduction pattern 18 is larger.

Figure 8:
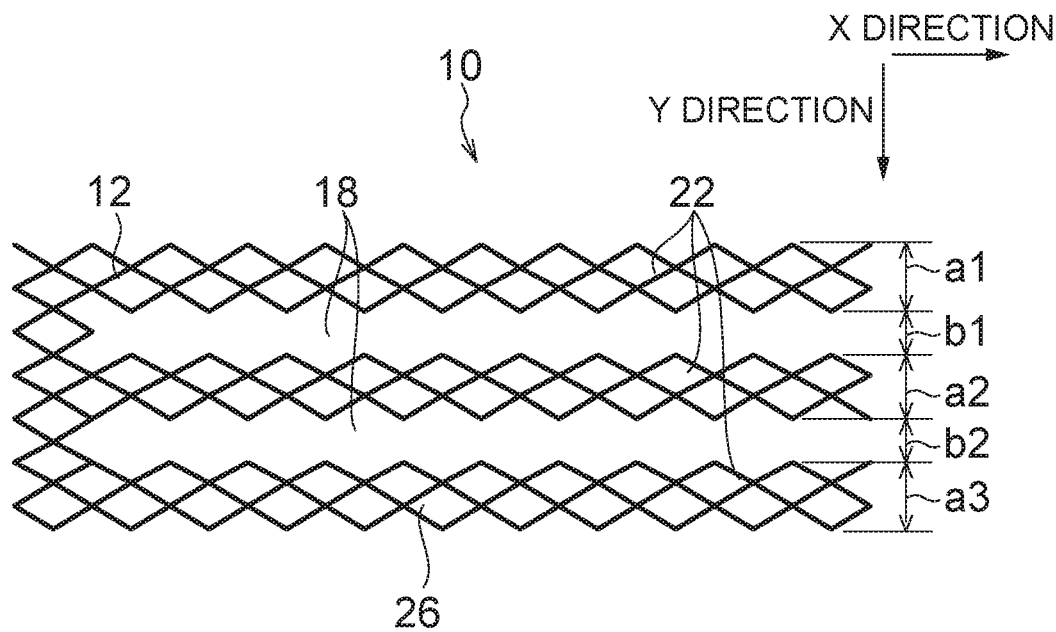
FIG. 8 is a plan view illustrating an example of another first electrode pattern of the first embodiment.

FIG. 8 illustrates the first electrode pattern 10 according to embodiment. The same configurations as those of the first electrode pattern 10 described above are designated by the same reference numerals or reference characters, and description thereof may be omitted. The first electrode pattern 10 includes the first conductive patterns 12 formed by the large number of grids 26 made of metal thin wires. The first conductive patterns 12 extend in the first direction (X direction). Each first conductive pattern 12 includes the slit-like sub-nonconduction patterns 18 for electrically separating the first conductive pattern 12. As illustrated in FIG. 8, each first conductive pattern line 22 is formed by the plurality of grids 26 that are arranged in two lines in the first direction (X direction).

In FIG. 8, the first conductive pattern lines 22 respectively extend in two lines in the first direction (X direction) from the first grid, the third grid and the fourth grid, and the fifth grid and the sixth grid of the six grids 26 that are arranged in the second direction (Y direction). As a result, the widths b1 and b2 of the sub-nonconduction patterns 18 are smaller than the widths a1, a2, and a3 of the first conductive pattern 12. The widths b1 and b2 of the sub-nonconduction patterns 18 are as long as the diagonal of each grid 26, and the widths a1, a2, and a3 of the first conductive pattern 12 are 1.5 times longer than the diagonal of each grid 26. In the first electrode pattern 10 of FIG. 8, the width of the first conductive pattern 12 is larger.

Figure 9:
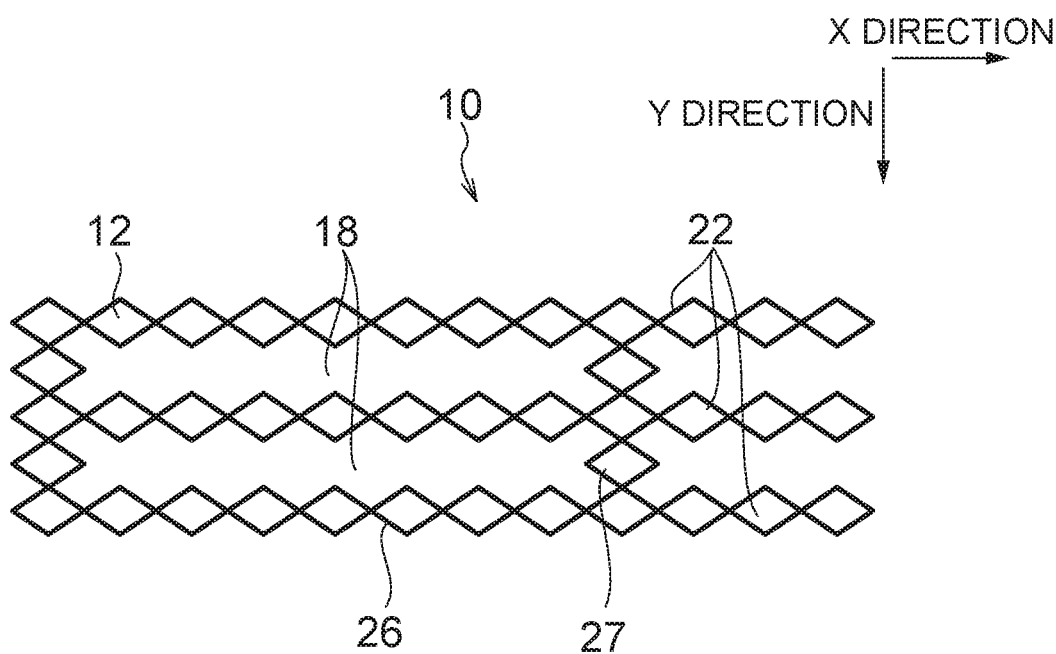
FIG. 9 is a plan view illustrating an example of another first electrode pattern of the first embodiment.

FIG. 9 illustrates the first electrode pattern 10 according to embodiment. The same configurations as those of the first electrode pattern 10 described above are designated by the same reference numerals or reference characters, and description thereof may be omitted. The first electrode pattern 10 illustrated in FIG. 9 has basically the same structure as that of the first electrode pattern 10 illustrated in FIG. 6. FIG. 9 is different from FIG. 6 in the following point. In FIG. 9, joining parts 27 that electrically connect the first conductive pattern lines 22 to each other are provided at locations other than ends of the first conductive pattern lines 22. Because the joining parts 27 are provided, even if the first conductive pattern lines 22 become longer and the wiring resistance thus becomes larger, the first conductive pattern lines 22 can be kept at the same electric potential.

Figure 10:
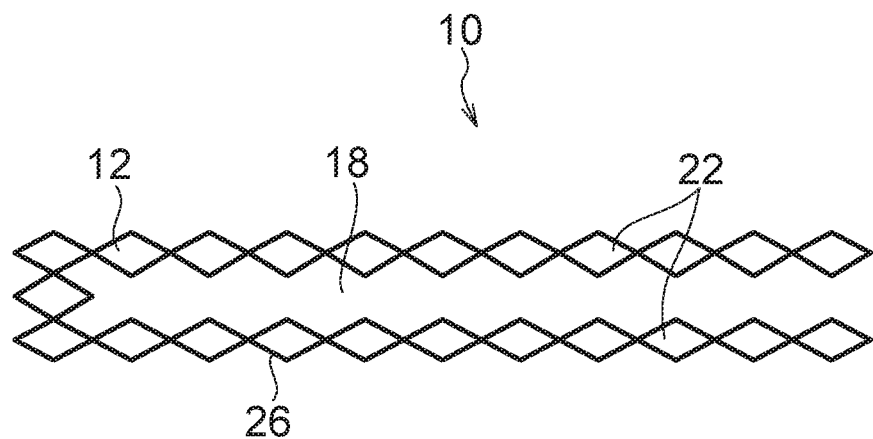
FIG. 10 is a plan view illustrating an example of another first electrode pattern of the first embodiment.

FIG. 10 illustrates the first electrode pattern 10 according to embodiment. The same configurations as those of the first electrode pattern 10 described above are designated by the same reference numerals or reference characters, and description thereof may be omitted. The first electrode pattern 10 illustrated in FIG. 10 has basically the same structure as that of the first electrode pattern 10 illustrated in FIG. 6. Unlike FIG. 6, in FIG. 10, the number of the first conductive pattern lines 22 is not three but two. The finger detection accuracy can be made higher as long as the number of the first conductive pattern lines 22 of the first electrode pattern 10 is two or more.

Figure 11:
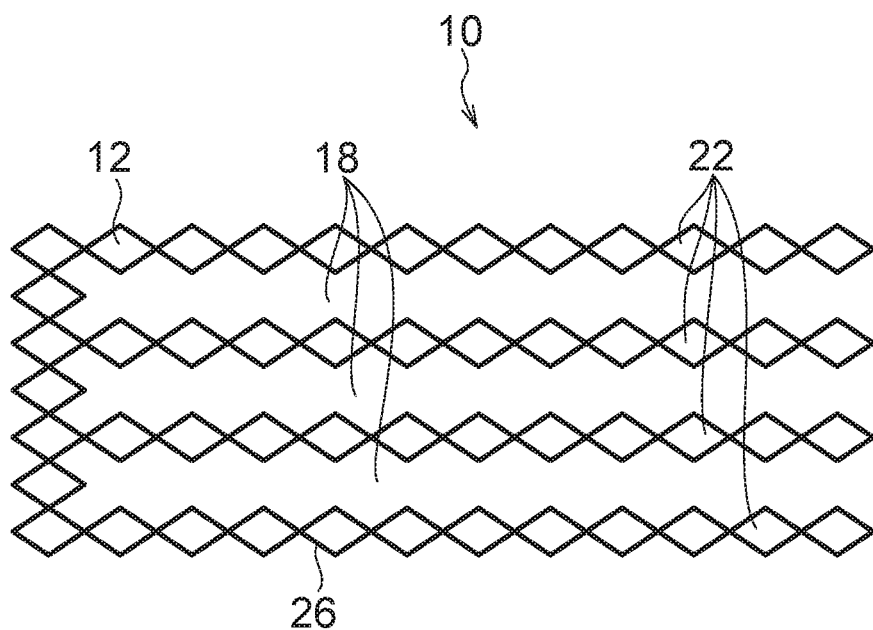
FIG. 11 is a plan view illustrating an example of another first electrode pattern of the first embodiment.

FIG. 11 illustrates the first electrode pattern 10 according to embodiment. The same configurations as those of the first electrode pattern 10 described above are designated by the same reference numerals or reference characters, and description thereof may be omitted. The first electrode pattern 10 illustrated in FIG. 11 has basically the same structure as that of the first electrode pattern 10 illustrated in FIG. 6. Unlike FIG. 6, in FIG. 11, the number of the first conductive pattern lines 22 is not three but four. The finger detection accuracy can be made higher as long as the number of the first conductive pattern lines 22 of the first electrode pattern 10 is two or more, for example, even five or more.

Note that, in FIG. 6 to FIG. 11, each area can be obtained in the following manner. A virtual line in contact with a plurality of the first conductive pattern lines 22 is drawn, and the first conductive pattern 12 and the sub-nonconduction patterns 18 surrounded by this virtual line are calculated, whereby each area can be obtained.

Second Embodiment

Figure 12:
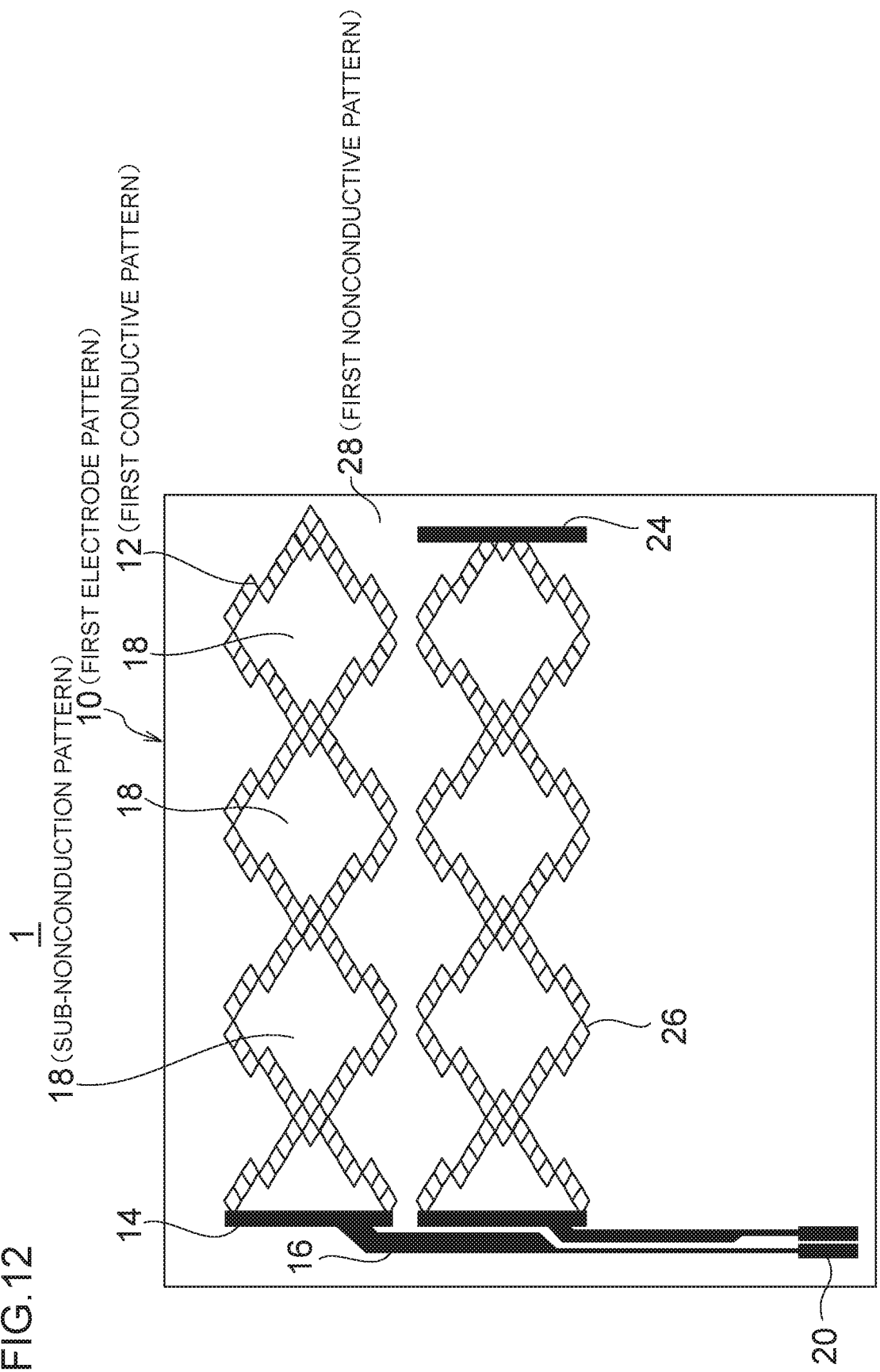
FIG. 12 is a plan view illustrating an example of a first electrode pattern of a second embodiment.

FIG. 12 illustrates a conductive sheet 1 including a first electrode pattern 10 according to another embodiment. Configurations similar to those in FIG. 5 are designated by the same reference numerals or reference characters, and description thereof may be omitted. In FIG. 12, the first electrode pattern 10 includes two types of first conductive patterns 12 formed by a plurality of grids 26 made of metal thin wires. The plurality of grids 26 have substantially uniform shapes. Here, the substantially uniform means not only that the shapes are completely coincident with each other but also that the shapes and sizes of the grids 26 are seemingly the same as each other.

Each first conductive pattern 12 has one end electrically connected to a first electrode terminal 14. Each first electrode terminal 14 is electrically connected to one end of each first wire 16. Each first wire 16 has another end electrically connected to a terminal 20. Each first conductive pattern 12 is electrically separated by a first nonconductive pattern 28.

Note that, in the case where the conductive sheet 1 is used as a transparent conductive film placed on the front side of a display that is required to have visibility, a dummy pattern that includes break parts to be described later and is made of metal wires is formed as the first nonconductive pattern 28. On the other hand, in the case where the conductive sheet 1 is used as a transparent conductive film placed on the front side of a notebook computer, a touch pad, or the like that is not particularly required to have visibility, a dummy pattern made of metal thin wires is not formed as the first nonconductive pattern 28, and the first nonconductive pattern 28 exists as a space (blank).

As illustrated in the upper side of FIG. 12, one first conductive pattern, that is, a first first conductive pattern 12 does not include an additional first electrode terminal 24. On the other hand, as illustrated in the lower side of FIG. 12, a second first conductive pattern 12 includes the additional first electrode terminal 24. FIG. 12 illustrates one conductive sheet 1 in which the first first conductive pattern 12 not including the additional first electrode terminal 24 and the second first conductive pattern 12 including the additional first electrode terminal 24 are formed on the same plane. However, the first first conductive pattern 12 and the second first conductive pattern 12 do not necessarily need to be mixedly formed, and only any one of the first first conductive pattern 12 and the second first conductive pattern 12 may be formed.

In the present embodiment, each first conductive pattern 12 has X-shaped structures with cyclical intersections. This cycle can be selected as appropriate. Assuming that the area of each first conductive pattern 12 is A2 and that the area of the sub-nonconduction patterns 18 is B2, a relation of 10%≤B2/(A2+B2)≤80% is satisfied. In another embodiment, a relation of 20%≤B2/(A2+B2)≤50% is satisfied. In still another embodiment, a relation of 30%≤B2/(A2+B2)≤50% is satisfied.

Note that each area can be obtained in the following manner. The area of each first conductive pattern 12 is obtained by calculating the unit area of each grid 26×the number of the grids 26. The area of the sub-nonconduction patterns 18 is obtained by placing virtual grids 26 and calculating the unit area of each virtual grid 26×the number of the grids 26.

Note that, in the case where the conductive sheet 1 is used as a transparent conductive film placed on the front side of a display that is required to have visibility, a dummy pattern that includes break parts to be described later and is made of metal wires is formed as each sub-nonconduction pattern 18. On the other hand, in the case where the conductive sheet 1 is used as a transparent conductive film placed on the front side of a notebook computer, a touch pad, or the like that is not particularly required to have visibility, a dummy pattern made of metal thin wires is not formed as each sub-nonconduction pattern 18, and each sub-nonconduction pattern 18 exists as a space (blank).

If this range is satisfied, a difference in electrostatic capacitance between when a finger contacts the conductive sheet 1 and when a finger does not contact the conductive sheet 1 can be made larger. That is, the detection accuracy of the touch with finger can be improved.

The wire width of the metal thin wires that form the first electrode pattern 10 and the material thereof are substantially the same as those in the embodiment of FIG. 5. Moreover, the grids 26 of the metal thin wires that form the first electrode pattern 10 are substantially the same as those in the embodiment of FIG. 5.

Next, examples of other first electrode patterns of the second embodiment are described with reference to FIGS. 13 to 22.

Figure 13:
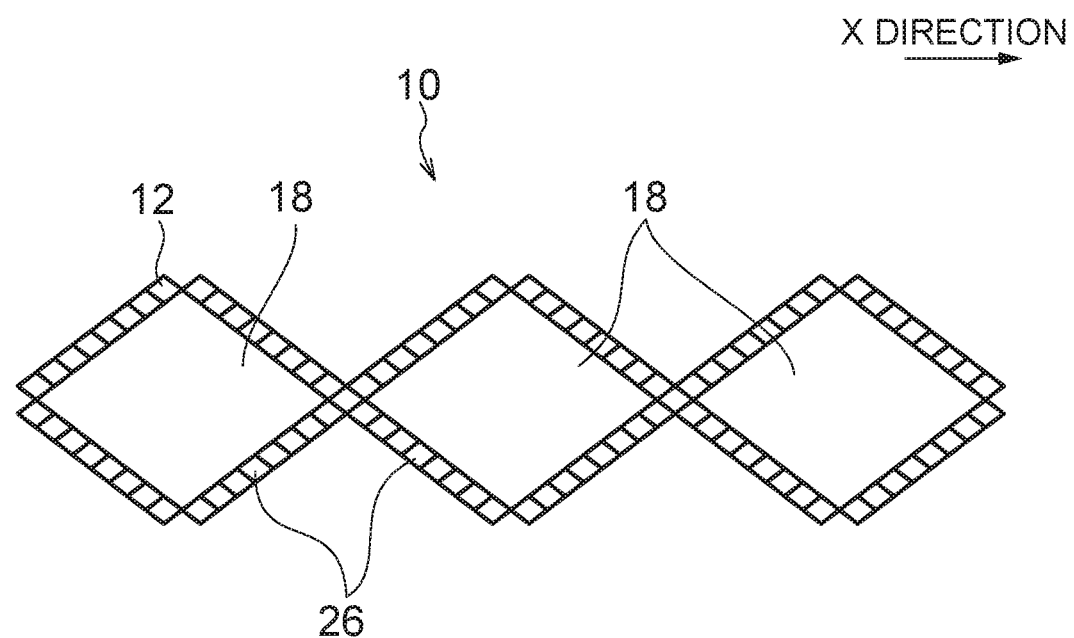
FIG. 13 is a plan view illustrating an example of another first electrode pattern of the second embodiment.

FIG. 13 illustrates the first electrode pattern 10 according to another embodiment. The same configurations as those of the first electrode pattern 10 described above are designated by the same reference numerals or reference characters, and description thereof may be omitted. The first electrode pattern 10 includes the first conductive patterns 12 formed by the large number of grids 26 made of metal thin wires. Each first conductive pattern 12 includes the plurality of sub-nonconduction patterns 18 along the first direction, to thereby have X-shaped structures with cyclical intersections.

In the first conductive pattern 12 illustrated in FIG. 13, each sub-nonconduction pattern 18 is surrounded and defined by four sides. Each of the four sides is formed by linearly arranging the plurality of grids 26 with sides of adjacent ones of the grids 26 being connected to each other. Each sub-nonconduction pattern 18 is surrounded by the plurality of linearly arranged grids 26, whereby a diamond pattern (rhomboid pattern) is formed. Adjacent diamond patterns are electrically connected to each other. In FIG. 13, adjacent diamond patterns are electrically connected to each other with the intermediation of sides of the grids 26.

Figure 14:
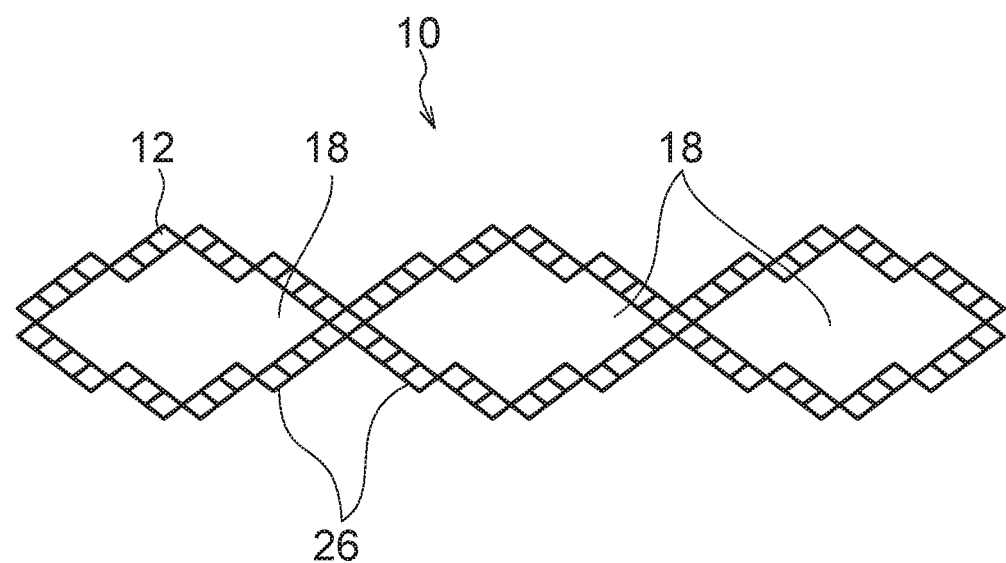
FIG. 14 is a plan view illustrating an example of another first electrode pattern of the second embodiment.

FIG. 14 illustrates the first electrode pattern 10 according to another embodiment. The same configurations as those of the first electrode pattern 10 described above are designated by the same reference numerals or reference characters, and description thereof may be omitted. The first electrode pattern 10 includes the first conductive patterns 12 formed by the large number of grids 26 made of metal thin wires. Each first conductive pattern 12 includes the plurality of sub-nonconduction patterns 18 along the first direction, to thereby have X-shaped structures with cyclical intersections.

In the first conductive pattern 12 illustrated in FIG. 14, each sub-nonconduction pattern 18 is surrounded and defined by four sides. Each of the four sides is formed by linearly arranging, in multiple stages, the plurality of grids 26 with sides of adjacent ones of the grids 26 being connected to each other. In FIG. 14, each of the four sides is formed in two stages, but is not limited to the two stages.

Figure 15:
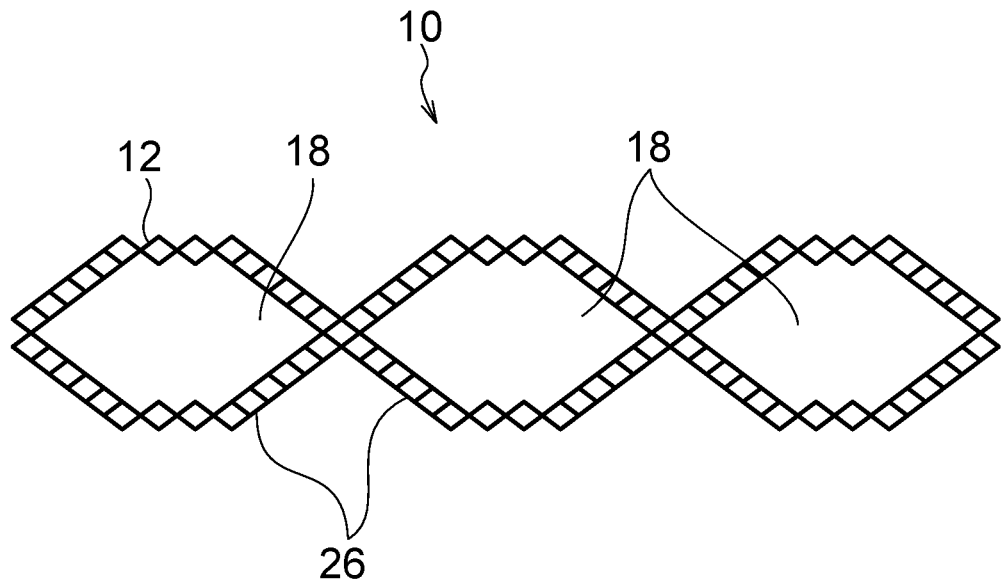
FIG. 15 is a plan view illustrating an example of another first electrode pattern of the second embodiment.

FIG. 15 illustrates the first electrode pattern 10 according to another embodiment. The same configurations as those of the first electrode pattern 10 described above are designated by the same reference numerals or reference characters, and description thereof may be omitted. The first electrode pattern 10 includes the first conductive patterns 12 formed by the large number of grids 26 made of metal thin wires. Each first conductive pattern 12 includes the plurality of sub-nonconduction patterns 18 along the first direction, to thereby have X-shaped structures with cyclical intersections.

In the first conductive pattern 12 illustrated in FIG. 15, each sub-nonconduction pattern 18 is surrounded and defined by six sides. Four of the six sides are formed by linearly arranging the plurality of grids 26 with sides of adjacent ones of the grids 26 being connected to each other. Two of the six sides are formed by linearly arranging the plurality of grids 26 with apex angles of adjacent ones of the grids 26 being connected to each other.

Figure 16:
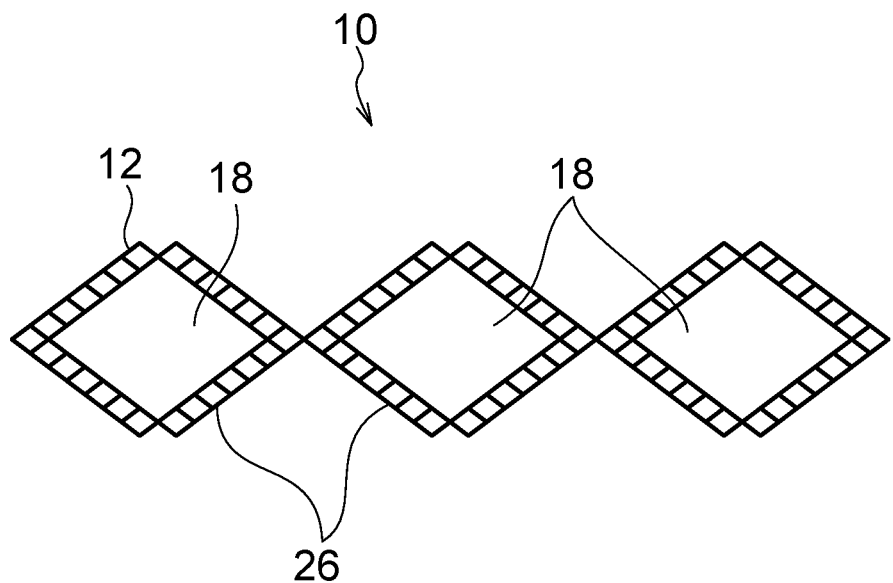
FIG. 16 is a plan view illustrating an example of another first electrode pattern of the second embodiment.

FIG. 16 illustrates the first electrode pattern 10 according to another embodiment. The same configurations as those of the first electrode pattern 10 described above are designated by the same reference numerals or reference characters, and description thereof may be omitted. The first electrode pattern 10 includes the first conductive patterns 12 formed by the large number of grids 26 made of metal thin wires. Each first conductive pattern 12 includes the plurality of sub-nonconduction patterns 18 along the first direction, to thereby have X-shaped structures with cyclical intersections.

The first conductive pattern 12 illustrated in FIG. 16 is the same in the shape of each sub-nonconduction pattern 18 as the first conductive pattern 12 illustrated in FIG. 13. However, unlike FIG. 13, in FIG. 16, adjacent diamond patterns are electrically connected to each other at apex angles of the grids 26, that is, at one point. The shape of each sub-nonconduction pattern 18 is not limited to the diamond pattern.

Figure 17:
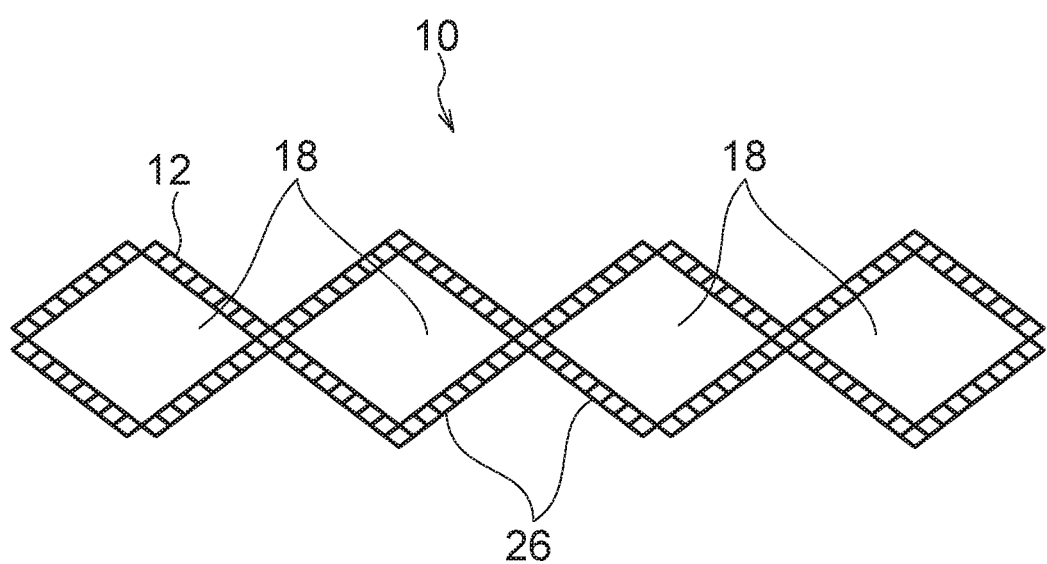
FIG. 17 is a plan view illustrating an example of another first electrode pattern of the second embodiment.

FIG. 17 illustrates the first electrode pattern 10 according to another embodiment. The same configurations as those of the first electrode pattern 10 described above are designated by the same reference numerals or reference characters, and description thereof may be omitted. The first electrode pattern 10 includes the first conductive patterns 12 formed by the large number of grids 26 made of metal thin wires. Each first conductive pattern 12 includes the plurality of sub-nonconduction patterns 18 along the first direction, to thereby have X-shaped structures with cyclical intersections.

In FIG. 17, the shapes of diamond patterns are alternately different, and the sizes of adjacent ones of the sub-nonconduction patterns 18 are different. That is, the same shape appears every two cycles. However, not limited to every two cycles, the same shape may appear every three cycles or every four cycles.

Figure 18:
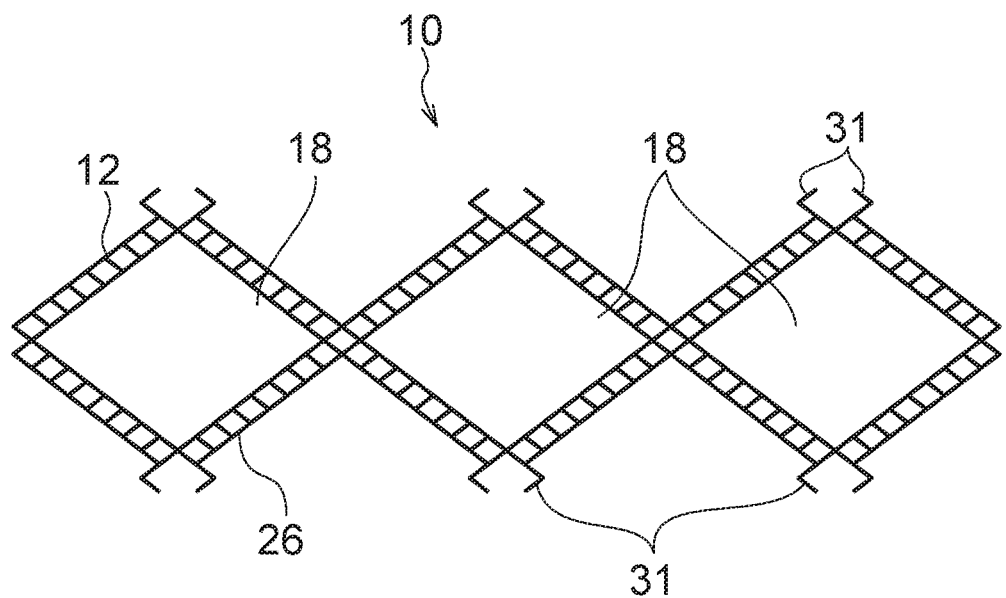
FIG. 18 is a plan view illustrating an example of another first electrode pattern of the second embodiment.

FIG. 18 illustrates the first electrode pattern 10 according to another embodiment. The same configurations as those of the first electrode pattern 10 described above are designated by the same reference numerals or reference characters, and description thereof may be omitted. The first electrode pattern 10 includes the first conductive patterns 12 formed by the large number of grids 26 made of metal thin wires. Each first conductive pattern 12 includes the plurality of sub-nonconduction patterns 18 along the first direction, to thereby have X-shaped structures with cyclical intersections.

The first conductive pattern 12 illustrated in FIG. 18 has basically the same shape as that of the first conductive pattern 12 illustrated in FIG. 13. However, the grid 26 located at each apex angle of a diamond pattern is provided with protruding wires 31 made of metal thin wires.

Figure 19:
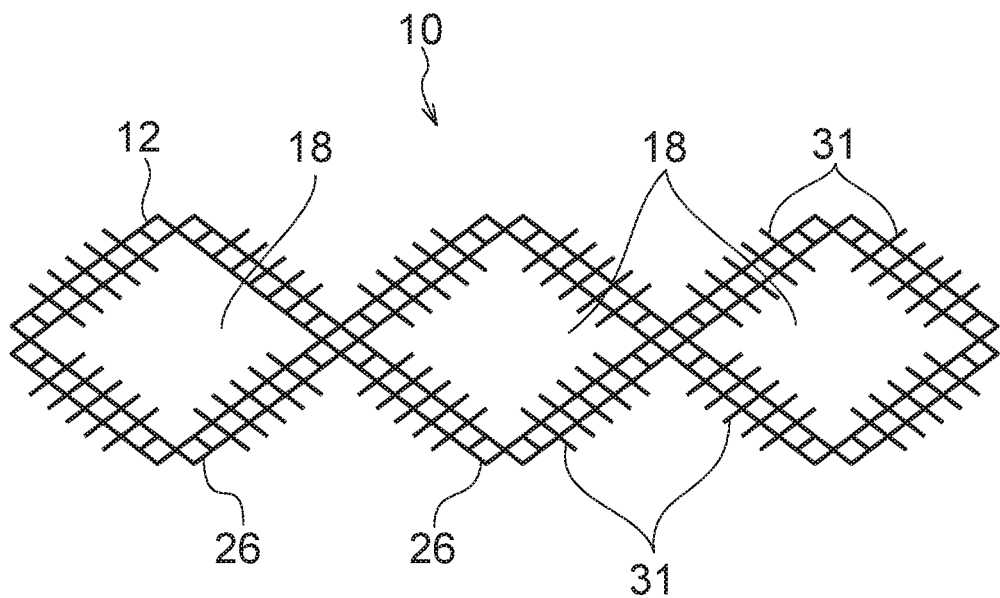
FIG. 19 is a plan view illustrating an example of another first electrode pattern of the second embodiment.

FIG. 19 illustrates the first electrode pattern 10 according to another embodiment. The same configurations as those of the first electrode pattern 10 described above are designated by the same reference numerals or reference characters, and description thereof may be omitted. The first electrode pattern 10 includes the first conductive patterns 12 formed by the large number of grids 26 made of metal thin wires. Each first conductive pattern 12 includes the plurality of sub-nonconduction patterns 18 along the first direction, to thereby have X-shaped structures with cyclical intersections.

The first conductive pattern 12 illustrated in FIG. 19 has basically the same shape as that of the first conductive pattern 12 illustrated in FIG. 13. However, the grids 26 that form each side of a diamond pattern are provided with the protruding wires 31 made of metal thin wires.

The first electrode pattern 10 illustrated in each of FIGS. 18 and 19 is provided with the protruding wires 31, and hence a sensor region for detecting the contact of a finger can be widened.

Figure 20:
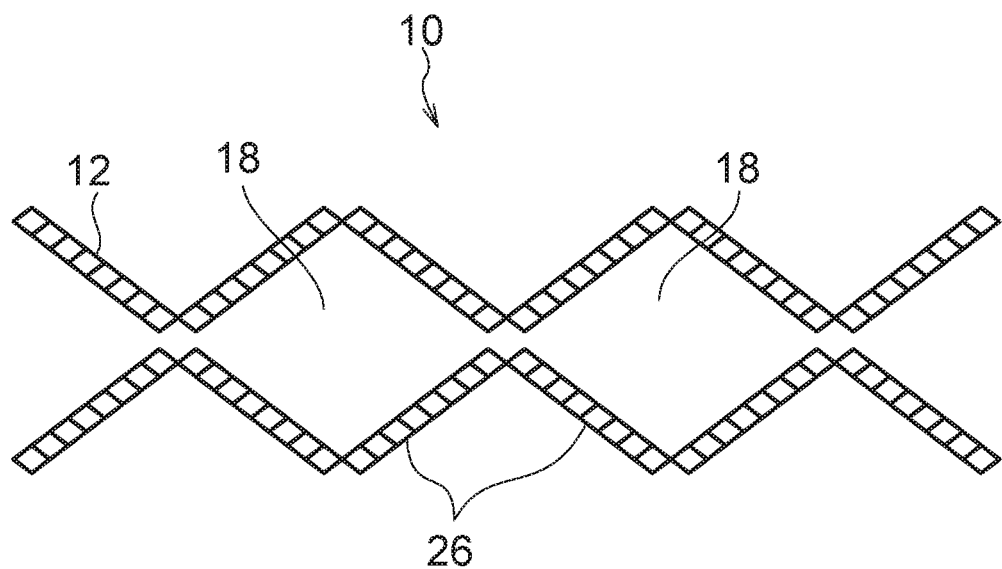
FIG. 20 is a plan view illustrating an example of another first electrode pattern of the second embodiment.

FIG. 20 illustrates the first electrode pattern 10 according to another embodiment. The same configurations as those of the first electrode pattern 10 described above are designated by the same reference numerals or reference characters, and description thereof may be omitted. The first electrode pattern 10 includes the first conductive patterns 12 formed by the large number of grids 26 made of metal thin wires. Each first conductive pattern 12 includes the plurality of sub-nonconduction patterns 18 along the first direction, to thereby have X-shaped structures in which grids 26 are not present at the intersection points. In the first conductive pattern 12 illustrated in FIG. 20, the plurality of grids 26 are arranged in a zigzag manner. Two groups of the grids arranged in the zigzag manner are oppositely placed so as not to contact each other, and hence the X-shaped structures without intersection points are formed. Because the X-shaped structures are formed by the two groups of the grids arranged in the zigzag manner, the electrode pattern can be made thinner, and a contact position of a finger can be finely detected.

Figure 21:
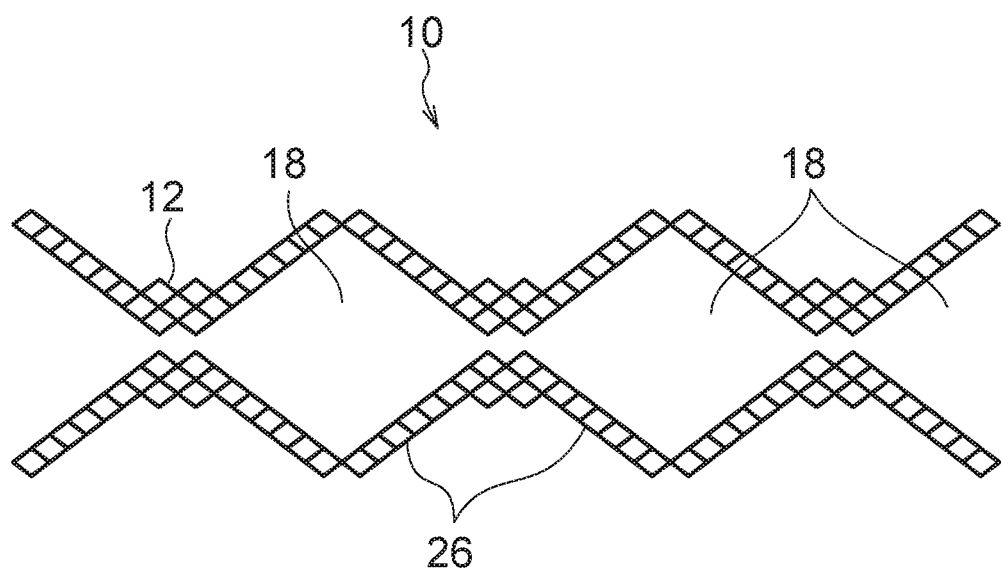
FIG. 21 is a plan view illustrating an example of another first electrode pattern of the second embodiment.

FIG. 21 illustrates the first electrode pattern 10 according to another embodiment. The same configurations as those of the first electrode pattern 10 described above are designated by the same reference numerals or reference characters, and description thereof may be omitted. The first electrode pattern 10 includes the first conductive patterns 12 formed by the large number of grids 26 made of metal thin wires. Each first conductive pattern 12 includes the plurality of sub-nonconduction patterns 18 along the first direction, to thereby have X-shaped structures in which the grids 26 are not present at the intersection points. In the first conductive pattern 12 illustrated in FIG. 21, the plurality of grids 26 are placed in each corner part in which two groups of the grids arranged in a zigzag manner approach each other, unlike the first conductive pattern 12 illustrated in FIG. 20.

Figure 22:
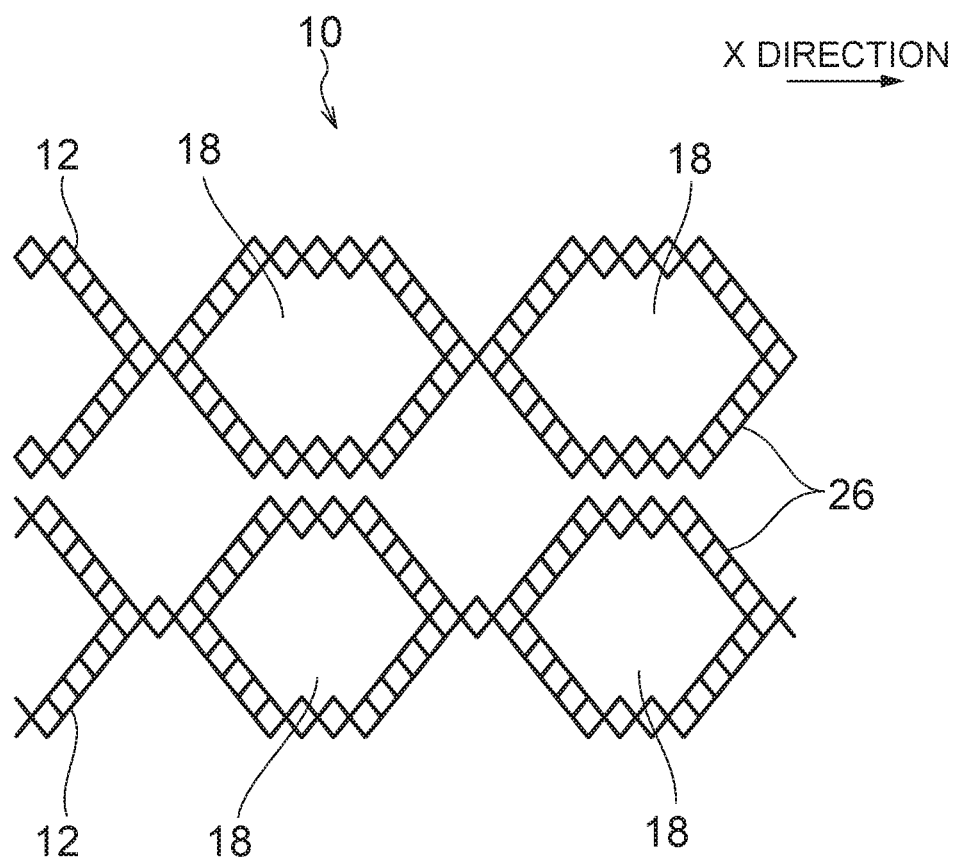
FIG. 22 is a plan view illustrating an example of another first electrode pattern of the second embodiment.

FIG. 22 illustrates the first electrode pattern 10 according to another embodiment. The same configurations as those of the first electrode pattern 10 described above are designated by the same reference numerals or reference characters, and description thereof may be omitted. The first electrode pattern 10 of FIG. 22 includes two first conductive patterns 12 formed by the large number of grids 26 made of metal thin wires. Each first conductive pattern 12 includes the sub-nonconduction patterns 18 along the first direction, to thereby have X-shaped structures with cyclical intersections.

As illustrated in FIG. 22, the upper first conductive pattern 12 includes the sub-nonconduction patterns 18 having the same shape along the first direction (X direction). Moreover, as illustrated in FIG. 22, the lower first conductive pattern 12 includes the sub-nonconduction patterns 18 having the same shape along the first direction. Meanwhile, the shapes of the sub-nonconduction patterns 18 are different between the upper first conductive pattern 12 and the lower first conductive pattern 12. The first conductive patterns 12 having different shapes are alternately arranged. Such arrangement as described above secures the degree of freedom in arrangement of the first electrode pattern 10.

Note that, in the pattern illustrated in each of FIG. 13 to FIG. 22, the area of each first conductive pattern 12 is obtained by calculating the unit area of each grid 26×the number of the grids 26. The area of the sub-nonconduction patterns 18 is obtained by placing virtual grids 26 and calculating the unit area of each virtual grid 26×the number of the grids 26.

Second Electrode Pattern

Figure 23:
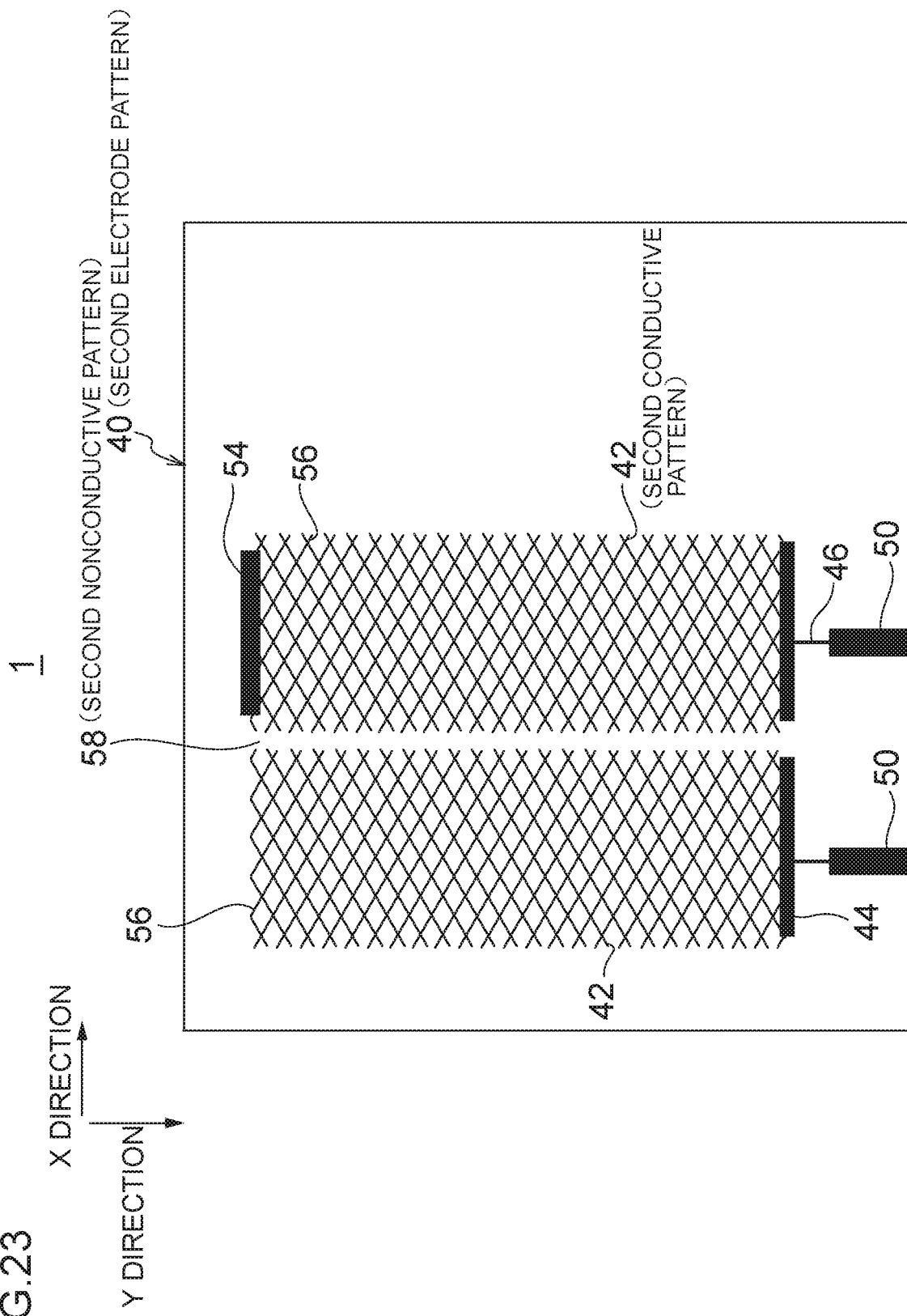
FIG. 23 is a plan view illustrating an example of a second electrode pattern of the present embodiment.

Next, a second electrode pattern is described with reference to the drawings. As illustrated in FIG. 23, a second electrode pattern 40 is formed by a large number of grids made of metal thin wires. The second electrode pattern 40 includes a plurality of second conductive patterns 42 that extend in a second direction (Y direction) orthogonal to the first direction (X direction) and are arranged in parallel. Each second conductive pattern 42 is electrically separated by a second nonconductive pattern 58.

Note that, in the case where the conductive sheet 1 is used as a transparent conductive film placed on the front side of a display that is required to have visibility, a dummy pattern that includes break parts to be described later and is made of metal wires is formed as the second nonconductive pattern 58. On the other hand, in the case where the conductive sheet 1 is used as a transparent conductive film placed on the front side of a notebook computer, a touch pad, or the like that is not particularly required to have visibility, a dummy pattern made of metal thin wires is not formed as the second nonconductive pattern 58, and the second nonconductive pattern 58 exists as a space (blank).

Each second conductive pattern 42 is electrically connected to a second electrode terminal 44. Each second electrode terminal 44 is electrically connected to a second wire 46 having conductive properties. Each second conductive pattern 42 has one end electrically connected to the second electrode terminal 44. Each second electrode terminal 44 is electrically connected to one end of each second wire 46. Each second wire 46 has another end electrically connected to a terminal 50. Each second conductive pattern 42 has a strip-shaped structure having a substantially constant width along the second direction. However, each second conductive pattern 42 is not limited to the strip shape.

The second electrode pattern 40 may be provided with an additional second electrode terminal 54 at another end thereof. If the additional second electrode terminal 54 is provided, each second conductive pattern 42 can be easily checked.

FIG. 23 illustrates one conductive sheet 1 in which the second conductive pattern 42 not including the additional second electrode terminal 54 and the second conductive pattern 42 including the additional second electrode terminal 54 are formed on the same plane. However, such two types of the second conductive patterns 42 do not necessarily need to be mixedly formed, and only one of the two types of the second conductive patterns 42 may be formed.

The metal thin wires that form the second electrode pattern 40 have substantially the same wire width and are made of substantially the same material as the metal thin wires that form the first electrode pattern 10. The second electrode pattern 40 includes a plurality of grids 56 made of metal thin wires that intersect with each other, and each grid 56 has substantially the same shape as that of each grid 26. The length of one side of each grid 56 and the opening ratio of each grid 56 are equivalent to those of each grid 26.

<<Combination Pattern>>

Figure 24:
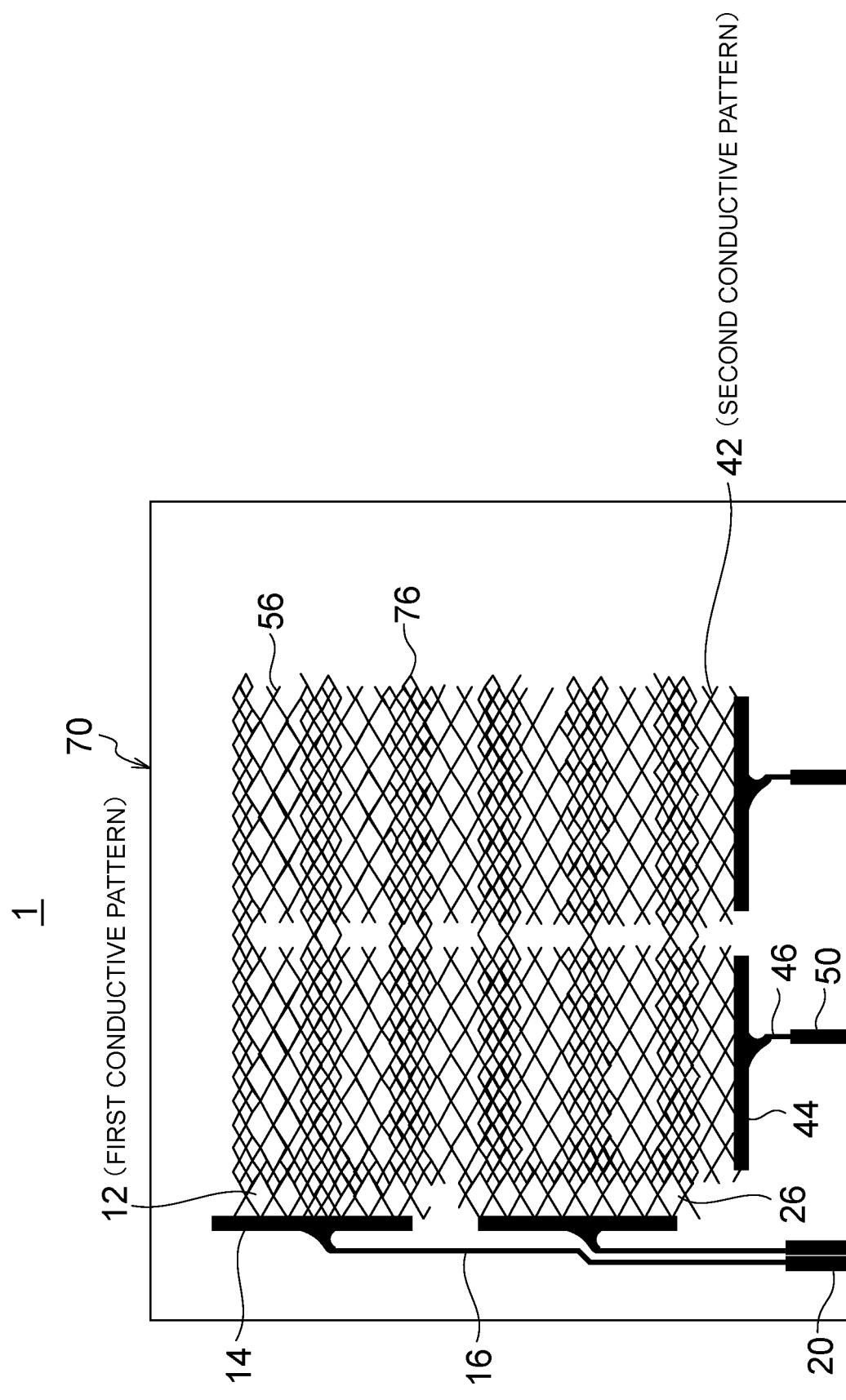
FIG. 24 is a plan view illustrating an example of a conductive sheet for a touch panel in which the first electrode pattern and the second electrode pattern are combined with each other.

FIG. 24 is a plan view of the conductive sheet 1 in which the first electrode pattern 10 including the first conductive patterns 12 each having the comb-shaped structure and the second electrode pattern 40 including the second conductive patterns 42 each having the strip-shaped structure are oppositely placed. The first conductive patterns 12 and the second conductive patterns 42 are orthogonal to each other, and the first electrode pattern 10 and the second electrode pattern 40 form a combination pattern 70.

In this combination pattern, the first electrode pattern 10 not including a dummy pattern and the second electrode pattern 40 not including a dummy pattern are combined with each other.

In the combination pattern 70, the grids 26 and the grids 56 form small grids 76 in top view. That is, the intersection parts of the grids 26 are respectively placed in substantially the centers of the opening regions of the grids 56. Note that each small grid 76 has one side having a length of 125 μm or more and 450 μm or less, and preferably has one side having a length of 150 μm or more and 350 μm or less. This corresponds to half the length of one side of each of the grids 26 and the grids 56.

Figure 25:
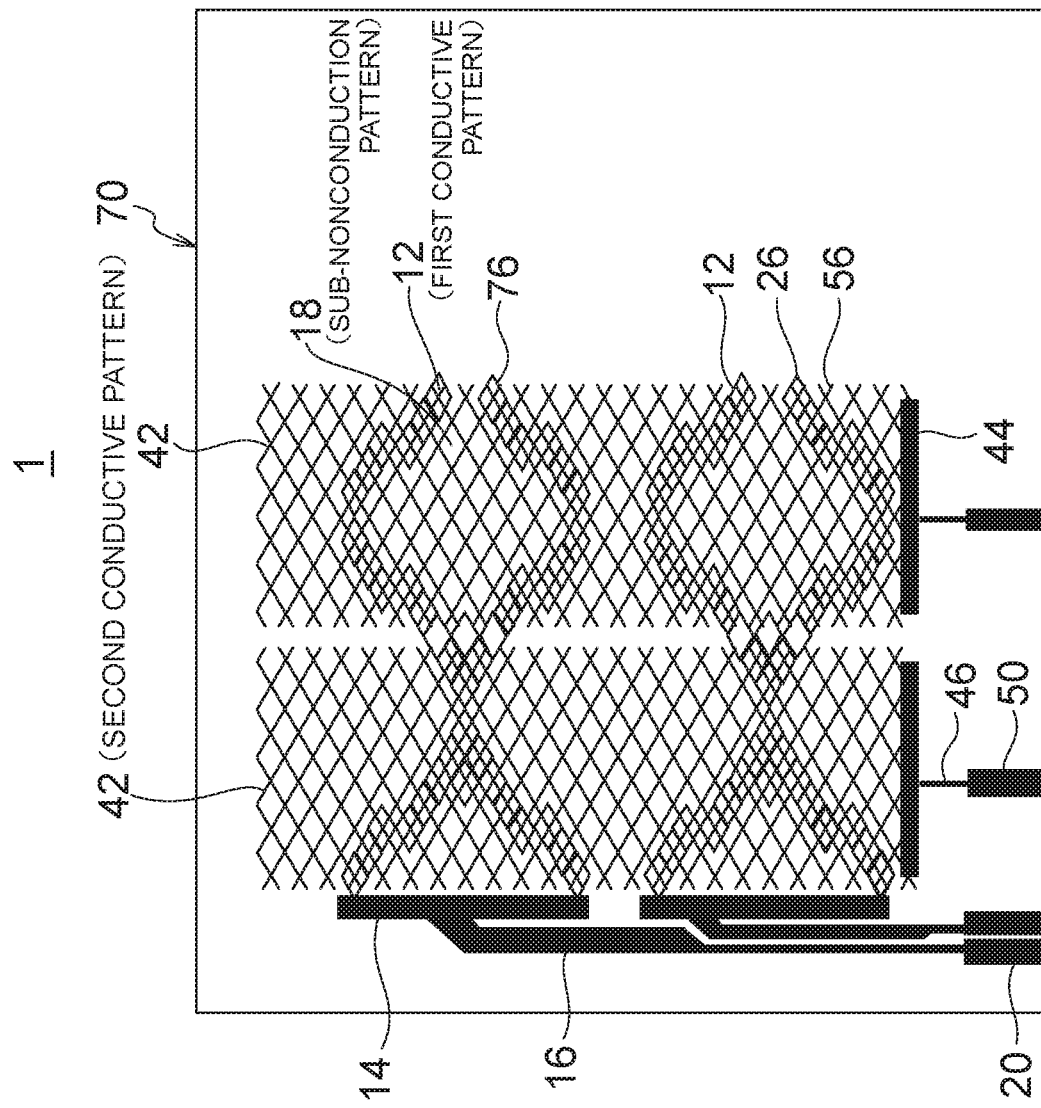
FIG. 25 is a plan view illustrating an example of another conductive sheet for a touch panel in which the first electrode pattern and the second electrode pattern are combined with each other.

FIG. 25 is a plan view of the conductive sheet 1 in which the first electrode pattern 10 including the first conductive patterns 12 each having the X-shaped structures and the second electrode pattern 40 including the second conductive patterns 42 each having the strip-shaped structure are oppositely placed. The first conductive patterns 12 and the second conductive patterns 42 are orthogonal to each other, and the first electrode pattern 10 and the second electrode pattern 40 form the combination pattern 70. In the combination pattern 70, the grids 26 and the grids 56 form the small grids 76, similarly to the first embodiment.

<<Dummy Pattern>>

Figure 26:
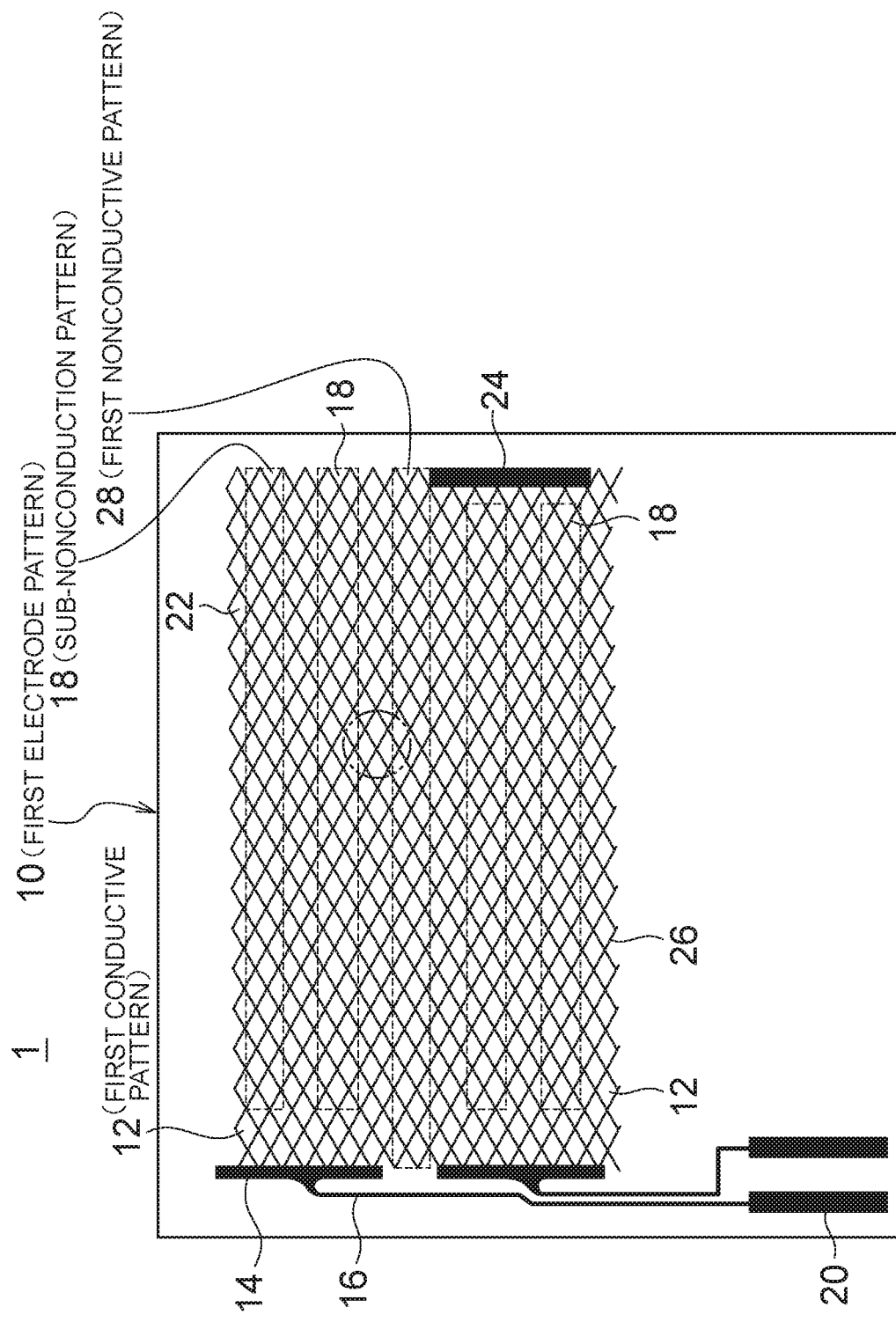
FIG. 26 is a plan view illustrating an example of the first electrode pattern of the first embodiment, including dummy patterns.

FIG. 26 is a plan view illustrating an example of the first electrode pattern 10 of the first embodiment, in which dummy patterns are explicitly illustrated. The first nonconductive pattern 28 is made of metal thin wires similarly to the first conductive patterns 12, and includes the break parts. Moreover, the sub-nonconduction patterns 18 formed in each first conductive pattern 12 are made of metal thin wires similarly to the first conductive patterns 12, and include the break parts. The sub-nonconduction patterns 18 and the first nonconductive pattern 28 are made of metal thin wires including the break parts, and thus are each formed as a so-called dummy pattern electrically separated from the first conductive patterns 12. If the dummy patterns are formed, the first electrode pattern 10 is formed by the grids of the metal thin wires placed at regular intervals. This can prevent a decrease in visibility. Note that, in FIG. 26, the dummy patterns are portions surrounded by broken lines, and are at positions respectively corresponding to the sub-nonconduction patterns 18 and the first nonconductive pattern 28.

Figure 27:
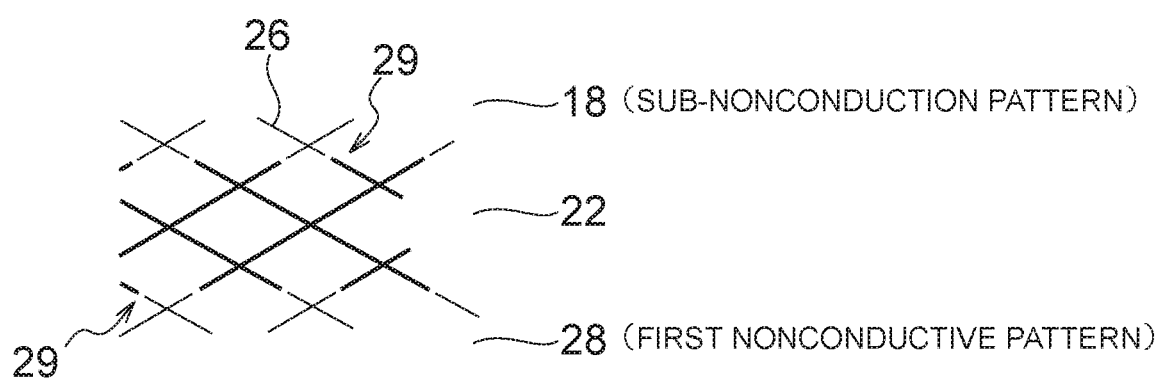
FIG. 27 is a partial enlarged view of the dummy pattern.

FIG. 27 is an enlarged view of a portion surrounded by a circle in FIG. 26. As illustrated in FIG. 27, the metal thin wires that form the first nonconductive pattern 28 and the sub-nonconduction pattern 18 include break parts 29, and are electrically separated from the first conductive pattern 12. It is preferable that each break part 29 be formed in a portion other than each intersection part of the metal thin wires.

In FIG. 27, in order to clarify the first conductive pattern 12, the first nonconductive pattern 28, and the sub-nonconduction pattern 18, the wire width of the first conductive pattern 12 is exaggeratingly thickened, and the wire widths of the first nonconductive pattern 28 and the sub-nonconduction pattern 18 are exaggeratingly thinned.

All the grids 26 that form the first nonconductive pattern 28 and the sub-nonconduction pattern 18 do not necessarily need to include the break parts 29. The length of each break part 29 is preferably 60 μm or less, and is more preferably 10 to 50 μm, 15 to 40 μm, and 20 to 40 μm. Such dummy patterns can be formed in the first electrode pattern 10 of the first embodiment illustrated in FIG. 5 to FIG. 11.

Figure 28:
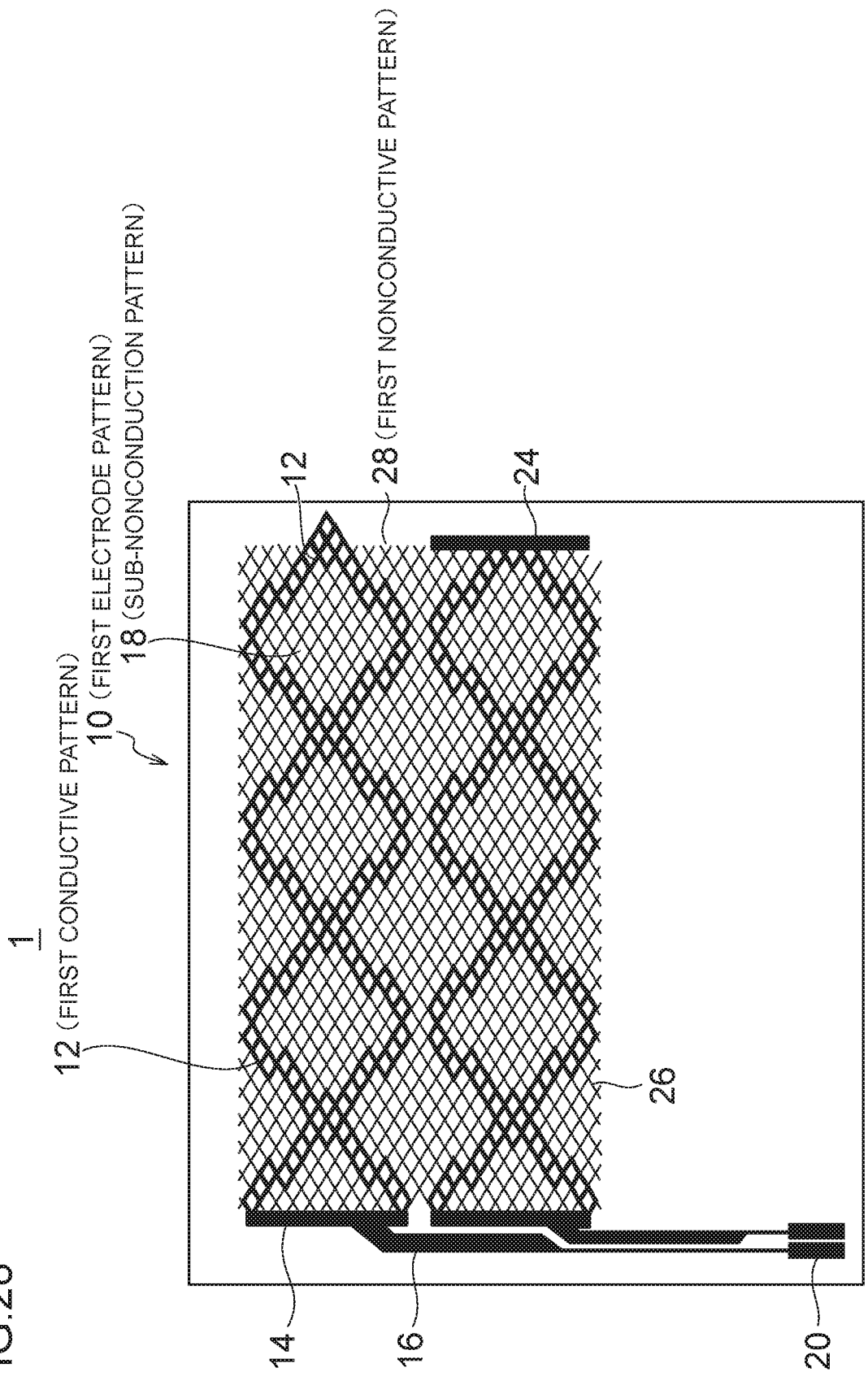
FIG. 28 is a plan view illustrating an example of the first electrode pattern of the second embodiment, including dummy patterns.

FIG. 28 is a plan view illustrating an example of the first electrode pattern 10 of the second embodiment including dummy patterns. The first nonconductive pattern 28 is made of metal thin wires similarly to the first conductive patterns 12. Moreover, the sub-nonconduction patterns 18 formed in each first conductive pattern 12 are made of metal thin wires similarly to the first conductive patterns 12. The sub-nonconduction patterns 18 and the first nonconductive pattern 28 are made of metal thin wires, and thus are each formed as a so-called dummy pattern electrically separated from the first conductive patterns 12. In FIG. 28, the dummy patterns are portions surrounded by thick solid lines, and are at positions respectively corresponding to the sub-nonconduction patterns 18 and the first nonconductive pattern 28. If the dummy patterns are formed, the first electrode pattern 10 is formed by the grids of the metal thin wires placed at regular intervals. This can prevent a decrease in visibility.

Also in FIG. 28, the metal thin wires that form the dummy patterns as the first nonconductive pattern 28 and the sub-nonconduction patterns 18 include the break parts, and are electrically separated from the first conductive pattern 12. It is preferable that each break part be formed in a portion other than each intersection part of the metal thin wires. Such dummy patterns can be formed in the first electrode pattern 10 of the second embodiment illustrated in FIG. 12 to FIG. 22.

Figure 29:
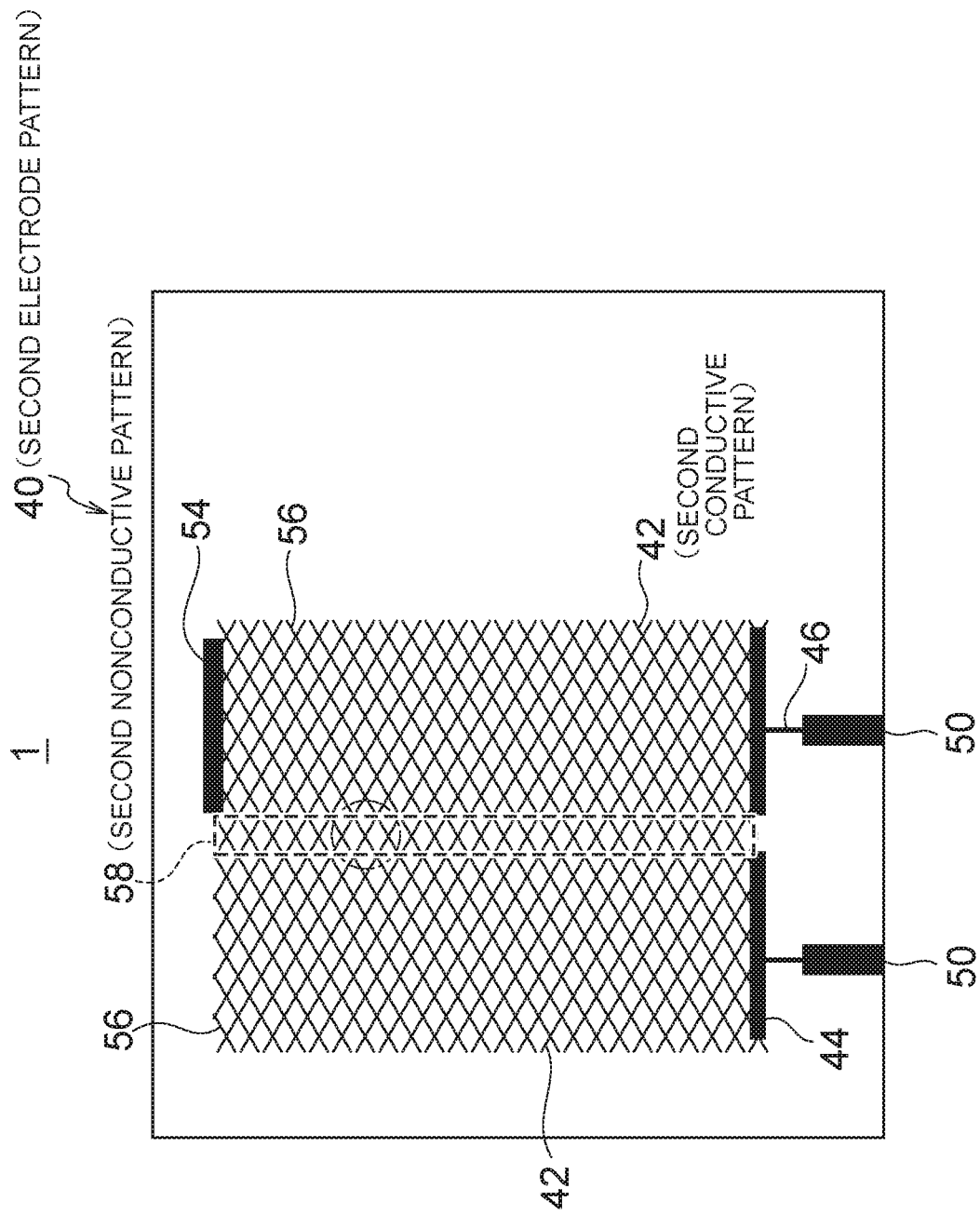
FIG. 29 is a plan view illustrating an example of the second electrode pattern including a dummy pattern.

FIG. 29 is a plan view illustrating an example of the second electrode pattern 40 including a dummy pattern. The second nonconductive pattern 58 is made of metal thin wires similarly to the second conductive patterns 42, and includes the break parts. The second nonconductive pattern 58 is made of metal thin wires, and thus is formed as a so-called dummy pattern electrically separated from the second conductive patterns 42. In FIG. 29, the dummy pattern is a portion surrounded by a broken line, and is at a position corresponding to the second nonconductive pattern 58. If the dummy pattern is formed, the second electrode pattern 40 is formed by the grids of the metal thin wires placed at regular intervals. This can prevent a decrease in visibility.

Figure 30:
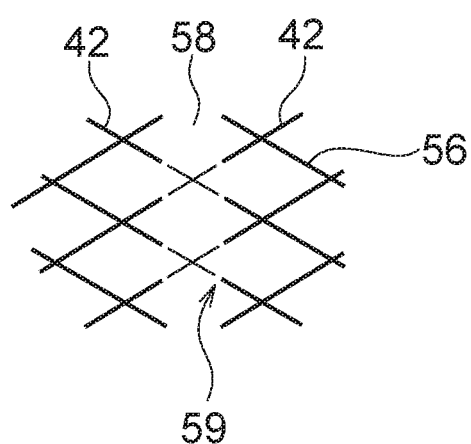
FIG. 30 is a partial enlarged view of the dummy pattern.

FIG. 30 is an enlarged view of a portion surrounded by a circle in FIG. 29. As illustrated in FIG. 30, the metal thin wires that form the second nonconductive pattern 58 include break parts 59, and are electrically separated from the second conductive patterns 42. It is preferable that each break part 59 be formed at a portion other than each intersection part of the metal thin wires.

In FIG. 30, in order to clarify the second conductive patterns 42 and the second nonconductive pattern 58, the wire widths of the second conductive patterns 42 are exaggeratingly thickened, and the wire width of the second nonconductive pattern 58 is exaggeratingly thinned. Note that the length of each break part 59 is substantially the same as that of each break part 29 in FIG. 27.

Figure 31:
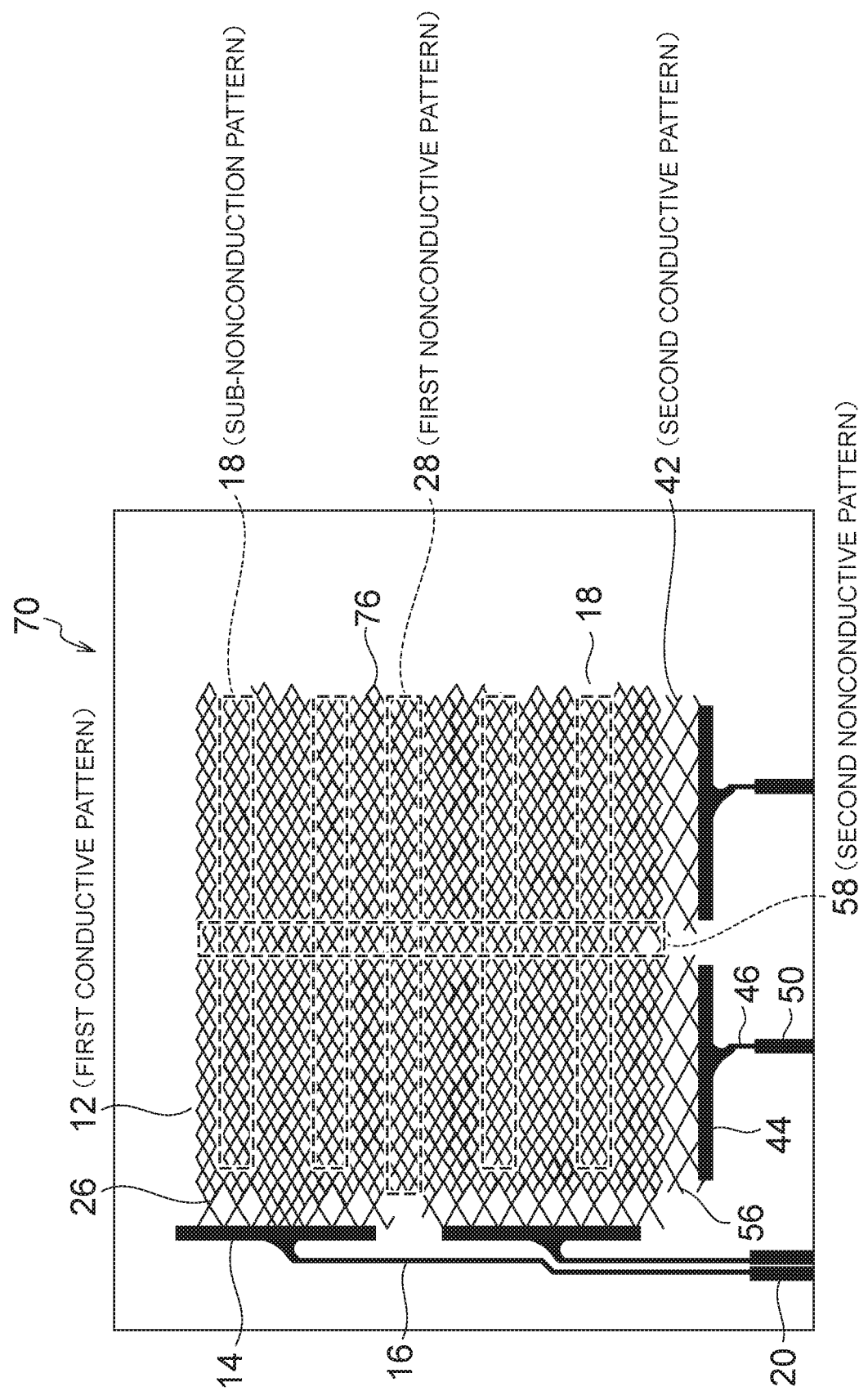
FIG. 31 is a plan view illustrating an example of another conductive sheet for a touch panel in which the first electrode pattern and the second electrode pattern are combined with each other.

FIG. 31 explicitly illustrates the first nonconductive pattern 28 and the first conductive patterns 12 that are made of metal thin wires. Moreover, the break parts are provided between the first conductive patterns 12, and the sub-nonconduction patterns 18 formed as dummy patterns made of metal thin wires are explicitly illustrated. In FIG. 31, the dummy patterns are portions surrounded by broken lines, and are at positions respectively corresponding to the first nonconductive pattern 28, the sub-nonconduction patterns 18 and the second nonconductive pattern 58. If the dummy patterns are formed, the first electrode pattern 10 is formed by the grids of the metal thin wires placed at regular intervals. This can prevent a decrease in visibility. This is particularly effective in the case where the conductive sheet 1 is placed on the front side of a display or the like that is required to have visibility.

Similarly, the second nonconductive pattern 58 is made of metal thin wires similarly to the second conductive patterns 42. The second nonconductive pattern 58 is made of metal thin wires, and thus is formed as a so-called dummy pattern electrically separated from the second conductive patterns 42. If the dummy pattern is formed, the second electrode pattern 40 is formed by the grids of the metal thin wires placed at regular intervals. This can prevent a decrease in visibility. The dummy pattern made of the metal thin wires includes the break parts, and is electrically separated from the first conductive patterns 12 and the second conductive patterns 42.

Figure 32:
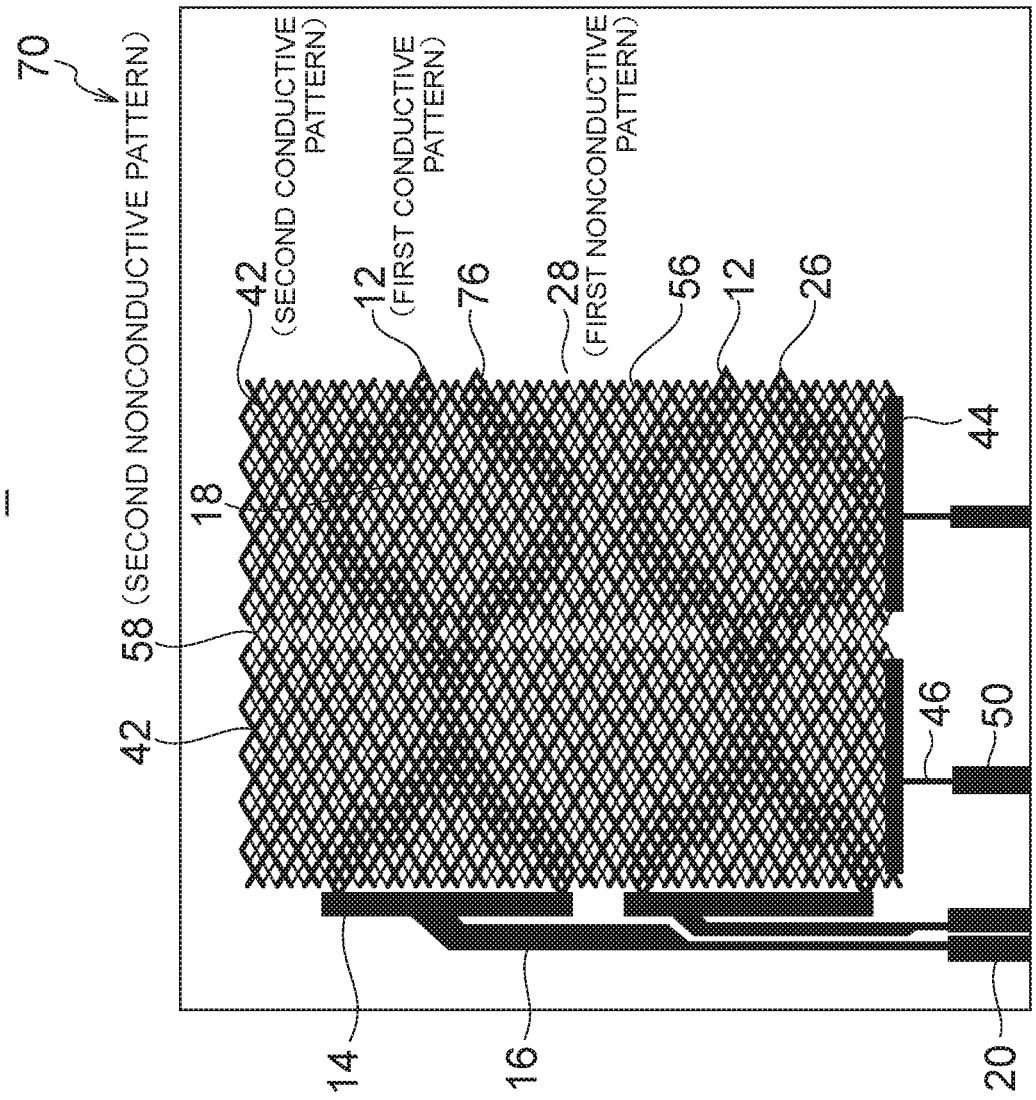
FIG. 32 is a plan view illustrating an example of still another conductive sheet for a touch panel in which the first electrode pattern and the second electrode pattern are combined with each other.

FIG. 32 is a plan view of the conductive sheet 1 in which the first electrode pattern 10 including dummy patterns and the second electrode pattern 40 including a dummy pattern are placed such that the first conductive patterns 12 and the second conductive patterns 42 are orthogonal to each other. Each first conductive pattern 12 includes the sub-nonconduction patterns 18 along the first direction at predetermined intervals, to thereby have X-shaped structures with cyclical intersections. The first electrode pattern 10 and the second electrode pattern 40 form the combination pattern 70. The first nonconductive pattern 28, the sub-nonconduction patterns 18, and the second nonconductive pattern 58 are made of metal thin wires. In FIG. 32, the dummy patterns are portions surrounded by thick solid lines, and are at positions respectively corresponding to the first nonconductive pattern 28, the sub-nonconduction patterns 18, and the second nonconductive pattern 58. If the dummy patterns are formed, the first electrode pattern 10 is formed by the grids of the metal thin wires placed at regular intervals. This can prevent a decrease in visibility.

Next, a method of manufacturing the conductive sheet 1 is described.

In the case of manufacturing the conductive sheet 1, for example, a photosensitive material having an emulsion layer containing photosensitive silver halide is exposed to light and developed on the first main surface of the transparent substrate 30, and a metal silver part (metal thin wires) and a light transmissive part (opening regions) are respectively formed in the exposed part and the unexposed part, whereby the first electrode pattern 10 may be formed. Note that the metal silver part is further physically developed and/or plated, whereby the metal silver part may be caused to support conductive metal.

Alternatively, a resist pattern is formed by exposing to light and developing a photoresist film on copper foil formed on the first main surface of the transparent substrate 30, and the copper foil exposed on the resist pattern is etched, whereby the first electrode pattern 10 may be formed.

Alternatively, a paste containing metal fine grains is printed on the first main surface of the transparent substrate 30, and the paste is plated with metal, whereby the first electrode pattern 10 may be formed.

The first electrode pattern 10 may be formed by printing on the first main surface of the transparent substrate 30, using a screen printing plate or a gravure printing plate. Alternatively, the first electrode pattern 10 may be formed on the first main surface of the transparent substrate 30, according to an inkjet process.

The second electrode pattern 40 can be formed on the second main surface of the substrate 30, according to a manufacturing method similar to that for the first electrode pattern 10.

The first electrode pattern 10 and the second electrode pattern 40 may be formed by: forming a photosensitive layer to be plated on the transparent substrate 30 using a plating preprocessing material; exposing the formed layer to light to develop it; and plating the layer so as to form a metal part and a light transmissive part respectively in the exposed part and the unexposed part. Note that the metal part may be further physically developed and/or plated so that the metal part can be caused to support conductive metal. Note that more specific contents thereof are described in, for example, Japanese Patent Application Laid-Open No. 2003-213437, No. 2006-64923. No. 2006-58797, and No. 2006-135271.

In a case as illustrated in FIG. 2 where the first electrode pattern 10 is formed on the first main surface of the substrate 30 and where the second electrode pattern 40 is formed on the second main surface of the substrate 30, if a standard manufacturing method (in which the first main surface is first exposed to light, and the second main surface is then exposed to light) is adopted, the first electrode pattern 10 and the second electrode pattern 40 having desired patterns cannot be obtained in some cases.

In view of the above, the following manufacturing method can be preferably adopted.

That is, photosensitive silver halide emulsion layers respectively formed on both the surfaces of the substrate 30 are collectively exposed to light, whereby the first electrode pattern 10 is formed on one main surface of the substrate 30 while the second electrode pattern 40 is formed on another main surface of the substrate 30.

A specific example of the method of manufacturing the conductive sheet according to aspects illustrated in FIGS. 1 to 33 is described.

First, an elongated photosensitive material is manufactured. The photosensitive material includes: the substrate 30; a photosensitive silver halide emulsion layer (hereinafter, referred to as first photosensitive layer) formed on the first main surface of the substrate 30; and a photosensitive silver halide emulsion layer (hereinafter, referred to as second photosensitive layer) formed on another main surface of the substrate 30.

Subsequently, the photosensitive material is exposed to light. This exposure process includes: a first exposure process performed on the first photosensitive layer, in which the substrate 30 is irradiated with light so that and the first photosensitive layer is exposed to the light along a first exposure pattern; and a second exposure process performed on the second photosensitive layer, in which the substrate 30 is irradiated with light so that the second photosensitive layer is exposed to the light along a second exposure pattern (both-surfaces simultaneous exposure).

For example, in the state where the elongated photosensitive material is transported in one direction, the first photosensitive layer is irradiated with first light (parallel light) with the intermediation of a first photomask, while the second photosensitive layer is irradiated with second light (parallel light) with the intermediation of a second photomask. The first light is obtained by converting, into parallel light, light emitted from a first light source by means of a halfway first collimator lens. The second light is obtained by converting, into parallel light, light emitted from a second light source by means of a halfway second collimator lens.

Although description is given above of the case where the two light sources (the first light source and the second light source) are used, light emitted from one light source may be split by an optical system into the first light and the second light, and the first photosensitive layer and the second photosensitive layer may be irradiated with the first light and the second light.

Subsequently, the photosensitive material after the exposure to light is developed, whereby the conductive sheet 1 for the touch panel is manufactured. The conductive sheet 1 for the touch panel includes: the substrate 30; the first electrode pattern 10 that is formed along the first exposure pattern on the first main surface of the substrate 30; and the second electrode pattern 40 that is formed along the second exposure pattern on another main surface of the substrate 30. Note that the exposure time and the development time of the first photosensitive layer and the second photosensitive layer may variously change depending on the types of the first light source and the second light source, the type of a developing solution, and the like. Hence preferable numerical value ranges therefor cannot be unconditionally determined, but the exposure time and the development time are adjusted such that the development rate is 100%.

Then, according to the manufacturing method of the present embodiment, in the first exposure process, the first photomask is, for example, closely placed on the first photosensitive layer, and is irradiated with the first light emitted from the first light source that is placed so as to be opposed to the first photomask, whereby the first photosensitive layer is exposed to light. The first photomask includes a glass substrate made of transparent soda glass and a mask pattern (first exposure pattern) formed on the glass substrate. Accordingly, in the first exposure process, a portion of the first photosensitive layer is exposed to light, the portion being along the first exposure pattern formed on the first photomask. A gap of approximately 2 to 10 μm may be provided between the first photosensitive layer and the first photomask.

Similarly, in the second exposure process, the second photomask is, for example, closely placed on the second photosensitive layer, and is irradiated with the second light emitted from the second light source that is placed so as to be opposed to the second photomask, whereby the second photosensitive layer is exposed to light. Similarly to the first photomask, the second photomask includes a glass substrate made of transparent soda glass and a mask pattern (second exposure pattern) formed on the glass substrate. Accordingly, in the second exposure process, a portion of the second photosensitive layer is exposed to light, the portion being along the second exposure pattern formed on the second photomask. In this case, a gap of approximately 2 to 10 μm may be provided between the second photosensitive layer and the second photomask.

In the first exposure process and the second exposure process, the emission timing of the first light from the first light source and the emission timing of the second light from the second light source may be the same as each other, and may be different from each other. If the emission timings thereof are the same as each other, the first photosensitive layer and the second photosensitive layer can be simultaneously exposed to light in one exposure process, and the processing time can be shortened. Meanwhile, in the case where both the first photosensitive layer and the second photosensitive layer are not spectrally sensitized, if the photosensitive material is exposed to light on both the sides thereof, the exposure to light on one side influences image formation on the other side (rear side).

That is, the first light from the first light source that has reached the first photosensitive layer is scattered by silver halide grains contained in the first photosensitive layer, and is transmitted as scattered light through the substrate 30, and part of the scattered light reaches even the second photosensitive layer. Consequently, a boundary portion between the second photosensitive layer and the substrate 30 is exposed to light over a wide range, so that a latent image is formed. Hence, the second photosensitive layer is exposed to both the second light from the second light source and the first light from the first light source. In the case of manufacturing the conductive sheet 1 for the touch panel in the subsequent development process, a thin conductive layer substrated on the first light from the first light source is formed between the conductive patterns in addition to the conductive pattern (second electrode pattern 40) along the second exposure pattern, and a desired pattern (a pattern along the second exposure pattern) cannot be obtained. The same applies to the first photosensitive layer.

As a result of intensive studies for avoiding this, the following is found out. That is, if the thickness of each of the first photosensitive layer and the second photosensitive layer is set within a particular range or if the amount of silver applied to each of the first photosensitive layer and the second photosensitive layer is specified, silver halide itself absorbs light, and this can restrict light transmission to the rear surface. The thickness of each of the first photosensitive layer and the second photosensitive layer can be set to 1 μm or more and 4 μm or less. The upper limit value thereof is preferably 2.5 μm. Moreover, the amount of silver applied to each of the first photosensitive layer and the second photosensitive layer is specified to 5 to 20 g/m$^2$.

In the above-mentioned exposure method of both-surfaces close contact type, an image defect due to a hindrance to exposure by dust and the like attached to the sheet surface is problematic. In order to prevent such dust attachment, it is known to apply a conductive substance to the sheet, but metal oxides and the like remain even after the process to impair the transparency of a final product, and conductive polymers have a problem in preserving properties. As a result of intensive studies in view of the above, it is found out that conductive properties necessary for prevention of static charge can be obtained by silver halide with a reduced binder, and hence the volume ratio of silver/binder of the first photosensitive layer and the second photosensitive layer is specified. That is, the volume ratio of silver/binder of each of the first photosensitive layer and the second photosensitive layer is 1/1 or more, and is preferably 2/1 or more.

If the thickness, the amount of applied silver, and the volume ratio of silver/binder of each of the first photosensitive layer and the second photosensitive layer are set and specified as described above, the first light from the first light source that has reached the first photosensitive layer does not reach the second photosensitive layer. Similarly, the second light from the second light source that has reached the second photosensitive layer does not reach the first photosensitive layer. As a result, in the case of manufacturing the conductive sheet 1 in the subsequent development process, only the first electrode pattern 10 along the first exposure pattern is formed on the first main surface of the substrate 30, and only the second electrode pattern 40 along the second exposure pattern is formed on the second main surface of the substrate 30, so that desired patterns can be obtained.

In this way, according to the above-mentioned manufacturing method using both-surfaces collective exposure, the first photosensitive layer and the second photosensitive layer having both conductive properties and suitability for the both-surfaces exposure can be obtained. Moreover, the same pattern or different patterns can be arbitrarily formed on both the surfaces of the substrate 30 in one exposure process on the substrate 30. This can facilitate formation of the electrodes of the touch panel, and can achieve a reduction in thickness (a reduction in height) of the touch panel.

Next, focused description is given of a method of using a silver halide photographic photosensitive material corresponding to a particularly preferable aspect, for the conductive sheet 1 according to the present embodiment.

The method of manufacturing the conductive sheet 1 according to the present embodiment includes the following three aspects depending on modes of the photosensitive material and the development process.

(1) An aspect in which: a silver halide black-and-white photosensitive material not including the center of physical development is chemically developed or thermally developed; and a metal silver part is formed on the photosensitive material.

(2) An aspect in which: a silver halide black-and-white photosensitive material including the center of physical development in a silver halide emulsion layer is dissolved and physically developed; and a metal silver part is formed on the photosensitive material.

(3) An aspect in which: a silver halide black-and-white photosensitive material not including the center of physical development and an image receiving sheet having a non-photosensitive layer including the center of physical development are put on top of each other (overlaid) and then subjected to diffusion transfer development; and a metal silver part is formed on the non-photosensitive image receiving sheet.

According to the aspect in (1), which is of integrated black-and-white development type, a translucent conductive film such as a light-transmissive conductive film is formed on the photosensitive material. The obtained developed silver is chemically developed silver or thermally developed silver, and is highly active in the subsequent plating or physical development process, because the obtained developed silver is a filament having a high-specific surface.

According to the aspect in (2), in the exposed part, silver halide grains near the center of physical development are dissolved and deposited on the center of development, whereby a translucent conductive film such as a light-transmissive conductive film is formed on the photosensitive material. This aspect is also of integrated black-and-white development type. Because the development action is deposition on the center of physical development, high activity is obtained, and the developed silver has a spherical shape with a small-specific surface.

According to the aspect in (3), in the unexposed part, silver halide grains are dissolved and diffused to be deposited on the center of development on the image receiving sheet, whereby a translucent conductive film such as a light-transmissive conductive film is formed on the image receiving sheet. This aspect is of so-called separate type, in which the image receiving sheet is separated for use from the photosensitive material.

In any one of these aspects, both a negative development process and a reversal development process can be selected (in the case of a diffusion transfer method, the use of an auto-positive photosensitive material as the photosensitive material enables the negative development process).

Here, a configuration of the conductive sheet 1 according to the present embodiment is described below in detail.

[Substrate 30]

The substrate 30 can be formed using a plastic film, a plastic plate, a glass plate, and the like. Examples of the raw materials of the plastic film and the plastic plate include: polyesters such as polyethylene terephthalate (PET) and polyethylene naphthalate (PEN); polyolefins such as polyethylene (PE), polypropylene (PP), polystyrene, and ethylene vinyl acetate (EVA)/cycloolefin polymer (COP)/cycloolefin copolymer (COC); vinyl resins; polycarbonate (PC); polyamide; polyimide; acrylic resins; and triacetylcellulose (TAC). In particular, polyethylene terephthalate (PET) is preferable from the perspective of the light transmissivity, the workability, and the like.

[Silver Salt Emulsion Layer]

A silver salt emulsion layer that becomes each of the first electrode pattern 10 and the second electrode pattern 40 of the conductive sheet 1 contains additives such as a solvent and a colorant in addition to a silver salt and a binder.

Examples of the silver salt used in the present embodiment include inorganic silver salts such as silver halide and organic silver salts such as silver acetate. In the present embodiment, it is preferable to use silver halide excellent in characteristics as an optical sensor.

The amount of silver (the amount of silver salt) applied to the silver salt emulsion layer is preferably 1 to 30 g/m$^2$, more preferably 1 to 25 g/m$^2$, and further preferably 5 to 20 g/m$^2$, in terms of silver. If the amount of applied silver is set within this range, a desired surface resistance can be obtained in the case of manufacturing the conductive sheet 1 for the touch panel.

Examples of the binder used in the present embodiment include gelatin, polyvinyl alcohol (PVA), polyvinylpyrrolidone (PVP), polysaccharides such as starch, cellulose and derivatives thereof, polyethylene oxide, polyvinylamine, chitosan, polylysine, polyacrylic acid, polyalginic acid, polyhyaluronic acid, and carboxycellulose. These substances each exhibit a neutral, anionic, or cationic property depending on the ionicity of a functional group thereof.

The content of the binder in the silver salt emulsion layer is not particularly limited, and can be determined as appropriate within a range in which the dispersibility and the adhesiveness can be obtained. The content of the binder in the silver salt emulsion layer is preferably 1/4 or more, and more preferably 1/2 or more, in terms of the volume ratio of silver/binder. The volume ratio of silver/binder is preferably 100/1 or less, more preferably 50/1 or less, further preferably 10/1 or less, and particularly preferably 6/1 or less. Moreover, the volume ratio of silver/binder is further preferably 1/1 to 4/1. The volume ratio of silver/binder is most preferably 1/1 to 3/1. If the volume ratio of silverbinder in the silver salt emulsion layer is set within this range, even in the case where the amount of applied silver is adjusted, fluctuations in resistance value can be suppressed, and the conductive sheet for the touch panel having a uniform surface resistance can be obtained. Note that the volume ratio of silver/binder can be obtained by converting the amount of silver halide/the amount of binder (weight ratio) in the raw material into the amount of silver/the amount of binder (weight ratio) and further converting the amount of silver/the amount of binder (weight ratio) into the amount of silver/the amount of binder (volume ratio).

<Solvent>

The solvent used to form the silver salt emulsion layer is not particularly limited, and examples thereof include water, organic solvents (for example, alcohols such as methanol, ketones such as acetone, amides such as formamide, sulfoxides such as dimethylsulfoxide, esters such as ethyl acetate, and ethers), ionic liquids, and a mixture solvent of these solvents.

The content of the solvent used to form the silver salt emulsion layer of the present embodiment falls within a range of 30 to 90 mass % of the total mass of the silver salt, the binder, and the like contained in the silver salt emulsion layer, and preferably falls within a range of 50 to 80 mass % thereof.

<Other Additives>

Various additives used in the present embodiment are not particularly limited, and known additives can be preferably used therein.

[Other Layer Configurations]

A protective layer (not illustrated) may be provided on the silver salt emulsion layer. The "protective layer" in the present embodiment means a layer made of a binder such as gelatin and polymers, and is formed on the silver salt emulsion layer having photosensitivity in order to produce effects of preventing scratches and improving mechanical characteristics. The thickness of the protective layer is preferably 0.5 μm or less. A method of applying and a method of forming the protective layer are not particularly limited, and a known applying method and a known forming method can be selected as appropriate. Moreover, for example, a basecoat layer may also be provided under the silver salt emulsion layer.

Next, steps of the method of manufacturing the conductive sheet 1 are described.

[Exposure to Light]

The present embodiment includes the case where the first electrode pattern 10 and the second electrode pattern 40 are formed by printing. Besides the printing, the first electrode pattern 10 and the second electrode pattern 40 are formed by exposure to light, development, and the like. That is, a photosensitive material having a silver-salt-containing layer or a photosensitive material to which photopolymer for photolithography has been applied, which is provided on the substrate 30, is exposed to light. The exposure to light can be performed using electromagnetic waves. Examples of the electromagnetic waves include light such as visible light rays and ultraviolet rays and radiant rays such as X-rays. Further, a light source having wavelength distribution may be used for the exposure to light, and a light source having a particular wavelength may be used therefor.

A method using a glass mask and a pattern exposure method using laser drawing are preferable for the exposure method.

[Development Process]

In the present embodiment, after the emulsion layer is exposed to light, the development process is further performed. A technique of a standard development process used for silver halide photographic films, printing paper, printing plate-making films, photomask emulsion masks, and the like can be used for the development process.

The development process in the present embodiment can include a fixing process performed for the purpose of stabilization by removing the silver salt in the unexposed part. A technique of a fixing process used for silver halide photographic films, printing paper, printing plate-making films, photomask emulsion masks, and the like can be used for the fixing process in the present invention.

It is preferable that the photosensitive material that has been subjected to the development and fixing process be subjected to a hardening process, a water washing process, and a stabilization process.

The mass of metal silver contained in the exposed part after the development process is preferably 50 mass % or more of the mass of silver contained in the exposed part before the exposure to light, and is further preferable 80 mass % or more thereof. If the mass of silver contained in the exposed part is 50 mass % or more of the mass of silver contained in the exposed part before the exposure to light, high conductive properties can be obtained, which is preferable.

The gradation after the development process in the present embodiment is not particularly limited, and preferably exceeds 4.0. If the gradation after the development process exceeds 4.0, the conductive properties of the conductive metal part can be improved while the translucency of the light transmissive part is kept high. Examples of means for making the gradation 4.0 or more include the doping with rhodium ions and iridium ions described above.

The conductive sheet is obtained through the above-mentioned steps, and the surface resistance of the obtained conductive sheet is preferably 100 Ω/sq. or less, more preferably 80 Ω/sq. or less, further preferably 60 Ω/sq. or less, and further more preferably 40 Ω/sq. or less. It is ideal to make the lower limit value of the surface resistance as low as possible. In general, it is sufficient that the lower limit value thereof be 0.01 Ω/sq. Even 0.1 Ω/sq. or 1 Ω/sq. can be adopted depending on the purpose of use.

If the surface resistance is adjusted to such a range, position detection is possible for even a large-size touch panel having an area of 10 cm×10 cm or more. Moreover, the conductive sheet after the development process may be further subjected to a calendering process, and the surface resistance can be adjusted to a desired value by the calendering process.

(Hardening Process after Development Process)

It is preferable to perform a hardening process on the silver salt emulsion layer by immersing the same in a hardener after performing the development process thereon. Examples of the hardener include: dialdehydes such as glutaraldehyde, adipaldehyde, and 2,3-dihydroxy-1,4-dioxane; and inorganic compounds such as boric acid and chrome alum/potassium alum, which are described in Japanese Patent Application Laid-Open No. 2-141279.

[Physical Development and Plating Process]

In the present embodiment, physical development and/or a plating process for causing the metal silver part to support conductive metal grains may be performed for the purpose of enhancing the conductive properties of the metal silver part formed by the exposure to light and the development process. In the present invention, the metal silver part may be caused to support conductive metal grains through only any one of the physical development and the plating process, and the metal silver part may be caused to support conductive metal grains through a combination of the physical development and the plating process. Note that the metal silver part that has been physically developed and/or plated is also referred to as "conductive metal part".

[Oxidation Process]

In the present embodiment, it is preferable that the metal silver part after the development process and the conductive metal part formed by the physical development and/or the plating process be subjected to an oxidation process. For example, in the case where a slight amount of metal is deposited in the light transmissive part, the oxidation process can remove the metal, and can make the transmittance of the light transmissive part substantially 100%.

[Light Transmissive Part]

The "light transmissive part" in the present embodiment means a translucent portion other than the first electrode pattern 10 and the second electrode pattern 40, of the conductive sheet 1. As described above, the transmittance of the light transmissive part is 90% or more, preferably 95% or more, further preferably 97% or more, further more preferably 98% or more, and most preferably 99% or more, in terms of the transmittance indicated by the minimum value of the transmittance in a wavelength region of 380 to 780 nm excluding contributions to light absorption and reflection of the substrate 30.

[Conductive Sheet 1]

The film thickness of the substrate 30 in the conductive sheet 1 according to the present embodiment is preferably 5 to 350 μm and further preferably 30 to 150 μm. If the film thickness thereof is set within such a range of 5 to 350 μm, a desired transmittance of visible light can be obtained, and handling is easy.

The thickness of the metal silver part provided on the substrate 30 can be determined as appropriate in accordance with the application thickness of coating for the silver-salt-containing layer applied onto the substrate 30. The thickness of the metal silver part can be selected from 0.001 mm to 0.2 mm, and is preferably 30 μm or less, more preferably 20 μm or less, further preferably 0.01 to 9 μm, and most preferably 0.05 to 5 μm. Moreover, it is preferable that the metal silver part be patterned. The metal silver part may have a single-layered structure, and may have a multi-layered structure of two or more layers. In the case where the metal silver part is patterned and has a multi-layered structure of two or more layers, the metal silver part can be provided with different color sensitivities so as to be reactive to different wavelengths. As a result, if the metal silver part is exposed to light with different wavelengths, different patterns can be formed in the respective layers.

For use in a touch panel, a smaller thickness of the conductive metal part is more preferable, because the viewing angle of a display panel is wider. Also in terms of enhancement in visibility, a reduction in thickness of the conductive metal part is required. From such perspectives, it is desirable that the thickness of the layer made of the conductive metal supported by the conductive metal part be less than 9 μm, less than 5 μm, or less than 3 μm, and be 0.1 μm or more.

In the present embodiment, the metal silver part having a desired thickness can be formed by controlling the application thickness of the silver-salt-containing layer, and the thickness of the layer made of the conductive metal grains can be freely controlled by the physical development and/or the plating process. Hence, even the conductive sheet 1 having a thickness that is less than 5 μm and preferably less than 3 μm can be easily formed.

Note that the method of manufacturing the conductive sheet according to the present embodiment does not necessarily need to include the plating step and the like. This is because the method of manufacturing the conductive sheet 1 according to the present embodiment can obtain a desired surface resistance by adjusting the amount of applied silver and the volume ratio of silver/binder of the silver salt emulsion layer.

Figure 33:
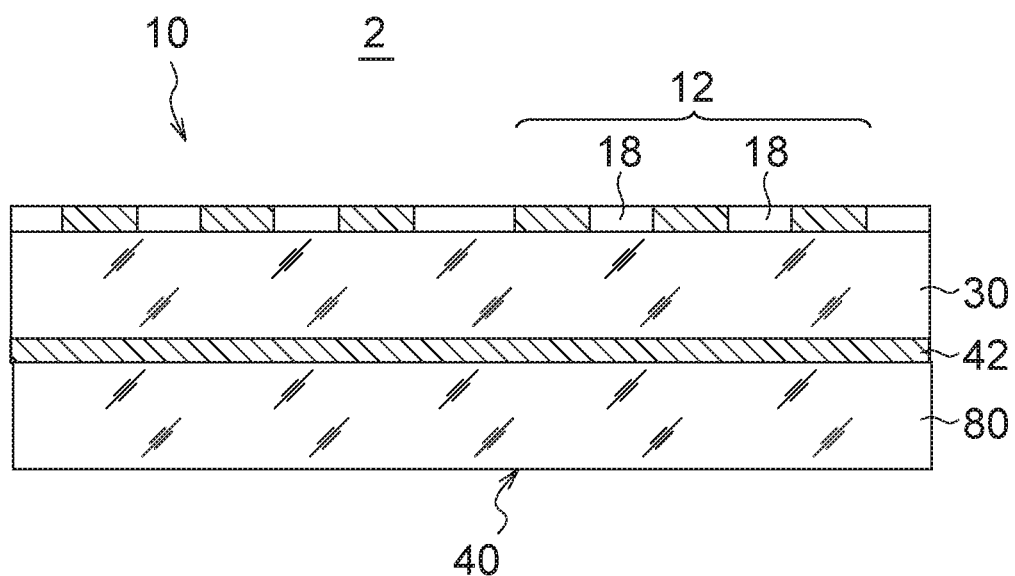
FIG. 33 is a schematic cross-sectional view of another conductive sheet.

With regard to the above-mentioned manufacturing method, description is given of the conductive sheet 1 including: the substrate 30; the first electrode pattern 10 formed on the first main surface of the substrate 30; and the second electrode pattern 40 formed on the second main surface of the substrate 30, which are illustrated in FIG. 2. Alternatively, as illustrated in FIG. 33, the conductive sheet 1 which includes the substrate 30 and the first electrode pattern 10 formed on the first main surface of the substrate 30, and a conductive sheet 2 which includes a substrate 80 and the second electrode pattern 40 formed on a first main surface of the substrate 80 may be placed on top of each other (overlaid) such that the first electrode pattern 10 and the second electrode pattern 40 are orthogonal to each other. The manufacturing method applied to the substrate 30 and the first electrode pattern can be adopted for the substrate 80 and the second electrode pattern 40.

The conductive sheet and the touch panel according to the present invention are not limited to the above-mentioned embodiments, and can have various configurations without departing from the gist of the present invention, as a matter of course. Moreover, the conductive sheet and the touch panel according to the present invention can be used in appropriate combination with techniques disclosed in, for example, Japanese Patent Application Laid-Open No. 2011-113149, No. 2011-129501, No. 2011-129112, No. 2011-134311, and No. 2011-175628.

Hereinafter, a conductive sheet and a capacitive touch panel according to another embodiment are described with reference to FIG. 34 to FIG. 40. Note that, herein, "to" indicating a numerical value range is used to mean that the numerical value range includes numerical values given before and after "to" as its lower limit value and its upper limit value.

Figure 34:
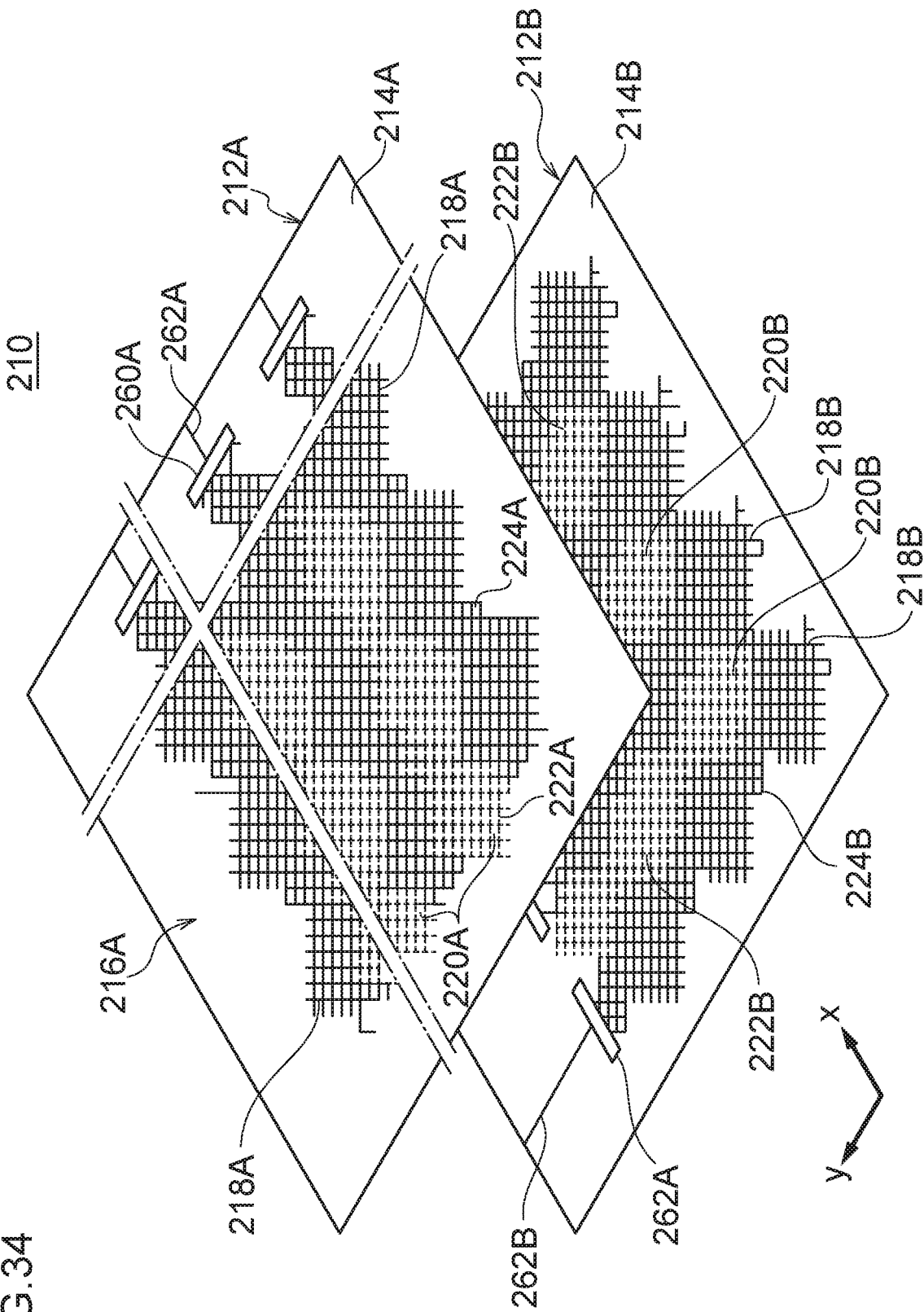
FIG. 34 is an exploded perspective view illustrating, with partial omission, a conductive sheet for a touch panel.
Figure 35A:
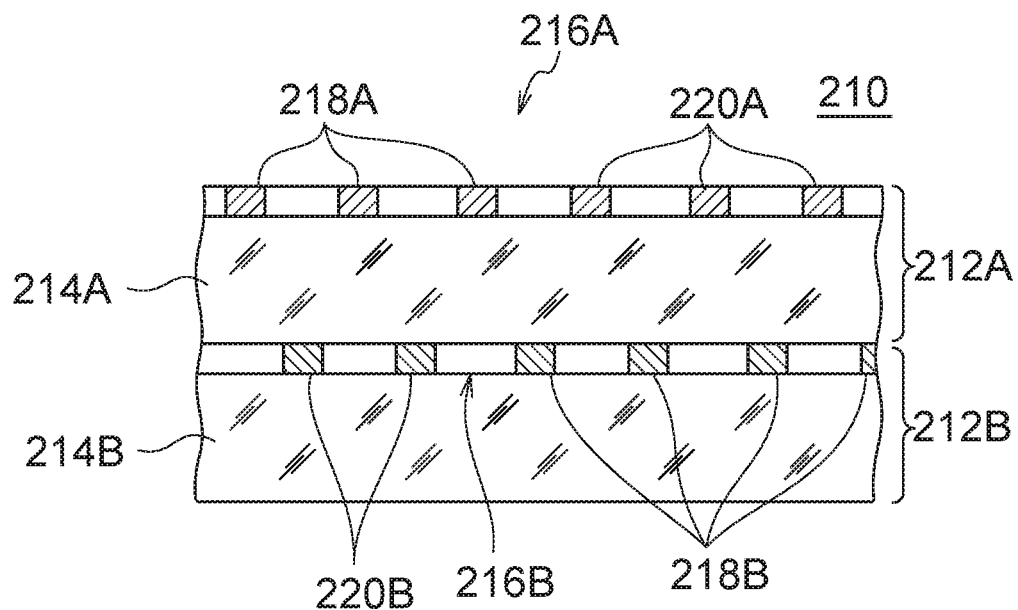
FIG. 35A is a cross-sectional view illustrating, with partial omission, an example of the conductive sheet for the touch panel.

As illustrated in FIG. 34 and FIG. 35A, a conductive sheet for a touch panel (hereinafter, referred to as the conductive sheet 210 for the touch panel) according to the present embodiment is formed by laminating a first conductive sheet 212A and a second conductive sheet 212B.

Figure 36:
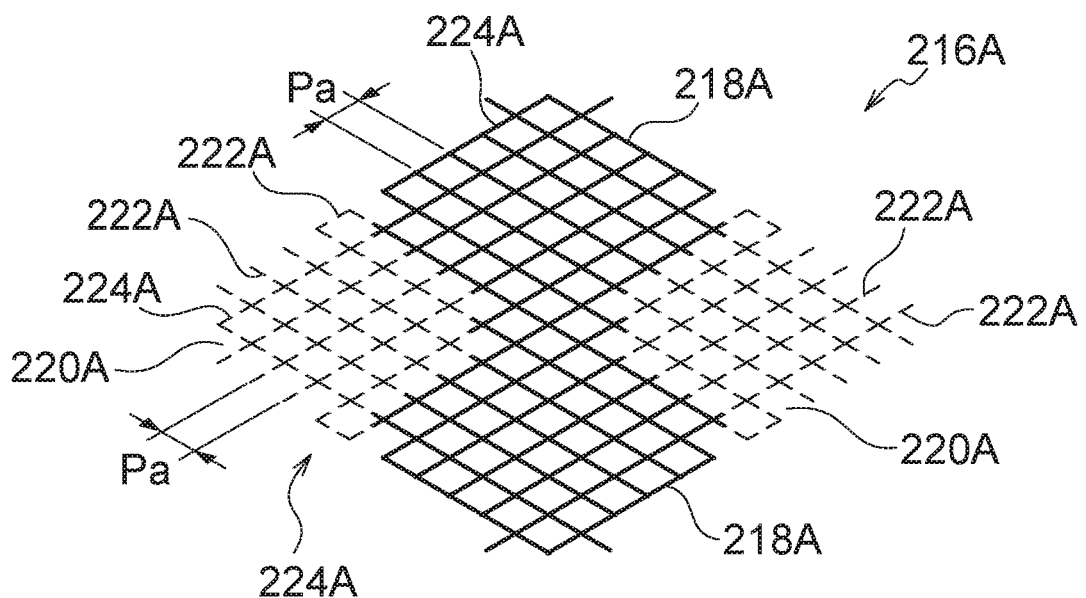
FIG. 36 is a plan view illustrating an example of a first electrode pattern formed on a first conductive sheet.

As illustrated in FIG. 34 and FIG. 36, the first conductive sheet 212A includes a first electrode pattern 216A formed on one main surface of a first transparent substrate 214A (see FIG. 35A). The first electrode pattern 216A is formed by a large number of grids made of metal thin wires. The first electrode pattern 216A includes: two or more first conductive patterns 218A that extend in a first direction (x direction) and are arranged in a second direction (y direction) orthogonal to the first direction; and first nonconductive patterns 220A that electrically separate the first conductive patterns 218A from each other. Each first nonconductive pattern 220A includes a plurality of break parts 222A (referred to as first break parts 222A as needed) formed in portions other than intersection points of the metal thin wires. The first conductive patterns 218A are electrically separated from each other by the plurality of break parts 222A.

The metal thin wires that form the first electrode pattern 216A each have a wire width of 0.5 µm to 30 µm. It is desirable that the wire width of each metal thin wire be 30 µm or less, preferably 15 µm or less, more preferably 10 µm or less, more preferably 9 µm or less, and more preferably 7 µm or less, and be preferably 0.5 µm or more. Note that, although the first conductive patterns 218A and the first nonconductive patterns 220A have substantially the same wire width, in FIG. 36, in order to clarify the first conductive patterns 218A and the first nonconductive patterns 220A, the wire width of each first conductive pattern 218A is exaggeratingly thickened, and the wire width of each first nonconductive pattern 220A is exaggeratingly thinned. The wire width of each first conductive pattern 218A and the wire width of each first nonconductive pattern 220A may be the same as each other, and may be different from each other. Preferably, the wire widths of the two are the same as each other. The reason for this is that the visibility may become lower if the wire widths of the two are different from each other. The metal thin wires of the first electrode pattern 216A are made of metal materials such as gold, silver, and copper and conductive materials such as metal oxides.

The first electrode pattern 216A includes a plurality of grids 224A made of metal thin wires that intersect with each other. The grids 224A each include an opening region surrounded by the metal thin wires. The grids 224A have a grid pitch Pa of 250 µm to 900 µm, and preferably have a grid pitch Pa of 300 µm to 700 µm. The grids 224A of the first conductive patterns 218A and the grids 224A of the first nonconductive patterns 220A have substantially the same size.

The grids 224A of the first nonconductive patterns 220A include the break parts 222A in portions other than the intersection parts of the metal thin wires. All the grids 224A that form the first nonconductive patterns 220A do not necessarily need to include the break parts 222A. It is sufficient that the first nonconductive patterns 220A can achieve electrical separation between adjacent ones of the first conductive patterns 218A. The length of each break part 222A is preferably 60 µm or less, and is more preferably 10 to 50 µm, 15 to 40 µm, and 20 to 40 µm. Moreover, the formation range of the break parts 222A can be expressed by, for example, a fluctuation in wire density. Here, the fluctuation in wire density refers to a fluctuation in total thin wire length of unit small grids, and can be defined as ±(the maximum value of total wire length−the minimum value of total wire length)/the average value of total wire length/2 (%). The formation range of the break parts 222A is preferably ±15%, more preferably ±10%, and further preferably ±0.5% to ±5%, in terms of the fluctuation in wire density.

In the conductive sheet 210 for the touch panel, each grid 224A has a substantially rhomboid shape. Here, the substantially rhomboid shape means a parallelogram whose diagonals are substantially orthogonal to each other. Alternatively, each grid 224A may have other polygonal shapes. Moreover, the shape of one side of each grid 224A may be a curved shape or a circular arc shape instead of a straight shape. In the case of the circular arc shape, for example, opposing two of the sides of each grid 224A may each have a circular arc shape convex outward, and other opposing two of the sides thereof may each have a circular arc shape convex inward. Moreover, the shape of each side of each grid 224A may be a wavy shape in which a circular arc convex outward and a circular arc convex inward are alternately continuous. As a matter of course, the shape of each side thereof may be a sine curve.

Each first conductive pattern 218A includes wider portions and narrower portions that are alternately placed along the first direction (x direction). Similarly, each first nonconductive pattern 220A includes wider portions and narrower portions that are alternately placed along the first direction (x direction). The order of the wider portions and the narrower portions of each first conductive pattern 218A is opposite to the order of the wider portions and the narrower portions of each first nonconductive pattern 220A.

Each first conductive pattern 218A has one end electrically connected to a first external wire 262A via a first terminal 260A. Meanwhile, each first conductive pattern 218A has another end that is an opened end.

Figure 37:
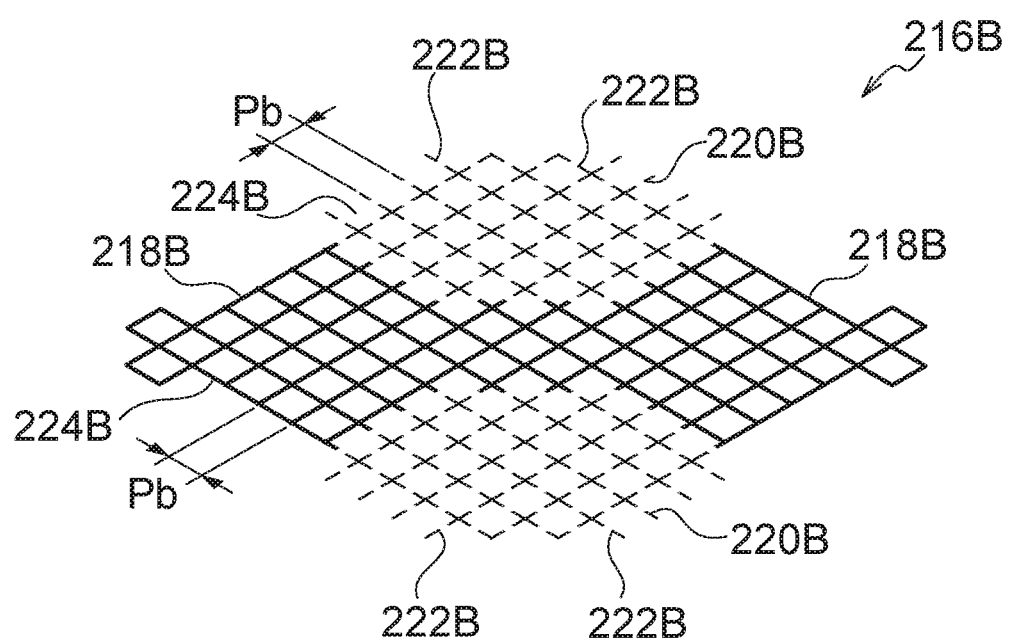
FIG. 37 is a plan view illustrating an example of a second electrode pattern formed on a second conductive sheet.

As illustrated in FIG. 34 and FIG. 37, the second conductive sheet 212B includes a second electrode pattern 216B formed on one main surface of a second transparent substrate 214B (see FIG. 35A). The second electrode pattern 216B is formed by a large number of grids made of metal thin wires. The second electrode pattern 216B includes: two or more second conductive patterns 218B that extend in the second direction (y direction) and are arranged in the first direction (x direction) orthogonal to the second direction; and second nonconductive patterns 220B that electrically separate the second conductive patterns 218B from each other. Each second nonconductive pattern 220B includes a plurality of break parts 222B (referred to as second break parts 222B as needed) formed in portions other than intersection points of the metal thin wires. The second conductive patterns 218B are electrically separated from each other by the plurality of break parts 222B.

The metal thin wires that form the second electrode pattern 216B each have a wire width of 0.5 µm to 30 µm. It is desirable that the wire width of each metal thin wire be 30 µm or less, preferably 15 µm or less, more preferably 10 µm or less, more preferably 9 µm or less, and more preferably 7 µm or less, and be preferably 0.5 µm or more. Note that, although the second conductive patterns 218B and the second nonconductive patterns 220B have substantially the same wire width, in FIG. 37, in order to clarify the second conductive patterns 218B and the second nonconductive patterns 220B, the wire width of each second conductive pattern 218B is exaggeratingly thickened, and the wire width of each second nonconductive pattern 220B is exaggeratingly thinned. The wire width of each second conductive pattern 218B and the wire width of each second nonconductive pattern 220B may be the same as each other, and may be different from each other. Preferably, the wire widths of the two are the same as each other. The reason for this is that the visibility may become lower if the wire widths of the two are different from each other. The metal thin wires of the second electrode pattern 216B are made of metal materials such as gold, silver, and copper and conductive materials such as metal oxides.

The second electrode pattern 216B includes a plurality of grids 224B made of metal thin wires that intersect with each other. The grids 224B each include an opening region surrounded by the metal thin wires. The grids 224B have a grid pitch Pb of 250 µm to 900 µm, and preferably have a grid pitch Pb of 300 µm to 700 µm. The grids 224B of the second conductive patterns 218B and the grids 224B of the second nonconductive patterns 220B have substantially the same size.

The grids 224B of the second nonconductive patterns 220B include the break parts 222B in portions other than the intersection parts of the metal thin wires. All the grids 224B that form the second nonconductive patterns 220B do not necessarily need to include the break parts 222B. It is sufficient that the second nonconductive patterns 220B can achieve electrical separation between adjacent ones of the second conductive patterns 218B. The length of each break part 222B is preferably 60 µm or less, and is more preferably 10 to 50 µm, 15 to 40 µm, and 20 to 40 µm. Moreover, the formation range of the break parts 222B can be expressed by, for example, a fluctuation in wire density. Here, the fluctuation in wire density refers to a fluctuation in total thin wire length of unit small grids, and can be defined as ±(the maximum value of total wire length−the minimum value of total wire length)/the average value of total wire length/2 (%). The formation range of the break parts 222B is preferably ±15%, more preferably ±10%, and further preferably ±0.5% to ±5%, in terms of the fluctuation in wire density.

In the conductive sheet 210 for the touch panel, each grid 224B has a substantially rhomboid shape. Here, the substantially rhomboid shape means a parallelogram whose diagonals are substantially orthogonal to each other. Alternatively, each grid 224B may have other polygonal shapes. Moreover, the shape of one side of each grid 224B may be a curved shape or a circular arc shape instead of a straight shape. In the case of the circular arc shape, for example, opposing two of the sides of each grid 224B may each have a circular arc shape convex outward, and other opposing two of the sides thereof may each have a circular arc shape convex inward. Moreover, the shape of each side of each grid 224B may be a wavy shape in which a circular arc convex outward and a circular arc convex inward are alternately continuous. As a matter of course, the shape of each side thereof may be a sine curve.

Each second conductive pattern 218B includes wider portions and narrower portions that are alternately placed along the second direction (y direction). Similarly, each second nonconductive pattern 220B includes wider portions and narrower portions that are alternately placed along the second direction (y direction). The order of the wider portions and the narrower portions of each second conductive pattern 218B is opposite to the order of the wider portions and the narrower portions of each second nonconductive pattern 220B.

Each second conductive pattern 218B has one end electrically connected to a second external wire 262B via a second terminal 260B. Meanwhile, each second conductive pattern 218B has another end that is an opened end.

Figure 38:
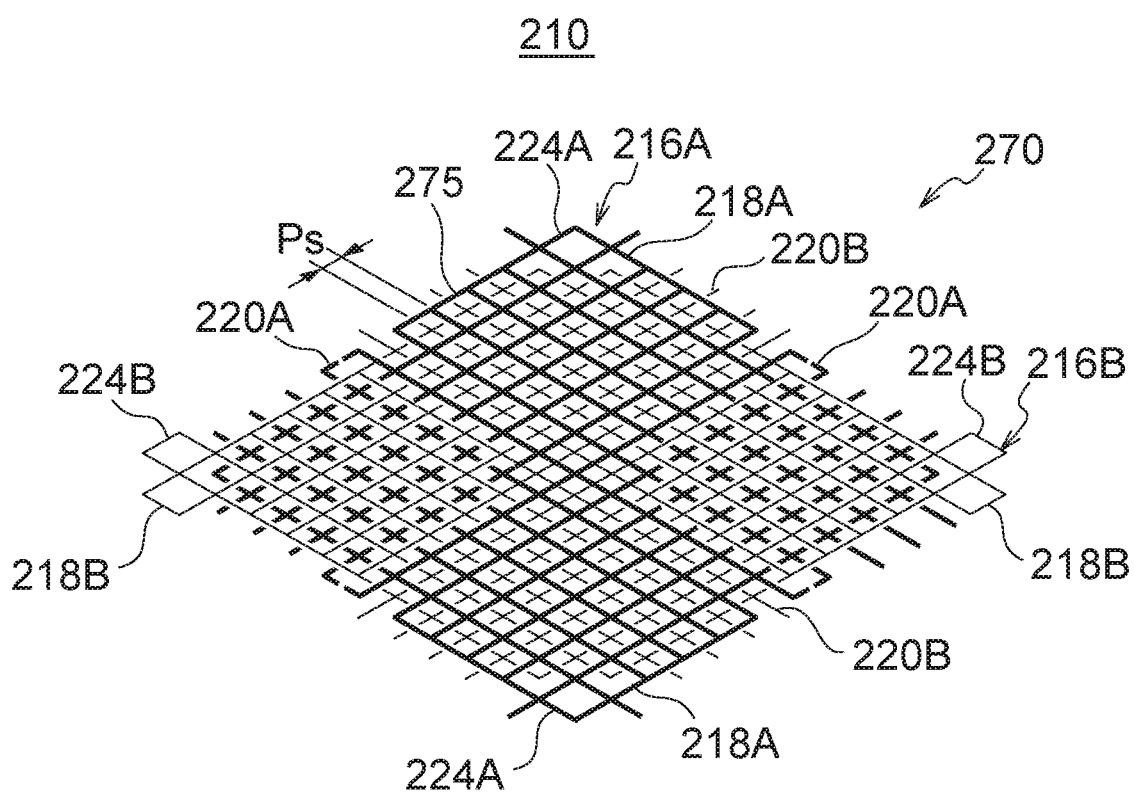
FIG. 38 is a plan view illustrating, with partial omission, an example in which the first conductive sheet and the second conductive sheet are combined with each other to form a conductive sheet for a touch panel.

Then, when the conductive sheet 210 for the touch panel is formed by laminating, for example, the first conductive sheet 212A on the second conductive sheet 212B, the first electrode pattern 216A and the second electrode pattern 216B are placed so as not to overlap with each other as illustrated in FIG. 38. At this time, the first electrode pattern 216A and the second electrode pattern 216B are placed such that the narrower portions of the first conductive patterns 218A are opposed to the narrower portions of the second conductive patterns 218B and that the narrower portions of the first conductive patterns 218A intersect with the narrower portions of the second conductive patterns 218B. As a result, the first electrode pattern 216A and the second electrode pattern 216B form a combination pattern 270. Note that the wire widths of the first electrode pattern 216A and the second electrode pattern 216B are substantially the same as each other. Moreover, the sizes of the grids 224A and the grids 224B are substantially the same as each other. However, in FIG. 38, in order to clarify a positional relation of the first electrode pattern 216A and the second electrode pattern 216B, the wire width of the first electrode pattern 216A is made thicker than the wire width of the second electrode pattern 216B.

In the combination pattern 270, the grids 224A and the grids 224B form small grids 276 in top view. That is, the intersection parts of the grids 224A are respectively placed in the opening regions of the grids 224B. Note that the small grids 276 have a grid pitch Ps of 125 µm to 450 µm that is half the respective grid pitches Pa and Pb of the grids 224A and the grids 224B, and preferably have a grid pitch Ps of 150 µm to 350 µm.

The break parts 222A of the first nonconductive patterns 220A are formed in portions other than the intersection parts of the grids 224A, and the break parts 222B of the second nonconductive patterns 220B are formed in portions other than the intersection parts of the grids 224B. As a result, a decrease in visibility caused by the break parts 222A and the break parts 222B can be prevented in the combination pattern 270.

In particular, the metal thin wires of the second conductive patterns 218B are placed at positions opposed to the break parts 222A. Moreover, the metal thin wires of the first conductive patterns 218A are placed at positions opposed to the break parts 222B. The metal thin wires of the second conductive patterns 218B mask the break parts 222A, and the metal thin wires of the first conductive patterns 218A mask the break parts 222B. Accordingly, in the combination pattern 270, the break parts 222A and the break parts 222B are less easily visually observed in top view, and hence the visibility can be enhanced. In consideration of enhancement in visibility, it is preferable that the length of each break part 222A and the wire width of each of the metal thin wires of the second conductive patterns 218B satisfy a relational expression of the wire width×1<the break part<the wire width×10. Similarly, it is preferable that the length of each break part 222B and the wire width of each of the metal thin wires of the first conductive patterns 218A satisfy a relational expression of the wire width×1<the break part<the wire width×10.

Figure 39:
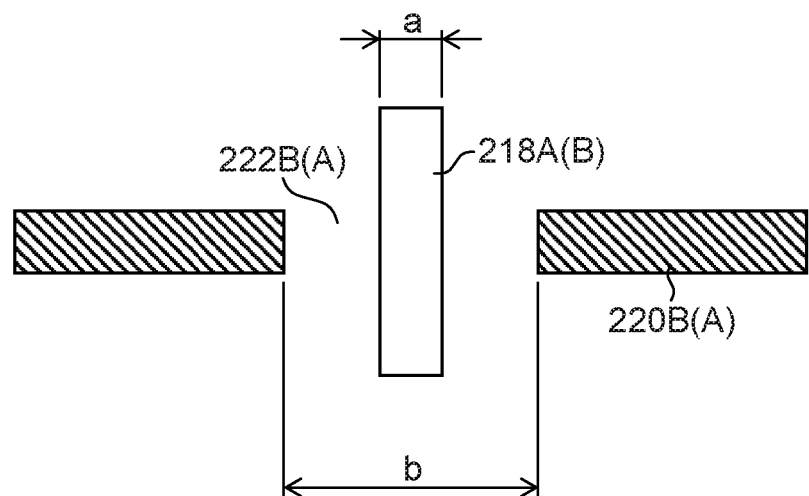
FIG. 39 is a schematic view illustrating a positional relation between a metal thin wire and a break part.

Next, a relation between the second break parts 222B and the metal thin wires of the first conductive patterns 218A and a relation between the first break parts 222A and the metal thin wires of the second conductive patterns 218B are described. FIG. 39 is a schematic view illustrating a positional relation between the metal thin wire and the break part. Assuming that the width of each of the metal thin wires of the first conductive patterns 218A and the metal thin wires of the second conductive patterns 218B is a and that the width of each of the first break parts 222A of the first nonconductive patterns 220A and the second break parts 222B of the second nonconductive patterns 220B is b, it is preferable that a relational expression of b−a≤30 µm be satisfied. This means that, as a difference between the width of each metal thin wire and the width of each break part is smaller, a portion of the break part occupied by the metal thin wire is larger, and a decrease in visibility can be more prevented.

Moreover, assuming that the width of each of the metal thin wires of the first conductive patterns 218A and the metal thin wires of the second conductive patterns 218B is a and that the width of each of the first break parts 222A of the first nonconductive patterns 220A and the second break parts 222B of the second nonconductive patterns 220B is b, it is preferable that a relational expression of (b−a)/a≤6 be satisfied. This means that the width of each of the second break parts 222B of the second nonconductive patterns 220B is equal to or less than a predetermined width, with respect to the width of each of the metal thin wires of the first conductive patterns 218A and the metal thin wires of the second conductive patterns 218B. Similarly to the above, this means that a portion of each break part occupied by each metal thin wire is as large as possible, and a decrease in visibility can be more prevented.

Figure 40:
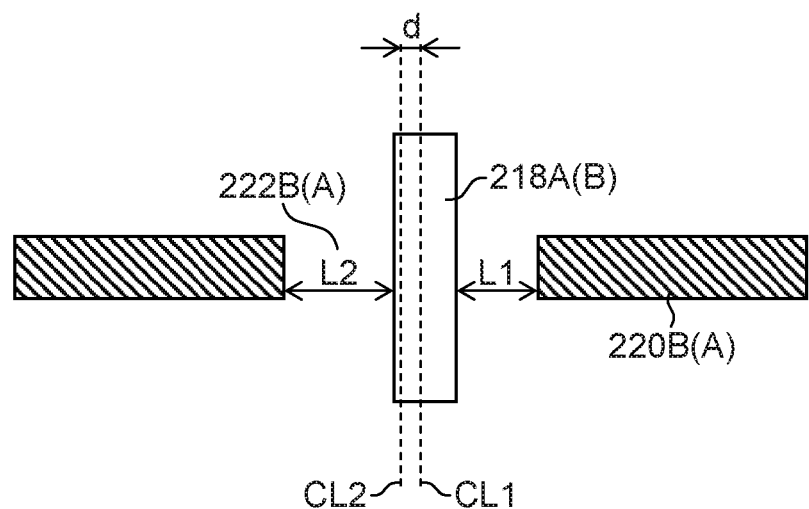
FIG. 40 is a schematic view illustrating a relation between a central position of the metal thin wire and a central position of the break part.

Next, a positional misalignment between the central position of each metal thin wire and the central position of each break part is described. FIG. 40 is a schematic view illustrating a relation between the central position of the metal thin wire and the central position of the break part. A central line CL1 designates the central position of each of the metal thin wires of the first conductive patterns 218A and the metal thin wires of the second conductive patterns 218B. A central line CL2 designates the central position of each of the second break parts 222B and the first break parts 222A. An amount of misalignment d means a distance between the central line CL1 and the central line CL2. Assuming that each amount of misalignment is d and that the average value of the amounts of misalignment d is dAve., it is preferable that a standard deviation a be 10 μm or less. A small standard deviation σ means that fluctuations in the amount of misalignment d between the central line CL1 and the central line CL2 are small. In the case where each metal thin wire is located as closer to the center of each break part as possible, distances L1 and L2 that are gaps between the metal thin wires of the first conductive patterns 218A and the metal thin wires of the second nonconductive patterns 220B are more equal to each other, or distances L1 and L2 that are gaps between the metal thin wires of the second conductive patterns 218B and the metal thin wires of the first nonconductive patterns 220A are more equal to each other. Such symmetry makes the patterns less perceivable in terms of human visibility, with the result that a decrease in visibility can be prevented.

In the case where the conductive sheet 210 for the touch panel is used for a touch panel, a protective layer (not illustrated) is formed on the first conductive sheet 212A. The first external wires 262A respectively drawn from the large number of first conductive patterns 218A of the first conductive sheet 212A and the second external wires 262B respectively drawn from the large number of second conductive patterns 218B of the second conductive sheet 212B are connected to, for example, an IC circuit that controls scanning.

In order to minimize the area of a peripheral region outside of a display screen of a liquid crystal display device, of the conductive sheet 210 for the touch panel, preferably, the respective connection parts between the first conductive patterns 218A and the first external wires 262A are linearly arranged, and the respective connection parts between the second conductive patterns 218B and the second external wires 262B are linearly arranged.

If the tip of a finger is brought into contact with the protective layer, an electrostatic capacitance between the first conductive patterns 218A and the second conductive patterns 218B opposed to the tip of the finger changes. The IC circuit detects the amount of this change, and calculates the position of the tip of the finger on the basis of the amount of this change. Such calculation is performed on between each first conductive pattern 218A and each second conductive pattern 218B. Accordingly, even if the tips of two or more fingers are brought into contact at the same time, the position of the tip of each finger can be detected.

In this way, in the case where the conductive sheet 210 for the touch panel is applied to, for example, a projected capacitive touch panel, the conductive sheet 210 for the touch panel can increase a response speed because of its small surface resistance, and can promote an increase in size of the touch panel.

Next, a method of manufacturing the first conductive sheet 212A and the second conductive sheet 212B is described.

In the case of manufacturing the first conductive sheet 212A and the second conductive sheet 212B, for example, a photosensitive material having an emulsion layer containing photosensitive silver halide is exposed to light and developed on each of the first transparent substrate 214A and the second transparent substrate 214B, and a metal silver part (metal thin wires) and a light transmissive part (opening regions) are respectively formed in the exposed part and the unexposed part, whereby the first electrode pattern 216A and the second electrode pattern 216B may be formed. Note that the metal silver part is further physically developed and/or plated, whereby the metal silver part may be caused to support conductive metal.

Alternatively, a resist pattern is formed by exposing to light and developing a photoresist film on copper foil formed on each of the first transparent substrate 214A and the second transparent substrate 214B, and the copper foil exposed on the resist pattern is etched, whereby the first electrode pattern 216A and the second electrode pattern 216B may be formed.

Alternatively, a paste containing metal fine grains is printed on each of the first transparent substrate 214A and the second transparent substrate 214B, and the paste is plated with metal, whereby the first electrode pattern 216A and the second electrode pattern 216B may be formed.

The first electrode pattern 216A and the second electrode pattern 216B may be respectively formed by printing on the first transparent substrate 214A and the second transparent substrate 214B, using a screen printing plate or a gravure printing plate. Alternatively, the first electrode pattern 216A and the second electrode pattern 216B may be respectively formed on the first transparent substrate 214A and the second transparent substrate 214B, according to an inkjet process.

Figure 35B:
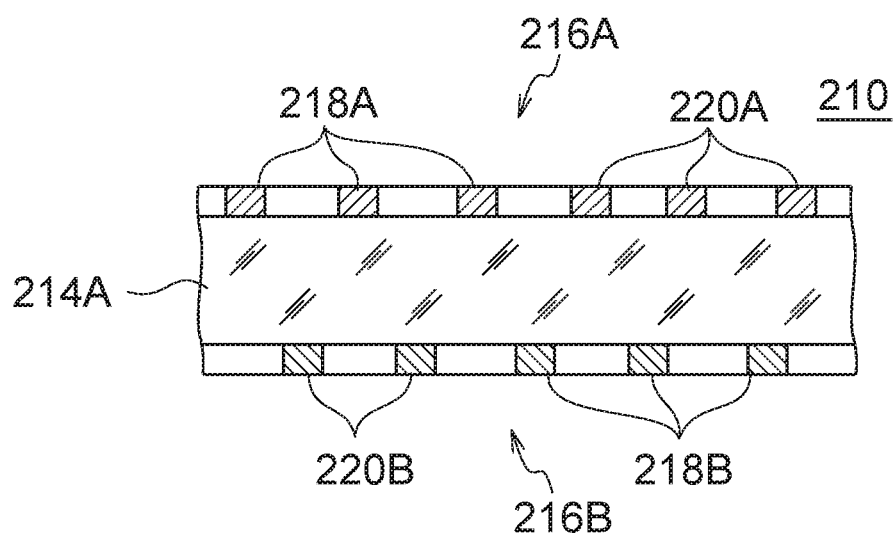
FIG. 35B is a cross-sectional view illustrating, with partial omission, another example of the conductive sheet for the touch panel.

In a case as illustrated in FIG. 35B where the first electrode pattern 216A is formed on one main surface of the first transparent substrate 214A and where the second electrode pattern 216B is formed on another main surface of the first transparent substrate 214A, if a standard manufacturing method (in which the one main surface is first exposed to light, and the another main surface is then exposed to light) is adopted, the first electrode pattern 216A and the second electrode pattern 216B having desired patterns cannot be obtained in some cases.

In view of the above, the following manufacturing method can be preferably adopted.

That is, photosensitive silver halide emulsion layers respectively formed on both the surfaces of the first transparent substrate 214A are collectively exposed to light, whereby the first electrode pattern 216A is formed on the one main surface of the first transparent substrate 214A while the second electrode pattern 216B is formed on the another main surface of the first transparent substrate 214A.

A specific example of the method of manufacturing the conductive sheet according to aspects illustrated in FIGS. 34 to 40 is described.

First, an elongated photosensitive material is manufactured. The photosensitive material includes: the first transparent substrate 214A; a photosensitive silver halide emulsion layer (hereinafter, referred to as first photosensitive layer) formed on the one main surface of the first transparent substrate 214A; and a photosensitive silver halide emulsion layer (hereinafter, referred to as second photosensitive layer) formed on the another main surface of the first transparent substrate 214A.

Subsequently, the photosensitive material is exposed to light. This exposure process includes: a first exposure process performed on the first photosensitive layer, in which the first transparent substrate 214A is irradiated with light so that the first photosensitive layer is exposed to the light along a first exposure pattern; and a second exposure process performed on the second photosensitive layer, in which the first transparent substrate 214A is irradiated with light so that the second photosensitive layer is exposed to the light along a second exposure pattern (both-surfaces simultaneous exposure).

For example, in the state where the elongated photosensitive material is transported in one direction, the first photosensitive layer is irradiated with first light (parallel light) with the intermediation of a first photomask, while the second photosensitive layer is irradiated with second light (parallel light) with the intermediation of a second photomask. The first light is obtained by converting, into parallel light, light emitted from a first light source by means of a halfway first collimator lens. The second light is obtained by converting, into parallel light, light emitted from a second light source by means of a halfway second collimator lens.

Although description is given above of the case where the two light sources (the first light source and the second light source) are used, light emitted from one light source may be split by an optical system into the first light and the second light, and the first photosensitive layer and the second photosensitive layer may be irradiated with the first light and the second light.

Subsequently, the photosensitive material after the exposure to light is developed, whereby, for example, the conductive sheet 210 for the touch panel as illustrated in FIG. 35B is made. The conductive sheet 210 for the touch panel includes: the first transparent substrate 214A; the first electrode pattern 216A that is formed along the first exposure pattern on the one main surface of the first transparent substrate 214A; and the second electrode pattern 216B that is formed along the second exposure pattern on the another main surface of the first transparent substrate 214A. Note that the exposure time and the development time of the first photosensitive layer and the second photosensitive layer may variously change depending on the types of the first light source and the second light source, the type of a developing solution, and the like. Hence preferable numerical value ranges therefor cannot be unconditionally determined, but the exposure time and the development time are adjusted such that the development rate is 100%.

Then, according to the manufacturing method of the present embodiment, in the first exposure process, the first photomask is, for example, closely placed on the first photosensitive layer, and is irradiated with the first light emitted from the first light source that is placed so as to be opposed to the first photomask, whereby the first photosensitive layer is exposed to light. The first photomask includes a glass substrate made of transparent soda glass and a mask pattern (first exposure pattern) formed on the glass substrate. Accordingly, in the first exposure process, a portion of the first photosensitive layer is exposed to light, the portion being along the first exposure pattern formed on the first photomask. A gap of approximately 2 to 10 μm may be provided between the first photosensitive layer and the first photomask.

Similarly, in the second exposure process, the second photomask is, for example, closely placed on the second photosensitive layer, and is irradiated with the second light emitted from the second light source that is placed so as to be opposed to the second photomask, whereby the second photosensitive layer is exposed to light. Similarly to the first photomask, the second photomask includes a glass substrate made of transparent soda glass and a mask pattern (second exposure pattern) formed on the glass substrate. Accordingly, in the second exposure process, a portion of the second photosensitive layer is exposed to light, the portion being along the second exposure pattern formed on the second photomask. In this case, a gap of approximately 2 to 10 μm may be provided between the second photosensitive layer and the second photomask.

In the first exposure process and the second exposure process, the emission timing of the first light from the first light source and the emission timing of the second light from the second light source may be the same as each other, and may be different from each other. If the emission timings thereof are the same as each other, the first photosensitive layer and the second photosensitive layer can be simultaneously exposed to light in one exposure process, and the processing time can be shortened. Meanwhile, in the case where both the first photosensitive layer and the second photosensitive layer are not spectrally sensitized, if the photosensitive material is exposed to light on both the sides thereof, the exposure to light on one side influences image formation on the other side (rear side).

That is, the first light from the first light source that has reached the first photosensitive layer is scattered by silver halide grains contained in the first photosensitive layer, and is transmitted as scattered light through the first transparent substrate 214A, and part of the scattered light reaches even the second photosensitive layer. Consequently, a boundary portion between the second photosensitive layer and the first transparent substrate 214A is exposed to the light over a wide range, so that a latent image is formed. Hence, the second photosensitive layer is exposed to both the second light from the second light source and the first light from the first light source. In the case of manufacturing the conductive sheet 210 for the touch panel in the subsequent development process, a thin conductive layer based on the first light from the first light source is formed between the conductive patterns in addition to the conductive pattern (second electrode pattern 216B) along the second exposure pattern, and a desired pattern (a pattern along the second exposure pattern) cannot be obtained. The same applies to the first photosensitive layer.

As a result of intensive studies for avoiding this, the present inventors find out the following point. That is, if the thickness of each of the first photosensitive layer and the second photosensitive layer is set within a particular range or if the amount of silver applied to each of the first photosensitive layer and the second photosensitive layer is specified, silver halide itself absorbs light, and this can restrict light transmission to the rear surface. In the present embodiment, the thickness of each of the first photosensitive layer and the second photosensitive layer can be set to 1 μm or more and 4 μm or less. The upper limit value thereof is preferably 2.5 μm. Moreover, the amount of silver applied to each of the first photosensitive layer and the second photosensitive layer is specified to 5 to 20 g/m$^2$.

In the above-mentioned exposure method of both-surfaces close contact type, an image defect due to a hindrance to exposure by dust and the like attached to the sheet surface is problematic. In order to prevent such dust attachment, it is known to apply a conductive substance to the sheet, but metal oxides and the like remain even after the process to impair the transparency of a final product, and conductive polymers have a problem in preserving properties. As a result of intensive studies in view of the above, the present inventors find out that conductive properties necessary for prevention of static charge can be obtained by silver halide with a reduced binder, and thus specify the volume ratio of silver/binder of each of the first photosensitive layer and the second photosensitive layer. That is, the volume ratio of silver/binder of each of the first photosensitive layer and the second photosensitive layer is 1/1 or more, and is preferably 2/1 or more.

If the thickness, the amount of applied silver, and the volume ratio of silver/binder of each of the first photosensitive layer and the second photosensitive layer are set and specified as described above, the first light from the first light source that has reached the first photosensitive layer does not reach the second photosensitive layer. Similarly, the second light from the second light source that has reached the second photosensitive layer does not reach the first photosensitive layer. As a result, in the case of manufacturing the conductive sheet 210 for the touch panel in the subsequent development process, as illustrated in FIG. 35B, only the first electrode pattern 216A along the first exposure pattern is formed on the one main surface of the first transparent substrate 214A, and only the second electrode pattern 216B along the second exposure pattern is formed on the another surface of the first transparent substrate 214A, so that desired patterns can be obtained.

In this way, according to the above-mentioned manufacturing method using both-surfaces collective exposure, the first photosensitive layer and the second photosensitive layer having both conductive properties and suitability for the both-surfaces exposure can be obtained. Moreover, the same pattern or different patterns can be arbitrarily formed on both the surfaces of the first transparent substrate 214A in one exposure process on the first transparent substrate 214A. This can facilitate formation of the electrodes of the touch panel, and can achieve a reduction in thickness (a reduction in height) of the touch panel.

Next, focused description is given of a method of using a silver halide photographic photosensitive material corresponding to a particularly preferable aspect, for the first conductive sheet 212A and the second conductive sheet 212B according to the present embodiment.

The method of manufacturing the first conductive sheet 212A and the second conductive sheet 212B according to the present embodiment includes the following three aspects depending on modes of the photosensitive material and the development process.

(1) An aspect in which: a silver halide black-and-white photosensitive material not including the center of physical development is chemically developed or thermally developed; and a metal silver part is formed on the photosensitive material.

(2) An aspect in which: a silver halide black-and-white photosensitive material including the center of physical development in a silver halide emulsion layer is dissolved and physically developed; and a metal silver part is formed on the photosensitive material.

(3) An aspect in which: a silver halide black-and-white photosensitive material not including the center of physical development and an image receiving sheet having a non-photosensitive layer including the center of physical development are put on top of each other (overlaid) and then subjected to diffusion transfer development; and a metal silver part is formed on the non-photosensitive image receiving sheet.

According to the aspect in (1), which is of integrated black-and-white development type, a translucent conductive film such as a light-transmissive conductive film is formed on the photosensitive material. The obtained developed silver is chemically developed silver or thermally developed silver, and is highly active in the subsequent plating or physical development process, because the obtained developed silver is a filament having a high-specific surface.

According to the aspect in (2), in the exposed part, silver halide grains near the center of physical development are dissolved and deposited on the center of development, whereby a translucent conductive film such as a light-transmissive conductive film is formed on the photosensitive material. This aspect is also of integrated black-and-white development type. Because the development action is deposition on the center of physical development, high activity is obtained, and the developed silver has a spherical shape with a small-specific surface.

According to the aspect in (3), in the unexposed part, silver halide grains are dissolved and diffused to be deposited on the center of development on the image receiving sheet, whereby a translucent conductive film such as a light-transmissive conductive film is formed on the image receiving sheet. This aspect is of so-called separate type, in which the image receiving sheet is separated for use from the photosensitive material.

In any one of these aspects, both a negative development process and a reversal development process can be selected (in the case of a diffusion transfer method, the use of an auto-positive photosensitive material as the photosensitive material enables the negative development process).

The chemical development, the thermal development, the dissolution and physical development, and the diffusion transfer development described above have the same meanings as those of the respective terms normally used in this technical field, and are explained in general textbooks about photographic chemistry, for example, "Shashin Kagaku (Photographic Chemistry)" written by Shinichi Kikuchi (published by Kyoritsu Shuppan Co., Ltd. in 1955) and "The Theory of Photographic Processes, 4th ed." edited by C. E. K. Mees (published by Mcmillan Publishers Ltd in 1977). Although description is given above of an invention relating to liquid processes, but techniques adopting thermal development methods can also be referred to as other development methods. For example, it is possible to apply techniques described in Japanese Patent Application Laid-Open No. 2004-184693, No. 2004-334077, and No. 2005-010752 and Japanese Patent Application No. 2004-244080 and No. 2004-085655.

Here, layer configurations of the first conductive sheet 212A and the second conductive sheet 212B according to the present embodiment are described below in detail.

[First Transparent Substrate 214A and Second Transparent Substrate 214B]

The first transparent substrate 214A and the second transparent substrate 214B can be each formed using a plastic film, a plastic plate, a glass plate, and the like.

Examples of the raw materials of the plastic film and the plastic plate include: polyesters such as polyethylene terephthalate (PET) and polyethylene naphthalate (PEN); polyolefins such as polyethylene (PE), polypropylene (PP), polystyrene, and ethylene vinyl acetate (EVA)/cycloolefin polymer (COP)/cycloolefin copolymer (COC); vinyl resins; polycarbonate (PC); polyamide; polyimide; acrylic resins; and triacetylcellulose (TAC).

It is preferable that the first transparent substrate 214A and the second transparent substrate 214B be each formed using a plastic film or a plastic plate made of PET (melting point: 258° C.), PEN (melting point: 269° C.), PE (melting point: 135° C.), PP (melting point: 163° C.), polystyrene (melting point: 230° C.), polyvinyl chloride (melting point: 180° C.), polyvinylidene chloride (melting point: 212° C.), or TAC (melting point: 290° C.) having a melting point of about 290° C. or less. In particular, PET is preferable from the perspective of the light transmissivity, the workability, and the like. Because transparent conductive films such as the first conductive sheet 212A and the second conductive sheet 212B used in the conductive sheet 210 for the touch panel are required to have transparency, it is preferable that the degree of transparency of each of the first transparent substrate 214A and the second transparent substrate 214B be high.

[Silver Salt Emulsion Layer]

A silver salt emulsion layer that becomes each of the first electrode pattern 216A of the first conductive sheet 212A and the second electrode pattern 216B of the second conductive sheet 212B contains additives such as a solvent and a colorant in addition to a silver salt and a binder.

Examples of the silver salt used in the present embodiment include inorganic silver salts such as silver halide and organic silver salts such as silver acetate. In the present embodiment, it is preferable to use silver halide excellent in characteristics as an optical sensor.

The amount of silver (the amount of silver salt) applied to the silver salt emulsion layer is preferably 1 to 30 $g/m^2$, more preferably 1 to 25 $g/m^2$, and further preferably 5 to 20 $g/m^2$, in terms of silver. If the amount of applied silver is set within this range, a desired surface resistance can be obtained in the case of manufacturing the conductive sheet 210 for the touch panel.

Examples of the binder used in the present embodiment include gelatin, polyvinyl alcohol (PVA), polyvinylpyrrolidone (PVP), polysaccharides such as starch, cellulose and derivatives thereof, polyethylene oxide, polyvinylamine, chitosan, polylysine, polyacrylic acid, polyalginic acid, polyhyaluronic acid, and carboxycellulose. These substances each exhibit a neutral, anionic, or cationic property depending on the ionicity of a functional group thereof.

The content of the binder in the silver salt emulsion layer in the present embodiment is not particularly limited, and can be determined as appropriate within a range in which the dispersibility and the adhesiveness can be obtained. The content of the binder in the silver salt emulsion layer is preferably 1/4 or more, and more preferably 1/2 or more, in terms of the volume ratio of silver/binder. The volume ratio of silver/binder is preferably 100/1 or less, more preferably 50/1 or less. Moreover, the volume ratio of silver/binder is further preferably 1/1 to 4/1. The volume ratio of silver/binder is most preferably 1/1 to 3/1. If the volume ratio of silver/binder in the silver salt emulsion layer is set within this range, even in the case where the amount of applied silver is adjusted, fluctuations in resistance value can be suppressed, and the conductive sheet for the touch panel having a uniform surface resistance can be obtained. Note that the volume ratio of silver/binder can be obtained by converting the amount of silver halide/the amount of binder (weight ratio) in the raw material into the amount of silver/ the amount of binder (weight ratio) and further converting the amount of silver/the amount of binder (weight ratio) into the amount of silver/the amount of binder (volume ratio).

<Solvent>

The solvent used to form the silver salt emulsion layer is not particularly limited, and examples thereof include water, organic solvents (for example, alcohols such as methanol, ketones such as acetone, amides such as formamide, sulfoxides such as dimethylsulfoxide, esters such as ethyl acetate, and ethers), ionic liquids, and a mixture solvent of these solvents.

The content of the solvent used to form the silver salt emulsion layer of the present embodiment falls within a range of 30 to 90 mass % of the total mass of the silver salt, the binder, and the like contained in the silver salt emulsion layer, and preferably falls within a range of 50 to 80 mass % thereof.

<Other Additives>

Various additives used in the present embodiment are not particularly limited, and known additives can be preferably used therein.

[Other Layer Configurations]

A protective layer (not illustrated) may be provided on the silver salt emulsion layer. The "protective layer" in the present embodiment means a layer made of a binder such as gelatin and polymers, and is formed on the silver salt emulsion layer having photosensitivity in order to produce effects of preventing scratches and improving mechanical characteristics. The thickness of the protective layer is preferably 0.5 μm or less. A method of applying and a method of forming the protective layer are not particularly limited, and a known applying method and a known forming method can be selected as appropriate. Moreover, for example, a basecoat layer may also be provided under the silver salt emulsion layer.

Next, steps of the method of manufacturing the first conductive sheet 212A and the second conductive sheet 212B are described.

[Exposure to Light]

The present embodiment includes the case where the first electrode pattern 216A and the second electrode pattern 216B are formed by printing. Besides the printing, the first electrode pattern 216A and the second electrode pattern 216B are formed by exposure to light, development, and the like. That is, a photosensitive material having a silver-salt-containing layer or a photosensitive material to which photopolymer for photolithography has been applied, which is provided on each of the first transparent substrate 214A and the second transparent substrate 214B, is exposed to light. The exposure to light can be performed using electromagnetic waves. Examples of the electromagnetic waves include light such as visible light rays and ultraviolet rays and radiant rays such as X-rays. Further, a light source having wavelength distribution may be used for the exposure to light, and a light source having a particular wavelength may be used therefor.

A method using a glass mask and a pattern exposure method using laser drawing are preferable for the exposure method.

[Development Process]

In the present embodiment, after the emulsion layer is exposed to light, the development process is further performed. A technique of a standard development process used for silver halide photographic films, printing paper, printing plate-making films, photomask emulsion masks, and the like can be used for the development process. The developing solution is not particularly limited, and a PQ developing solution, an MQ developing solution, an MAA developing solution, and the like can be used therefor. Examples of the usable developing solutions include: CN-16, CR-56, CP45X, FD-3, and Papitol (produced by Fujifilm Corporation); C-41, E-6, RA-4, D-19, and D-72 (produced by Kodak Company); and developing solutions included in kits thereof, which are commercially available. Moreover, a lith-developing solution can also be used.

The development process in the present embodiment can include a fixing process performed for the purpose of stabilization by removing the silver salt in the unexposed part. A technique of a fixing process used for silver halide photographic films, printing paper, printing plate-making films, photomask emulsion masks, and the like can be used for the fixing process in the present invention.

The fixing temperature in the fixing process is preferably about 20° C. to about 50° C. and further preferably 25° C. to 45° C. Moreover, the fixing time is preferably 5 seconds to 1 minute and further preferably 7 seconds to 50 seconds. The replenisher rate of the fixing solution is preferably 600 ml/m$^2$ or less, further preferably 500 ml/m$^2$ or less, and particularly preferably 300 ml/m$^2$ or less, with respect to the processing amount of the photosensitive material.

It is preferable that the photosensitive material that has been subjected to the development and fixing process be subjected to a water washing process and a stabilization process. The water washing process or the stabilization process is normally performed at a washing water amount of 20 liters or less, and can be performed even at a replenisher rate of 3 liters or less (including 0, that is, stored water washing), per square meter of the photosensitive material.

The mass of metal silver contained in the exposed part after the development process is preferably 50 mass % or more of the mass of silver contained in the exposed part before the exposure to light, and is further preferable 80 mass % or more thereof. If the mass of silver contained in the exposed part is 50 mass % or more of the mass of silver contained in the exposed part before the exposure to light, high conductive properties can be obtained, which is preferable.

The gradation after the development process in the present embodiment is not particularly limited, and preferably exceeds 4.0. If the gradation after the development process exceeds 4.0, the conductive properties of the conductive metal part can be improved while the translucency of the light transmissive part is kept high. Examples of means for making the gradation 4.0 or more include the doping with rhodium ions and iridium ions described above.

The conductive sheet is obtained through the above-mentioned steps, and the surface resistance of the obtained conductive sheet is preferably 100 Ω/sq. or less, preferably falls within a range of 0.1 to 100 Ω/sq., and more preferably falls within a range of 1 to 10 Ω/sq. If the surface resistance is adjusted to such a range, position detection is possible for even a large-size touch panel having an area of 10 cm×10 cm or more. Moreover, the conductive sheet after the development process may be further subjected to a calendering process, and the surface resistance can be adjusted to a desired value by the calendering process.

[Physical Development and Plating Process]

In the present embodiment, physical development and/or a plating process for causing the metal silver part to support conductive metal grains may be performed for the purpose of enhancing the conductive properties of the metal silver part formed by the exposure to light and the development process. In the present invention, the metal silver part may be caused to support conductive metal grains through only any one of the physical development and the plating process, and the metal silver part may be caused to support conductive metal grains through a combination of the physical development and the plating process. Note that the metal silver part that has been physically developed and/or plated is also referred to as "conductive metal part".

[Oxidation Process]

In the present embodiment, it is preferable that the metal silver part after the development process and the conductive metal part formed by the physical development and/or the plating process be subjected to an oxidation process. For example, in the case where a slight amount of metal is deposited in the light transmissive part, the oxidation process can remove the metal, and can make the transmittance of the light transmissive part substantially 100%.

[Electrode Patterns]

The wire width of each of the metal thin wires of the first electrode pattern 216A and the second electrode pattern 216B of the present embodiment can be selected from 30 μm or less. For use in the material of the touch panel, the metal thin wires each have a wire width of 0.5 μm to 30 μm. It is desirable that the wire width of each metal thin wire be 30 μm or less, preferably 15 μm or less, more preferably 10 μm or less, more preferably 9 μm or less, and more preferably 7 μm or less, and be preferably 0.5 μm or more.

The wire interval (grid pitch) is preferably 250 μm to 900 μm, and is further preferably 300 μm or more and 700 μm or less. Moreover, each metal thin wire may have a portion wider than 200 μm, for the purpose of ground connection and other purposes.

In the electrode patterns of the present embodiment, the opening ratio is preferably 85% or more, further preferably 90% or more, and most preferably 95% or more, in terms of the visible light transmittance. The opening ratio is the percentage of a translucent portion of each of the first electrode pattern 216A and the second electrode pattern 216B excluding the metal thin wires. For example, the opening ratio is 90% in the case of the square grids 224A and 224B having a wire width of 15 μm and a pitch of 300 μm.

[Light Transmissive Part]

The "light transmissive part" in the present embodiment means a translucent portion other than the first electrode pattern 216A and the second electrode pattern 216B, of each of the first conductive sheet 212A and the second conductive sheet 212B. As described above, the transmittance of the light transmissive part is 90% or more, preferably 95% or more, further preferably 97% or more, further more preferably 98% or more, and most preferably 99% or more, in terms of the transmittance indicated by the minimum value of the transmittance in a wavelength region of 380 to 780 nm excluding contributions to light absorption and reflection of the first transparent substrate 214A and the second transparent substrate 214B.

[First Conductive Sheet 212A and Second Conductive Sheet 212B]

The thickness of each of the first transparent substrate 214A and the second transparent substrate 214B in the first conductive sheet 212A and the second conductive sheet 212B according to the present embodiment is preferably 5 to 350 μm and further preferably 30 to 150 μm. If the thickness thereof is set within such a range of 5 to 350 μm, a desired transmittance of visible light can be obtained, and handling is easy.

The thickness of the metal silver part provided on each of the first transparent substrate 214A and the second transparent substrate 214B can be determined as appropriate in accordance with the application thickness of coating for the silver-salt-containing layer applied onto each of the first transparent substrate 214A and the second transparent substrate 214B. The thickness of the metal silver part can be selected from 0.001 mm to 0.2 mm, and is preferably 30 μm or less, more preferably 20 μm or less, further preferably 0.01 to 9 μm, and most preferably 0.05 to 5 μm. Moreover, it is preferable that the metal silver part be patterned. The metal silver part may have a single-layered structure, and may have a multi-layered structure of two or more layers. In the case where the metal silver part is patterned and has a multi-layered structure of two or more layers, the metal silver part can be provided with different color sensitivities so as to be reactive to different wavelengths. As a result, if the metal silver part is exposed to light with different wavelengths, different patterns can be formed in the respective layers.

For use in a touch panel, a smaller thickness of the conductive metal part is more preferable, because the viewing angle of a display panel is wider. Also in terms of enhancement in visibility, a reduction in thickness of the conductive metal part is required. From such perspectives, the thickness of the layer made of the conductive metal supported by the conductive metal part is preferably less than 9 μm, more preferably 0.1 μm or more and less than 5 μm, and further preferably 0.1 μm or more and less than 3 μm.

In the present embodiment, the metal silver part having a desired thickness can be formed by controlling the application thickness of the silver-salt-containing layer, and the thickness of the layer made of the conductive metal grains can be freely controlled by the physical development and/or the plating process. Hence, even the first conductive sheet 212A and the second conductive sheet 212B each having a thickness that is less than 5 μm and preferably less than 3 μm can be easily formed.

Note that the method of manufacturing the first conductive sheet 212A and the second conductive sheet 212B according to the present embodiment does not necessarily need to include the plating step and the like. This is because the method of manufacturing the first conductive sheet 212A and the second conductive sheet 212B according to the present embodiment can obtain a desired surface resistance by adjusting the amount of applied silver and the volume ratio of silver/binder of the silver salt emulsion layer. Note that a calendering process and the like may be performed as needed.

(Hardening Process after Development Process)

It is preferable to perform a hardening process on the silver salt emulsion layer by immersing the same in a hardener after performing the development process thereon. Examples of the hardener include: dialdehydes such as glutaraldehyde, adipaldehyde, and 2,3-dihydroxy-1,4-dioxane; and inorganic compounds such as boric acid and chrome alum/potassium alum, which are described in Japanese Patent Application Laid-Open No. 2-141279.

Note that the present invention can be used in appropriate combination with techniques disclosed in the following Japanese Patent Application Laid-Opens and pamphlets of International Publications in Table 1 and Table 2. Expressions such as "Japanese Patent Application Laid-Open No." and "Pamphlet of International Publication No. WO" are omitted.

TABLE 1

| | | | | |
|---|---|---|---|---|
| 2004-221564 | 2004-221565 | 2007-200922 | 2006-352073 | 2007-129205 |
| 2007-235115 | 2007-207987 | 2006-012935 | 2006-010795 | 2006-228469 |

TABLE 1-continued

| | | | | |
|---|---|---|---|---|
| 2006-332459 | 2009-21153 | 2007-226215 | 2006-261315 | 2007-072171 |
| 2007-102200 | 2006-228473 | 2006-269795 | 206-269795 | 2006-324203 |
| 2006-228478 | 2006-228836 | 2007-009326 | 2006-336090 | 2006-336099 |
| 2006-348351 | 2007-270321 | 2007-270322 | 2007-201378 | 2007-335729 |
| 2007-134439 | 2007-149760 | 2007-208133 | 2007-178915 | 2007-334325 |
| 2007-310091 | 2007-116137 | 2007-088219 | 2007-207883 | 2007-013130 |
| 2005-302508 | 2008-218784 | 2008-227350 | 2008-227351 | 2008-244067 |
| 2008-267814 | 2008-270405 | 2008-277675 | 2008-277676 | 2008-282840 |
| 2008-283029 | 2008-288305 | 2008-288419 | 2008-300720 | 2008-300721 |
| 2009-4213 | 2009-10001 | 2009-16526 | 2009-21334 | 2009-26933 |
| 2008-147507 | 2008-159770 | 2008-159771 | 2008-171568 | 2008-198388 |
| 2008-218096 | 2008-218264 | 2008-224916 | 2008-235224 | 2008-235467 |
| 2008-241987 | 2008-251274 | 2008-251275 | 2008-252046 | 2008-277428 |

TABLE 2

| | | | | |
|---|---|---|---|---|
| 2006/001461 | 2006/088059 | 2006/098333 | 2006/098336 | 2006/098338 |
| 2006/098335 | 2006/098334 | 2007/001008 | | |

EXAMPLES

Hereinafter, the present invention is further specifically described by way of examples of the present invention. Note that materials, usage amounts, percentages, processing contents, processing procedures, and the like described in the following examples can be changed as appropriate within a range not departing from the gist of the present invention. Accordingly, the scope of the present invention should not be limitatively interpreted by way of the following specific examples.

<Level 1>

(Silver Halide Photosensitive Material)

Prepared was an emulsion containing 10.0 g of gelatin for 150 g of Ag in an aqueous medium and containing silver iodobromochloride grains (I=0.2 mol %, Br=40 mol %) having a sphere-equivalent diameter of 0.1 μm on average.

Moreover, $K_3Rh_2Br_9$ and $K_2IrCl_6$ were added to the emulsion at a concentration of $1 \times 10^{-7}$ (mole/mole silver), and the silver bromide grains were doped with Rh ions and Ir ions. $Na_2PdCl_4$ was added to the emulsion, and was further subjected to gold-sulfur sensitization using chlorauric acid and sodium thiosulfate. Then, together with a gelatin hardener, the emulsion was applied onto the substrate 30 (here, polyethylene terephthalate (PET)) at a silver application amount of 10 g/m². At that time, the volume ratio of Ag/gelatin was set to 2/1.

Such application was performed on a PET support having a width of 30 cm, at a width of 25 cm and a length of 20 m. Both the ends of the PET support were cut off by 3 cm for each end such that a central part (24 cm) of the application was left, whereby a silver halide photosensitive material in a rolled state was obtained.

(Exposure to Light)

An exposure pattern for the first electrode pattern 10 was formed such that the first electrode pattern 10 had the comb-shaped structure illustrated in FIG. 6, by forming the first conductive patterns 12 and the sub-nonconduction patterns 18. An exposure pattern for the second electrode pattern 40 was formed such that the second electrode pattern 40 had the strip-shaped structure illustrated in FIG. 23. The exposure to light was performed through photomasks having such patterns as described above, using parallel light emitted from a light source that was a high-pressure mercury lamp.

(Development Process)
Developing Solution 1 L Prescription

| | |
|---|---|
| hydroquinone | 20 g |
| sodium sulfite | 50 g |
| potassium carbonate | 40 g |
| ethylenediaminetetraacetate | 2 g |
| potassium bromide | 3 g |
| polyethylene glycol 2000 | 1 g |
| potassium hydroxide | 4 g |
| pH | adjusted to 10.3 |

Fixing Solution 1 L Prescription

| | |
|---|---|
| ammonium thiosulfate solution (75%) | 300 ml |
| ammonium sulfite monohydrate | 25 g |
| 1,3-diaminopropanetetraacetate | 8 g |
| acetate | 5 g |
| ammonia water (27%) | 1 g |
| pH | adjusted to 6.2 |

With the use of the above-mentioned processing solutions, the exposed photosensitive material was processed by an automatic developing machine FG-710PTS produced by Fujifilm Corporation, under processing conditions: 35° C. and 30 seconds for development; 34° C. and 23 seconds for fixing; and flowing water (5 L/min) and 20 seconds for water washing.

B (area of sub-nonconduction pattern)/[A (area of first conductive pattern)+B (area of sub-nonconduction pattern)] was set to 5%. The width of each metal thin wire was set to 5 μm, and the length of one side of each of the grids 26 and 46 was set to 250 μm.

(Levels 2 to 9)

According to the same method as that in Level 1, a plurality of conductive sheets 1 having different values of B/(A+B) were made. Table 3 shows the values of each level.

(Levels 10 to 20)

According to the same method as that in Level 1, a plurality of conductive sheets 1 having different values of B/(A+B) were made, the conductive sheets 1 each including: the first electrode pattern 10 including the first conductive patterns 12 each having the X-shaped structures; and the second electrode pattern 40 including the second conductive patterns 42 each having the strip-shaped structure. Table 3 shows the values of each level.

TABLE 3

| Level No. | First Conductive Pattern Shape | B/(A + B) | Total Width (Wa) of First Conductive Pattern Lines | Total Width (Wb) of Sub-nonconduction Patterns | Sensitivity of Finger |
|---|---|---|---|---|---|
| 1 | Comb-Shaped Structure | 5% | 4.75 | 0.25 | D |
| 2 | Comb-Shaped Structure | 10% | 4.50 | 0.50 | C |
| 3 | Comb-Shaped Structure | 20% | 4.00 | 1.00 | C |
| 4 | Comb-Shaped Structure | 40% | 3.00 | 2.00 | B |
| 5 | Comb-Shaped Structure | 50% | 2.50 | 2.50 | A |
| 6 | Comb-Shaped Structure | 60% | 2.00 | 3.00 | A |
| 7 | Comb-Shaped Structure | 80% | 1.00 | 4.00 | C |
| 8 | Comb-Shaped Structure | 97% | 0.15 | 4.85 | D |
| 9 | Comb-Shaped Structure | 0% | 5.00 | 0.00 | D |
| 10 | X-Shaped Structures | 5% | — | — | D |
| 11 | X-Shaped Structures | 10% | — | — | C |
| 12 | X-Shaped Structures | 20% | — | — | B |
| 13 | X-Shaped Structures | 30% | — | — | A |
| 14 | X-Shaped Structures | 45% | — | — | A |
| 15 | X-Shaped Structures | 50% | — | — | A |
| 16 | X-Shaped Structures | 65% | — | — | C |
| 17 | X-Shaped Structures | 70% | — | — | C |
| 18 | X-Shaped Structures | 80% | — | — | C |
| 19 | X-Shaped Structures | 97% | — | — | D |
| 20 | X-Shaped Structures | 0% | — | — | D |

(Evaluations)

For Levels 1 to 20, when a finger was brought into contact, it was determined whether or not the touch with finger could be sensed. A was given to the case where the touch with finger could be sufficiently sensed. B was given to the case where the contact thereof could be sensed with almost no problem. C was given to the case where the contact thereof could not be stably sensed. D was given to the case where the contact thereof could hardly be sensed.

With regard to the first conductive patterns each having the comb-shaped structure and the first conductive patterns each having the X-shaped structures, favorable results were obtained in a range of 5%<B/(A+B)<97%, and further preferable results were obtained in a range of 10%≤B/(A+B)≤80/%.

As shown in Table 4, with regard to the first conductive patterns each having the comb-shaped structure in Levels 21 to 25, most preferable results were obtained in a range of 40%≤B/(A+B)≤60%. With regard to the first conductive patterns each having the X-shaped structures, further favorable results were obtained in a range of 30%≤B2/(A2+B2)≤50%, and most preferable results were obtained in a range of 20%≤B2/(A2+B2)≤50%.

TABLE 4

| Level No. | First Conductive Pattern Shape | B/(A + B) | Total Width (Wa) of First Conductive Pattern Lines | Total Width (Wb) of Sub-nonconduction Patterns | Sensitivity of Finger |
|---|---|---|---|---|---|
| 21 | Comb-Shaped Structure | 50% | 1.00 | 1.00 | A |
| 22 | Comb-Shaped Structure | 50% | 5.00 | 5.00 | A |
| 23 | Comb-Shaped Structure | 60% | 1.00 | 1.50 | A |
| 24 | Comb-Shaped Structure | 60% | 2.50 | 3.75 | A |
| 25 | Comb-Shaped Structure | 60% | 3.33 | 5.00 | A |

(Evaluations)

With regard to the first conductive patterns each having the comb-shaped structure in Levels 21 to 25, most preferable results were obtained in the case of a combination of (1) 1.0 mm≤Wa≤5.0 mm and (2) 1.5 mm≤Wb≤5.0 mm, in a range of 50%≤B/(A+B)≤60%.

Next, for laminated conductive sheets according to Levels 26 to 33, the surface resistance and the transmittance were measured, and moire patterns and the visibility were evaluated. The details of Levels 26 to 33, the measurement results, and the evaluation results are shown in Table 5.

<Levels 26 to 33>

(Silver Halide Photosensitive Material)

Prepared was an emulsion containing 10.0 g of gelatin for 150 g of Ag in an aqueous medium and containing silver iodobromochloride grains (I=0.2 mol %, Br=40 mol %) having a sphere-equivalent diameter of 0.1 μm on average.

Moreover, $K_3Rh_2Br_9$ and $K_2IrCl_6$ were added to the emulsion at a concentration of $1 \times 10^{-7}$ (mole/mole silver), and the silver bromide grains were doped with Rh ions and Ir ions. $Na_2PdCl_4$ was added to the emulsion, and was further subjected to gold-sulfur sensitization using chlorauric acid and sodium thiosulfate. Then, together with a gelatin hardener, the emulsion was applied onto each of the first transparent substrate 214A and the second transparent substrate 214B (here, polyethylene terephthalate (PET)) at a silver application amount of 10 g/m². At that time, the volume ratio of Ag/gelatin was set to 2/1.

Such application was performed on a PET support having a width of 30 cm, at a width of 25 cm and a length of 20 m. Both the ends of the PET support were cut off by 3 cm for each end such that a central part (24 cm) of the application was left, whereby a silver halide photosensitive material in a rolled state was obtained.

(Exposure to Light)

An exposure pattern for the first conductive sheet 212A was a pattern illustrated in FIG. 34 and FIG. 36, and was formed on the first transparent substrate 214A having an A4-size (210 mm×297 mm). An exposure pattern for the second conductive sheet 212B was a pattern illustrated in FIG. 34 and FIG. 37, and was formed on the second transparent substrate 214B having an A4-size (210 mm×297 mm). The exposure to light was performed through photomasks having such patterns as described above, using parallel light emitted from a light source that was a high-pressure mercury lamp.

(Development Process)

Developing Solution 1 L Prescription

| hydroquinone | 20 g |
| sodium sulfite | 50 g |
| potassium carbonate | 40 g |
| ethylenediaminetetraacetate | 2 g |
| potassium bromide | 3 g |
| polyethylene glycol 2000 | 1 g |
| potassium hydroxide | 4 g |
| pH | adjusted to 10.3 |

Fixing Solution 1 L Prescription

| ammonium thiosulfate solution (75%) | 300 ml |
| ammonium sulfite monohydrate | 25 g |
| 1,3-diaminopropanetetraacetate | 8 g |

-continued

| acetate | 5 g |
| ammonia water (27%) | 1 g |
| pH | adjusted to 6.2 |

With the use of the above-mentioned processing solutions, the exposed photosensitive material was processed by the automatic developing machine FG-710PTS produced by Fujifilm Corporation, under processing conditions: 35° C. and 30 seconds for development; 34° C. and 23 seconds for fixing; and flowing water (5 L/min) and 20 seconds for water washing.

(Level 26)

The wire width of each of conductive parts (the first electrode pattern 216A and the second electrode pattern 216B) of the made first conductive sheet 212A and the made second conductive sheet 212B was set to 1 μm, and the length of one side of each of the grids 224A and 224B was set to 50 μm.

(Level 27)

The first conductive sheet 212A and the second conductive sheet 212B according to Level 27 were made in a manner similar to that in Level 21, except that the wire width of each conductive part was set to 3 μm and that the length of one side of each of the grids 224A and 224B was set to 100 μm.

(Level 28)

The first conductive sheet 212A and the second conductive sheet 212B according to Level 28 were made in a manner similar to that in Level 21, except that the wire width of each conductive part was set to 4 μm and that the length of one side of each of the grids 224A and 224B was set to 150 μm.

(Level 29)

The first conductive sheet 212A and the second conductive sheet 212B according to Level 29 were made in a manner similar to that in Level 21, except that the wire width of each conductive part was set to 5 μm and that the length of one side of each of the grids 224A and 224B was set to 210 μm.

(Level 30)

The first conductive sheet 212A and the second conductive sheet 212B according to Level 30 were made in a manner similar to that in Level 21, except that the wire width of each conductive part was set to 8 μm and that the length of one side of each of the grids 224A and 224B was set to 250 μm.

(Level 31)

The first conductive sheet 212A and the second conductive sheet 212B according to Level 31 were made in a manner similar to that in Level 21, except that the wire width of each conductive part was set to 9 μm and that the length of one side of each of the grids 224A and 224B was set to 300 μm.

(Level 32)

The first conductive sheet 212A and the second conductive sheet 212B according to Level 32 were made in a manner similar to that in Level 21, except that the wire width of each conductive part was set to 10 μm and that the length of one side of each of the grids 224A and 224B was set to 300 μm.

(Level 33)

The first conductive sheet 212A and the second conductive sheet 212B according to Level 33 were made in a manner similar to that in Level 21, except that the wire width of each conductive part was set to 15 µm and that the length of one side of each of the grids 224A and 224B was set to 400 µm.

(Surface Resistance Measurement)

In order to check whether or not the detection accuracy was sufficient, the surface resistance of each of the first conductive sheet 212A and the second conductive sheet 212B was obtained as the average value of values that were measured at arbitrary ten points using a four-point probe array (ASP), Loresta GP (Model No. MCP-T610) produced by Dia Instruments Co., Ltd.

(Transmittance Measurement)

In order to check whether or not the transparency was sufficient, the transmittance of each of the first conductive sheet 212A and the second conductive sheet 212B was measured using a spectrophotometer.

(Moire Pattern Evaluation)

In each of Levels 26 to 33, a laminated conductive sheet was made by laminating the first conductive sheet 212A on the second conductive sheet 212B. After that, a touch panel was manufactured by attaching the laminated conductive sheet to a display screen of a liquid crystal display device. After that, the touch panel was set on a spinning disk, and the liquid crystal display device was driven to display a white color. In that state, the spinning disk was spun at a bias angle between −45° and +45°, and moire patterns were visually observed and evaluated.

The moire patterns were evaluated at an observation distance of 1.5 m from the display screen of the liquid crystal display device. A was given to the case where the moire patterns were not obviously found. B was given to the case where the moire patterns were slightly found in a non-problematic level. C was given to the case where the moire patterns were obviously found.

(Visibility Evaluation)

Prior to the moire pattern evaluation described above, when the touch panel was set on the spinning disk and when the liquid crystal display device was driven to display a white color, it was checked with naked eyes whether or not there were thicker lines and black spots and whether or not the break parts of the first conductive sheet 212A and the second conductive sheet 212B stood out.

TABLE 5

| Level No. | Wire Width (µm) of Conductive Pattern | Length (µm) of One Side of Grid | Surface Resistance (Ω/sq.) | Transmittance (%) | Moire Pattern Evaluation | Visibility Evaluation |
| --- | --- | --- | --- | --- | --- | --- |
| 26 | 1 | 50 | 55 | 85 | A | A |
| 27 | 3 | 100 | 55 | 86 | A | A |
| 28 | 4 | 150 | 50 | 87 | A | A |
| 29 | 5 | 210 | 40 | 88 | A | A |
| 30 | 8 | 250 | 50 | 87 | A | A |
| 31 | 9 | 300 | 45 | 86 | A | A |
| 32 | 10 | 300 | 40 | 86 | A | A |
| 33 | 15 | 400 | 38 | 85 | B | B |

In this regard, for Levels 26 to 32 of Levels 26 to 33, all of the conductive properties, the transmittance, the moire patterns, and the visibility were favorable. Although Level 33 was inferior to Levels 26 to 32 in the moire pattern evaluation and the visibility evaluation, the moire patterns slightly found in Level 33 were in a non-problematic level, and did not hinder observation of an image displayed on the display device.

Moreover, a projected capacitive touch panel was made using the laminated conductive sheet according to each of Levels 26 to 33. When the projected capacitive touch panel was operated by touching with a finger, it was found out that the response speed was high and that the detection sensitivity was excellent. Moreover, when the projected capacitive touch panel was operated by touching two or more points, it was confirmed that favorable results could be similarly obtained and that multi-touch input could be dealt with.

The conductive sheet for the touch panel and the touch panel according to the present invention are not limited to the above-mentioned embodiments, and can have various configurations without departing from the gist of the present invention, as a matter of course.

What is claimed is:

1. A conductive sheet for a touch panel, the conductive sheet comprising:
   a first electrode pattern including a plurality of first conductive patterns and a first nonconductive pattern, the first conductive patterns being formed by a plurality of grids made of a first set of metal thin wires, the first conductive patterns extending in a first direction and being parallel to each other, the first nonconductive pattern having a first space electrically separating the first conductive patterns from each other, the first space not including any dummy patterns formed of metal thin wires; and
   a second electrode pattern including a plurality of second conductive patterns and a second nonconductive pattern, the second conductive patterns being formed by a plurality of grids made of a second set of metal thin wires, the second conductive patterns extending in a second direction orthogonal to the first direction and being parallel to each other, the second nonconductive pattern having a second space electrically separating the second conductive patterns from each other, the second space not including any dummy patterns formed of metal thin wires,
   wherein the first electrode pattern and the second electrode pattern form a combination pattern in which the grids of the first conductive patterns and the grids of the second conductive patterns form small grids in top view, and the first space and the second space do not include any dummy patterns formed of metal thin wires in top view.

2. The conductive sheet according to claim 1, wherein a wire width of each of the first set of metal thin wires and the second set of metal thin wires is not smaller than 1 µm and not larger than 7 µm.

3. The conductive sheet according to claim 1, wherein intersection parts of the grids of the first conductive patterns are respectively placed in centers of opening regions of the grids of the second conductive patterns.

4. The conductive sheet according to claim 1, wherein each of the grids of the first conductive patterns and the grids of the second conductive patterns has a same shape.

5. The conductive sheet according to claim 1, wherein each of the first set of metal thin wires and the second set of metal thin wires has a same wire width and is made of a same material.

6. The conductive sheet according to claim 1, further comprising a substrate having a first main surface and a second main surface,
wherein the first electrode pattern is placed on the first main surface, and the second electrode pattern is placed on the second main surface.

7. A touch panel comprising the conductive sheet according to claim 1.

8. The conductive sheet according to claim 1, further comprising a substrate having a first main surface and a second main surface, the substrate being made of polyethylene terephthalate and having a thickness of 30 to 150 µm,
wherein the first electrode pattern is placed on the first main surface of the substrate, and the second electrode pattern is placed on the second main surface of the substrate.

9. The conductive sheet according to claim 1, wherein each of the grids of the first conductive patterns and the grids of the second conductive patterns has a same shape, of which a length of one side is not smaller than 300 µm and an opening ratio is not smaller than 95%.

10. The conductive sheet according to claim 1, further comprising a substrate having a first main surface and a second main surface, the substrate being made of polyethylene terephthalate and having a thickness of 30 to 150 µm,
wherein the first electrode pattern is placed on the first main surface of the substrate, and the second electrode pattern is placed on the second main surface of the substrate,
wherein each of the grids of the first conductive patterns and the grids of the second conductive patterns has a same shape, of which a length of one side is not smaller than 300 µm and an opening ratio is not smaller than 95%.

* * * * *